(12) United States Patent
Kageyama et al.

(10) Patent No.: US 10,026,695 B2
(45) Date of Patent: Jul. 17, 2018

(54) SEMICONDUCTOR DEVICE AND METHOD FOR MANUFACTURING THE SAME

(71) Applicant: ROHM CO., LTD., Kyoto (JP)

(72) Inventors: Satoshi Kageyama, Kyoto (JP); Bungo Tanaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/153,727

(22) Filed: May 12, 2016

(65) Prior Publication Data
US 2016/0336277 A1   Nov. 17, 2016

(30) Foreign Application Priority Data

May 13, 2015   (JP) .................................. 2015-098318
May 26, 2015   (JP) .................................. 2015-106699

(51) Int. Cl.
| H01L 23/495 | (2006.01) |
| H01L 23/00 | (2006.01) |
| H01L 23/522 | (2006.01) |
| H01L 23/528 | (2006.01) |
| H01L 23/532 | (2006.01) |
| H01L 23/31 | (2006.01) |

(52) U.S. Cl.
CPC ........ H01L 23/562 (2013.01); H01L 23/4952 (2013.01); H01L 23/5226 (2013.01); H01L 23/5283 (2013.01); H01L 23/53209 (2013.01); H01L 24/03 (2013.01); H01L 24/05 (2013.01); H01L 23/3107 (2013.01); H01L 23/49513 (2013.01); H01L 23/49541 (2013.01); H01L 23/49548 (2013.01); H01L 23/49586 (2013.01); H01L 2224/04042 (2013.01); H01L 2224/05092 (2013.01); H01L 2224/05556 (2013.01); H01L 2224/05568 (2013.01); H01L 2224/16225 (2013.01); H01L 2224/32225 (2013.01); H01L 2224/32245 (2013.01); H01L 2224/45144 (2013.01); H01L 2224/48091 (2013.01); H01L 2224/48247 (2013.01); H01L 2224/48465 (2013.01); H01L 2224/49171 (2013.01); H01L 2224/73204 (2013.01); H01L 2224/73265 (2013.01); H01L 2924/181 (2013.01)

(58) Field of Classification Search
CPC ....... H01L 23/5226; H01L 2924/00014; H01L 23/528; H01L 24/05; H01L 21/76877
USPC .......................................................... 257/668
See application file for complete search history.

(56) References Cited

U.S. PATENT DOCUMENTS

| 7,091,123 B2* | 8/2006 | Tonegawa ......... H01L 21/31053 257/E21.244 |
| 2005/0001314 A1* | 1/2005 | Tanaka .............. H01L 23/53238 257/738 |

(Continued)

FOREIGN PATENT DOCUMENTS

JP   2011-124296 A   6/2011

*Primary Examiner* — Andy Huynh
(74) *Attorney, Agent, or Firm* — Rabin & Berdo, P.C.

(57) ABSTRACT

A semiconductor device includes a semiconductor substrate, an insulating film formed above the semiconductor substrate, a wiring having copper as a main component and formed above the insulating film, and a barrier metal film having a higher modulus of rigidity than copper and interposed between the insulating film and the wiring. The barrier metal film may have a lower thermal expansion coefficient than copper.

38 Claims, 38 Drawing Sheets

(56) References Cited

U.S. PATENT DOCUMENTS

2007/0238222 A1* 10/2007 Harries ............... H01L 24/03
                                                            438/118
2010/0164105 A1     7/2010 Onai et al.

* cited by examiner

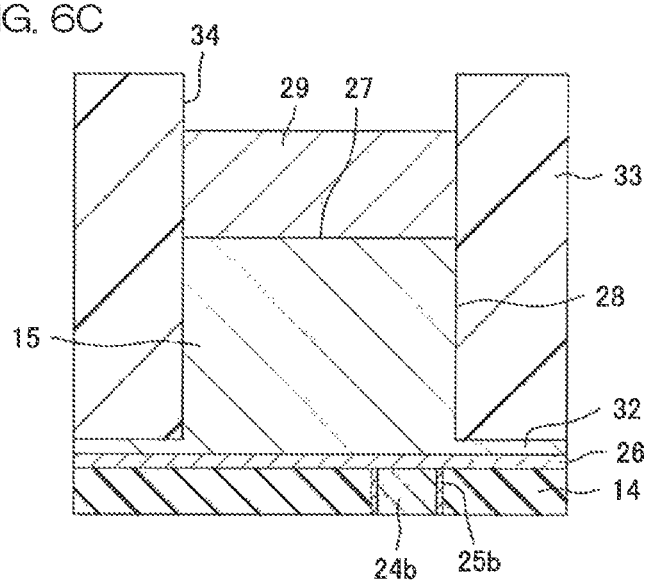
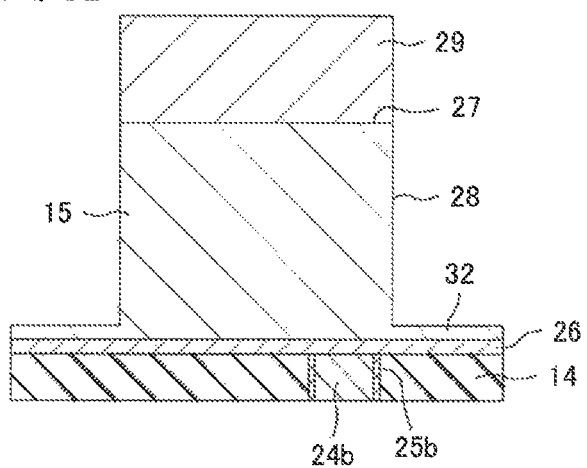

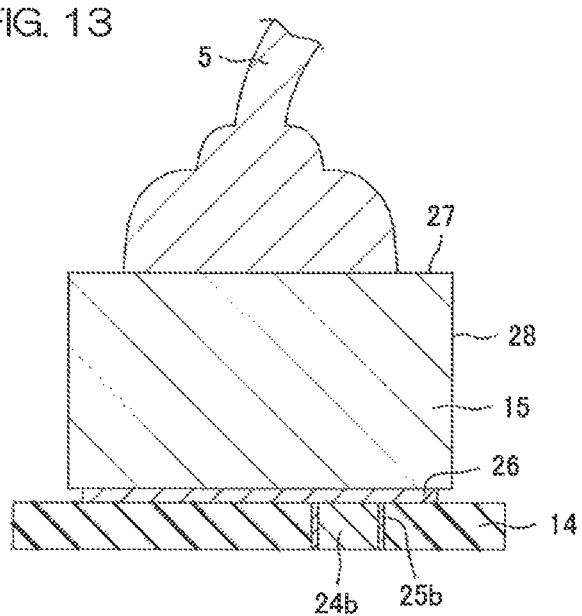

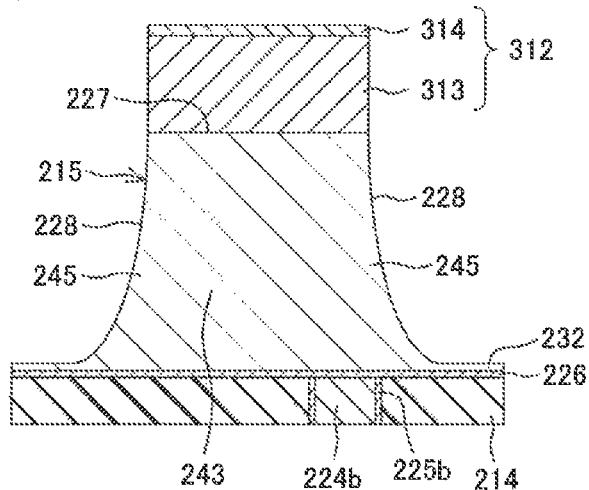
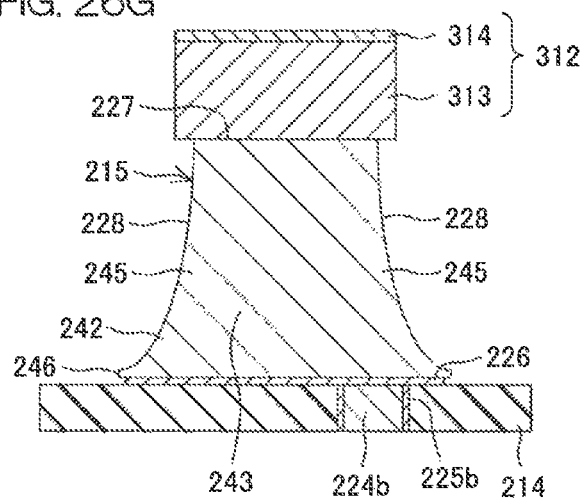

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same.

2. Description of the Related Art

US2010/0164105 A1 discloses a semiconductor device including a semiconductor substrate, an insulating film formed above the semiconductor substrate, and a copper wiring formed on the insulating film.

SUMMARY OF THE INVENTION

A preferred embodiment of the present invention provides a semiconductor device including a semiconductor substrate, an insulating film formed above the semiconductor substrate, a wiring having copper as a main component and formed above the insulating film, and a barrier metal film having a higher modulus of rigidity than copper and interposed between the insulating film and the wiring.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 6A to 6F are diagrams for describing a manufacturing process of the wiring of FIG. 4.

FIG. 13 is a sectional view of a modification example of a wiring.

FIGS. 26A to 26G are diagrams for describing a manufacturing process of the wiring of FIG. 25.

DETAILED DESCRIPTION OF THE PREFERRED EMBODIMENTS

Figure 1:
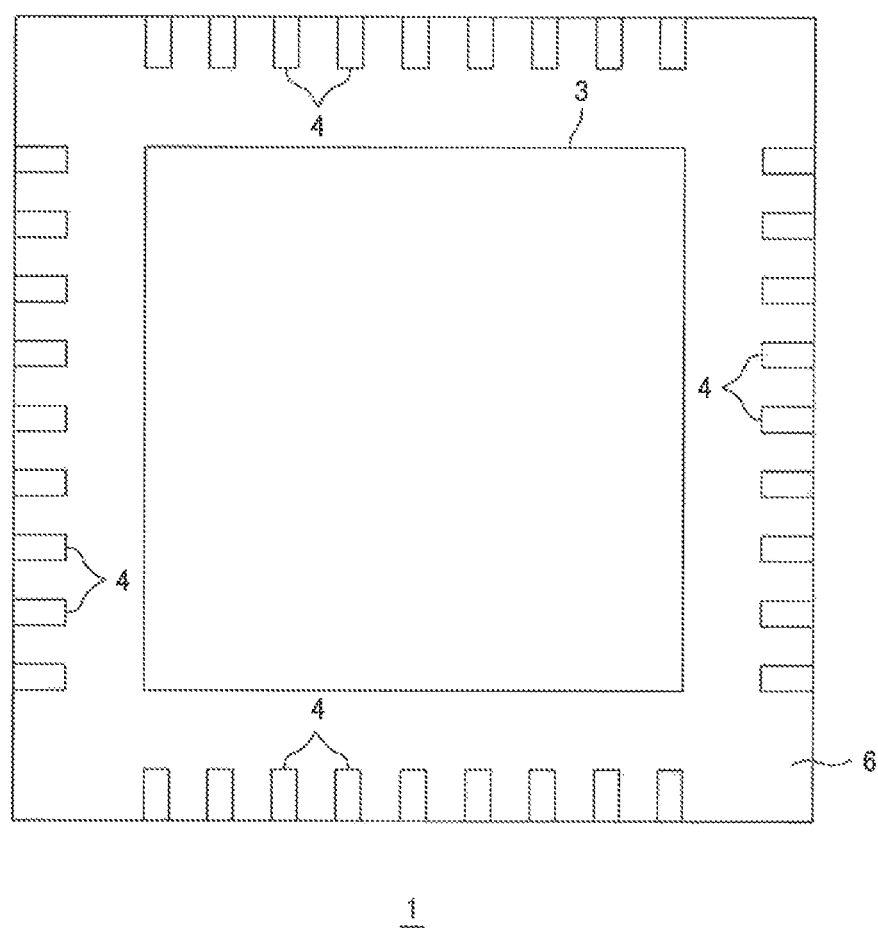
FIG. 1 is a bottom view of a semiconductor device according to a first preferred embodiment of the present invention.

A preferred embodiment of the present invention provides a semiconductor device with which crack formation in an insulating film below a wiring can be suppressed while suppressing increase of wiring resistance.

In some cases where a copper wiring is disposed above an insulating film, a barrier metal film is interposed therebetween. When heat is applied to a semiconductor device in the middle of a manufacturing process or after manufacture, thermal expansions of the wiring, the barrier metal film, and the insulating film occur. The wiring and the barrier metal film ordinarily have higher thermal expansion coefficients than the insulating film and cause stress to be generated in a direction along a surface of the insulating film by the thermal expansions. The barrier metal film transmits, to the insulating film, stress from the wiring in addition to stress due to its own thermal expansion. If the barrier metal film has a lower modulus of rigidity than the wiring, the barrier metal film deforms upon receiving the stress from the wiring and transmits the stress of the wiring to the insulating film positioned below. Due to this stress, concentration of stress occurs at a peripheral edge of the wiring and may cause crack (fissure) formation in the insulating film positioned therebelow. Although such crack formation may be avoided by thinning of the wiring, in this case, there is a trade-off that the wiring increases in resistance value.

A preferred embodiment according to a first aspect of the present invention provides a semiconductor device including a semiconductor substrate, an insulating film formed above the semiconductor substrate, a wiring having copper as a main component and formed above the insulating film, and a barrier metal film having a higher modulus of rigidity than copper and interposed between the insulating film and the wiring.

With the present structure, the barrier metal film, having the modulus of rigidity higher than copper, is interposed between the insulating film and the wiring having copper as the main component. Therefore, even if the wiring causes stress to be generated in a direction along a surface of the insulating film due to thermal expansion, the barrier metal film hardly deforms due to the stress. Transmission of the stress from the wiring to the insulating film can thereby be suppressed by the barrier metal film. Consequently, crack formation in the insulating film can be suppressed. Also, while crack formation can be suppressed by the barrier metal film, the wiring can be thickened to suppress increase of resistance value of the wiring or make the wiring low in resistance.

Preferably in the semiconductor device, the barrier metal film has a lower thermal expansion coefficient than copper. With this feature, an amount of deformation of the barrier metal film due to its thermal expansion can be made less than an amount of deformation of the wiring due to its thermal expansion. The stress applied from the barrier metal film to the insulating film is thereby made low and crack formation in the insulating film can thus be suppressed effectively.

In the semiconductor device, the barrier metal film may have a modulus of rigidity of not less than 50 Gpa and not more than 180 Gpa. In the semiconductor device, the barrier metal film may have a thermal expansion coefficient of less than 8.6 μm/m·K. In the semiconductor device, the barrier metal film may contain one or a plurality of metal species selected from the group consisting of tantalum, tungsten, molybdenum, chromium, and ruthenium.

In the semiconductor device, the barrier metal film may have a modulus of rigidity of not less than 100 Gpa and not more than 180 Gpa and have a thermal expansion coefficient of less than 5 μm/m·K. In the semiconductor device, the barrier metal film may contain one or a plurality of metal species selected from the group consisting of tungsten, molybdenum, and chromium. In the semiconductor device, the insulating film may include a nitride film or an oxide film. In the semiconductor device, the insulating film may include a nitride film, and the barrier metal film may have a laminated structure of a titanium film formed above the insulating film and a tungsten film formed above the titanium film. In the semiconductor device, the barrier metal film may have a smaller thickness than the wiring.

The semiconductor device may further include a multilayer wiring structure formed above the semiconductor substrate and having a plurality of wiring layers laminated via an interlayer insulating film. In this case, the insulating film may be formed above the multilayer wiring structure so as to cover the multilayer wiring structure and the wiring may be formed above the insulating film as an uppermost layer wiring.

Crack formation in the insulating film caused by thermal expansion of the wiring occurs especially readily if a side surface of the uppermost layer wiring is not supported by a protective film, etc. In such a case, by interposing the barrier metal film, having the high modulus of rigidity, between the wiring and the insulating film, crack formation can be avoided while suppressing the increase of the wiring resistance value.

The semiconductor device may further include a bonding wire electrically connected to the wiring. For example, in connecting the bonding wire to the wiring, the semiconductor substrate, etc., may be heated to a temperature of not less than 200° C. (for example, approximately 260° C.). The applied heat causes thermal expansion of the wiring upon being transmitted thereto directly or via the semiconductor substrate, etc. In this process, the barrier metal film relaxes the stress from the wiring and cracking of the insulating film can thus be suppressed.

The semiconductor device may further include an above-wiring insulating film, formed above the insulating film so as to cover the wiring, and a rewiring formed above the above-wiring insulating film so as to be electrically connected to the wiring. The structure may further include a bonding wire electrically connected to the rewiring. For example, in connecting the bonding wire to the rewiring, the semiconductor substrate, etc., may be heated to a temperature of not less than 200° C. (for example, approximately 260° C.). The applied heat is transmitted to the wiring via the semiconductor substrate and the rewiring, etc. In this process, the barrier metal film relaxes the stress from the wiring and cracking of the insulating film can thus be suppressed.

The semiconductor device may further include a connection electrode, electrically connected to the wiring, and a wiring substrate having a bonding surface to which the semiconductor substrate is flip-chip bonded via the connection electrode. For example, in connecting the connection electrode to the wiring substrate, the semiconductor substrate may be heated to a temperature of not less than 200° C. (for example, approximately 260° C.). The applied heat is transmitted to the wiring via the semiconductor substrate and the connection electrode, etc. In this process, the barrier metal film relaxes the stress from the wiring and cracking of the insulating film can thus be suppressed.

The semiconductor device may further include a land disposed at a surface at a side of the wiring substrate opposite the bonding surface and electrically connected via a via electrode to the wiring. For example, the semiconductor device is mounted on a mounting substrate via a solder in contact with the land. In the mounting process, the semiconductor device is heated to melt the solder. Although the wiring is also heated thereby, the barrier metal film relaxes the stress from the wiring and cracking of the insulating film can thus be suppressed.

The semiconductor device may further include a connection electrode, electrically connected to the wiring, and a sealing resin covering a front surface, a rear surface, and a side surface of the semiconductor substrate so as to expose the connection electrode. For example, the connection electrode may be formed as an external terminal arranged to achieve electrical connection with the exterior. In this case, the semiconductor device may be mounted on a mounting substrate via a solder in contact with the connection electrode. In the mounting process, the semiconductor device is heated to melt the solder. Although the wiring is also heated thereby, the barrier metal film relaxes the stress from the wiring and cracking of the insulating film can thus be suppressed.

When a semiconductor device, having a wiring of uniform thickness formed above an insulating film, is heated, the wiring and the insulating film expand respectively due to the applied heat. The wiring ordinarily has a higher thermal expansion coefficient than the insulating film and causes stress to be generated in a direction along a surface of the insulating film by the thermal expansion. Due to this stress, a crack (fissure) may form in the insulating film. A crack in the insulating film tends to form readily at a periphery of a wiring edge portion at which the stress from the wiring concentrates. Also, as the wiring is thickened, the stress due to thermal expansion increases and the risk of crack formation thus increases. Although such crack formation may be avoided by thinning of the wiring, in this case, there is a trade-off that the wiring increases in resistance value.

Therefore, a preferred embodiment according to a second aspect of the present invention provides a semiconductor device including a semiconductor substrate, an insulating film formed above the semiconductor substrate, and a wiring formed above the insulating film and having an edge portion and an inner portion positioned further to an inner side than the edge portion, and the edge portion of the wiring includes a thin film portion of smaller thickness than the inner portion.

With the present structure, the edge portion of the wiring that is positioned at a portion at which a crack in the insulating film otherwise forms readily includes the thin film portion. Stress caused by thermal expansion at the edge portion of the wiring is thereby lessened to enable stress in a direction along a front surface of the insulating film to be reduced and formation of a crack in the insulating film at a periphery of the edge portion of the wiring can thus be suppressed. Also, while crack formation can be suppressed by the thin film portion, the inner portion can be thickened to suppress the resistance of the wiring from becoming high.

In the semiconductor device, the thin film portion may include an inclining portion that gradually decreases in thickness in a direction away from the inner portion. With the present arrangement, the stress in the direction along the front surface of the insulating film can be reduced and crack formation in the insulating film can thus be suppressed.

In the semiconductor device, the inclining portion preferably has a surface that curves toward the inner portion side of the wiring. With this feature, the stress in the direction along the surface of the insulating film can be reduced effectively and crack formation in the insulating film at the periphery of the edge portion of the wiring can thus be suppressed effectively.

In the semiconductor device, the wiring may include a first conductor layer formed above the insulating film and a second conductor layer formed above the first conductor layer. In this case, the first conductor layer may have a protruding portion protruding from a peripheral edge of the second conductor layer and the thin film portion may be formed by the protruding portion. The stress in the direction along the surface of the insulating film can be reduced and crack formation in the insulating film can thus be suppressed with the present arrangement as well.

Preferably in the semiconductor device, the thin film portion is formed across an entirety of the edge portion of the wiring. With the present arrangement, the stress in the direction along the surface of the insulating film can be reduced by the entire wiring and crack formation can thus be suppressed across a wide range of the insulating film.

The semiconductor device may include a plurality of the wirings formed at intervals from each other above the insulating film. In this case, between a plurality of the wirings that are mutually adjacent, the thin film portion may be formed, at least at a portion of the edge portion at which the plurality of the wirings face each other.

For example, if a plurality of wirings without a thin film portion are formed at intervals from each other above the insulating film, the insulating film positioned between a plurality of wirings that are mutually adjacent receives stress from both wirings. Therefore, the risk of crack formation in the insulating film positioned between a plurality of wirings is higher than that at other portions. The risk of crack formation in the insulating film between the plurality of wirings that are mutually adjacent can thus be reduced by forming the thin film portion at least at the portion of the edge portion at which the plurality of the wirings face each other.

The semiconductor device may include a plurality of the wirings formed at intervals from each other above the insulating film. In this case, between a plurality of the wirings that are mutually adjacent, the thin film portion may be formed at least at a portion of the edge portion at which the plurality of the wirings face each other across an inter-wiring distance of not more than 20 μm. Crack formation in the insulating film between the plurality of wirings that are mutually adjacent can be reduced with this feature as well. In particular, by providing the structure where the thin film portion is disposed restrictively at a portion of the wiring edge portion at which the inter-wiring distance is short, a wiring cross-sectional area can be made large at other portions to enable suppression of increase of wiring resistance.

In the semiconductor device, the wiring may contain a metal having copper as a main component and the insulating film may include a nitride film or an oxide film. Although there is a difference in thermal expansion coefficient between the metal having copper as the main component and the nitride film or the oxide film, cracking can be suppressed by the thin film portion, and therefore a structure can be formed with which the wiring is disposed above the nitride film or the oxide film of satisfactory film quality. Also, by containing the metal having copper as the main component, the wiring can be made low in resistance.

In the semiconductor device, the wiring may contain a metal having aluminum as a main component and the insulating film may include an oxide film. Although there is a difference in thermal expansion coefficient between the metal having aluminum as the main component and the oxide film, cracking can be suppressed by the thin film portion, and therefore a structure can be formed with which the wiring is disposed above the oxide film of satisfactory film quality.

The semiconductor device may further include a barrier film interposed between the wiring and the insulating film.

In the semiconductor device, the inner portion of the wiring may have a thickness of not more than 20 μm.

The semiconductor device may further include a multilayer wiring structure formed above the semiconductor substrate and having a plurality of wiring layers laminated via an interlayer insulating film. In this case, the insulating film may be formed above the multilayer wiring structure so as to cover the multilayer wiring structure and the wiring may be formed above the insulating film as an uppermost layer wiring.

Crack formation in the insulating film caused by thermal expansion of the wiring occurs especially readily if a side surface of the uppermost layer wiring is not supported by a protective film, etc. In such a case, by applying the wiring structure having the thin film portion at the edge portion of the wiring, crack formation can be avoided while suppressing the increase of the wiring resistance value.

The semiconductor device may further include a bonding wire electrically connected to the wiring. For example, in connecting the bonding wire to the wiring, the semiconductor substrate, etc., may be heated to a temperature of not less than 200° C. (for example, approximately 260° C.). The applied heat causes thermal expansion of the wiring upon being transmitted thereto directly or via the semiconductor substrate, etc. In this process, the thin film portion of the wiring relaxes the concentration of stress at the edge portion of the wiring and crack formation in the insulating film can thus be suppressed.

The bonding wire may include a copper wire or a gold wire.

The semiconductor device may further include an above-wiring insulating film, formed above the insulating film so as to cover the wiring, and a rewiring formed above the above-wiring insulating film so as to be electrically connected to the wiring. The structure may further include a bonding wire electrically connected to the rewiring. For example, in connecting the bonding wire to the rewiring, the semiconductor substrate, etc., may be heated to a temperature of not less than 200° C. (for example, approximately 260° C.). The applied heat is transmitted to the wiring via the semiconductor substrate and the rewiring, etc. In this process, the thin film portion of the wiring relaxes the concentration of stress at the edge portion of the wiring and cracking of the insulating film can thus be suppressed.

The semiconductor device may further include a connection electrode, electrically connected to the wiring, and a wiring substrate having a bonding surface to which the semiconductor substrate is flip-chip bonded via the connection electrode. For example, in connecting the connection electrode to the wiring substrate, the semiconductor substrate may be heated to a temperature of not less than 200° C. (for example, approximately 260° C.). The applied heat is transmitted to the wiring via the semiconductor substrate and the connection electrode, etc. In this process, the thin film portion of the wiring relaxes the concentration of stress at the edge portion of the wiring and cracking of the insulating film can thus be suppressed.

The semiconductor device may further include a land disposed at a surface at a side of the wiring substrate opposite the bonding surface and electrically connected via a via electrode to the wiring. For example, the semiconductor device is mounted on a mounting substrate via a solder in contact with the land. In the mounting process, the semiconductor device is heated to melt the solder. Although the wiring is also heated thereby, the concentration of stress at the edge portion of the wiring is relaxed by the function of the thin film portion. Cracking of the insulating film due to heating during mounting can thereby be suppressed.

The semiconductor device may further include a connection electrode, electrically connected to the wiring, and a sealing resin covering a front surface, a rear surface, and a side surface of the semiconductor substrate so as to expose the connection electrode. For example, the connection electrode may be formed as an external terminal arranged to achieve electrical connection with the exterior. In this case, the semiconductor device may be mounted on a mounting substrate via a solder in contact with the connection electrode. In the mounting process, the semiconductor device is heated to melt the solder. Although the wiring is also heated thereby, the concentration of stress at the edge portion of the wiring is relaxed by the function of the thin film portion of the wiring. Cracking of the insulating film due to heating during mounting can thereby be suppressed.

A preferred embodiment according to one aspect of the present invention provides a method for manufacturing a semiconductor device including a step of forming an insulating film above a semiconductor substrate, a cover film forming step of forming, above the insulating film, a cover film having an opening selectively exposing the insulating film and having an inclining surface defining the opening so that an opening width of the opening widens gradually along a direction toward the insulating film, and a wiring forming step of embedding the opening with a conductor to form a wiring including an inclining portion conforming to the inclining surface of the cover film.

With the present method, a semiconductor device including the semiconductor substrate, the insulating film formed above the semiconductor substrate, and the wiring formed above the insulating film and having an edge portion and an inner portion positioned further to an inner side than the edge portion is manufactured. The inclining portion that gradually decreases in thickness in a direction away from the inner portion is formed at the edge portion of the wiring. The inclining portion provides, at the edge portion of the wiring, a thin film portion of less thickness than the inner portion. By this structure, even when heat applied to the semiconductor substrate, etc., is transmitted to the wiring during a manufacturing process after the forming of the wiring, thermal expansion of the edge portion of the wiring can be made small so that, at the edge portion, stress generated in a direction along a surface of the insulating film can be reduced. Consequently, crack formation in the insulating film at a periphery of the edge portion of the wiring can be suppressed. Also, while crack formation can be suppressed by the thin film portion, the inner portion can be thickened to suppress increase of the resistance value of the wiring.

In the method, it is preferable that the cover film having the inclining surface of curved shape that curves toward the opening is formed in the cover film forming step and that the wiring including the inclining portion having a surface of curved shape conforming to the inclining surface of the cover film is formed in the wiring forming step. With the present method, the wiring that includes the inclining surface having the surface that curves toward the inner portion side is formed above the insulating film. The stress in the direction along the surface of the insulating film can thereby be reduced effectively and crack formation in the insulating film at the periphery of the edge portion of the wiring can thus be suppressed effectively.

In the method, the cover film may contain a photosensitive resin and the opening may be formed by selectively exposing the cover film.

The method may further include a step in which, after the wiring forming step, the semiconductor substrate is brought to a temperature of not less than 200° C. and a bonding wire is connected to the wiring. Even when the temperature of the semiconductor substrate is increased as in the present method, crack formation in the insulating film can be suppressed.

A preferred embodiment according to another aspect of the present invention provides a method for manufacturing a semiconductor device including a step of forming an insulating film above a semiconductor substrate, a step of forming a first cover film having a first opening selectively exposing the insulating film, a step of embedding the first opening with a conductor to form a first conductor layer in the first opening, a step of removing the first cover film, a step of forming a second cover film having a second opening selectively exposing the first conductor layer, and a step of embedding the second opening with a conductor to form a second conductor layer in the second opening. In the step of forming the second cover film, the second opening is formed so that the first conductor layer protrudes from a peripheral edge of the second opening.

With the present method, a semiconductor device including the semiconductor substrate, the insulating film formed above the semiconductor substrate, and a wiring formed above the insulating film and having an edge portion and an inner portion positioned further to an inner side than the edge portion is manufactured. More specifically, the wiring includes the first conductor layer and the second conductor layer. The inner portion of the wiring includes the first conductor layer and the second conductor layer and has a thickness corresponding to a total thickness of the layers. On the other hand, the edge portion of the wiring includes a protruding portion of the first conductor layer and the protruding portion provides a thin film portion of less film thickness than the inner portion. By this structure, thermal expansion of the edge portion of the wiring (protruding portion of the first conductor layer) when the wiring is heated during a manufacturing process can be made small so that, at the edge portion, generation of a large stress in a direction along a surface of the insulating film can be avoided. Consequently, crack formation in the insulating film at a periphery of the edge portion of the wiring can be suppressed. Also, while crack formation can be suppressed by the thin film portion of the wiring edge portion, the inner portion can be thickened to suppress increase of the resistance value of the wiring.

Preferred embodiments of the present invention shall now be described with reference to the attached drawings.

First Preferred Embodiment

Figure 2:
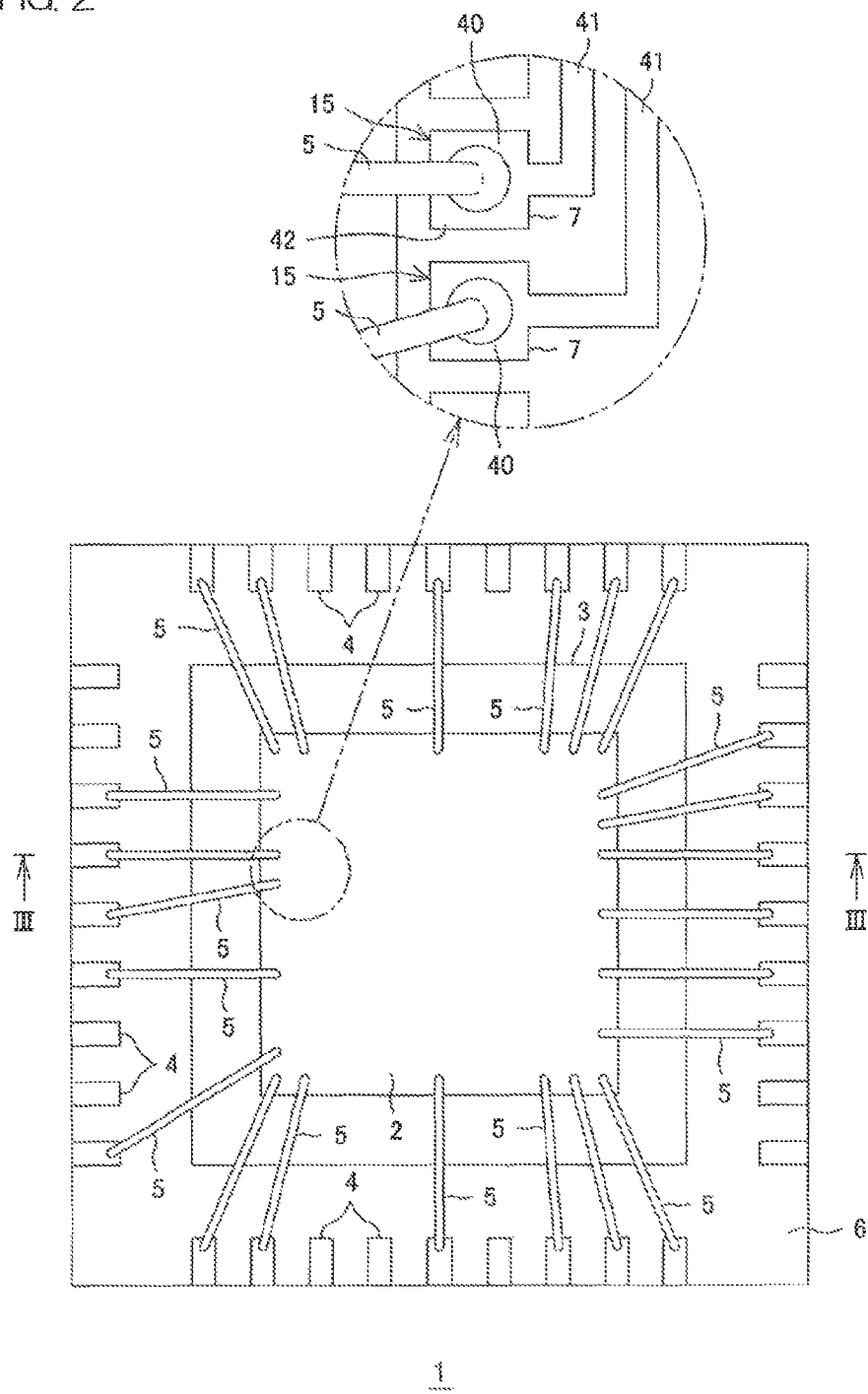
FIG. 2 is a plan view of an internal structure of the semiconductor device of FIG. 1.
Figure 3:
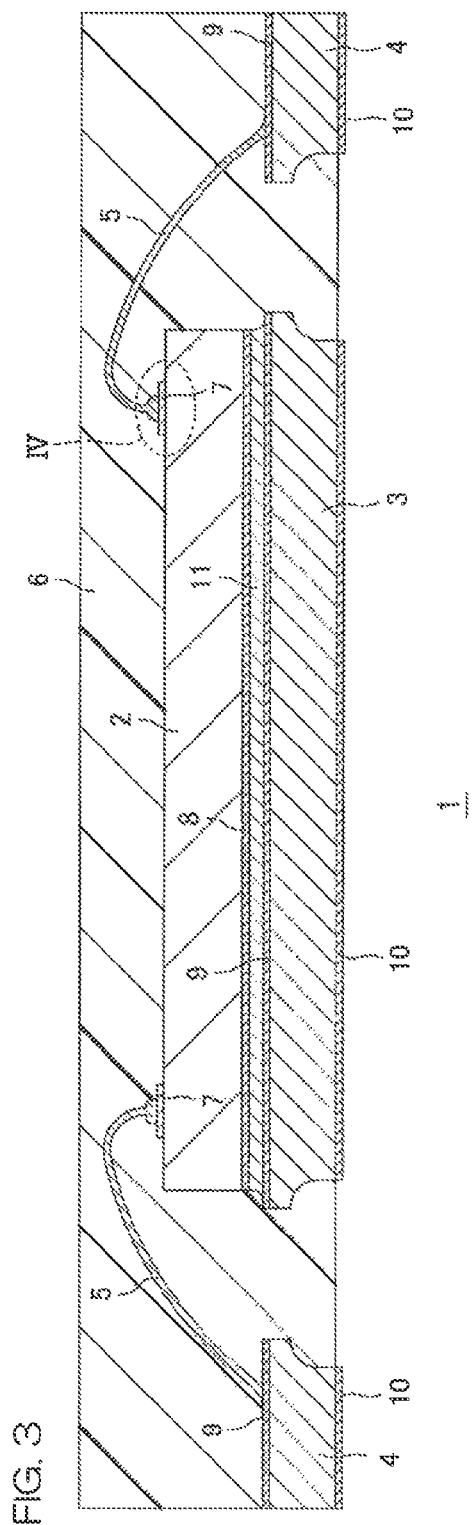
FIG. 3 is a sectional view taken along section line of FIG. 2.

FIG. 1 is a bottom view of a semiconductor device 1 according to a first preferred embodiment of the present invention. FIG. 2 is a plan view of an internal structure of the semiconductor device 1 of FIG. 1. FIG. 3 is a sectional view taken along section line III-III of FIG. 2.

The semiconductor device 1 is a semiconductor device to which a QFN (Quad Flat Non-leaded Package) is applied. The semiconductor device 1 includes a semiconductor chip 2, a die pad 3, leads 4, bonding wires 5, and a resin package 6 that seals these components. An outer shape of the resin package 6, that is, an outer shape of the semiconductor device 1 is a flat, rectangular parallelepiped shape.

A plurality of pads 7 are disposed on a front surface of the semiconductor chip 2. Each pad 7 is formed, for example, at a peripheral edge portion of the semiconductor chip 2. Each pad 7 is electrically connected, for example, to a semiconductor element or device in the chip 2. A rear metal 8, constituted of a metal layer of gold (Au), nickel (Ni), silver (Ag), etc., is formed on a rear surface of the semiconductor chip 2.

The die pad 3 and the leads 4 are formed by punching out a metal thin plate (for example, a copper thin plate). Plating layers 9, constituted of silver, are formed on front surfaces of the die pad 3 and the leads 4. The die pad 3 has a square shape in plan view and the semiconductor chip 2 is disposed at a central portion thereof. Across an entire periphery of a peripheral edge portion of a rear surface of the die pad 3, a recess of substantially ¼ elliptical cross-sectional shape is formed by coining from the rear surface side. A sealing resin that constitutes the resin package 6 enters into the recess.

A peripheral edge portion of the die pad 3 is sandwiched from above and below by the sealing resin (resin package 6), and the die pad 3 is prevented from falling-off from (is retained in) the resin package 6. With the exception of the portion recessed in the substantially ¼ elliptical cross-sectional shape, the rear surface of the die pad 3 is exposed from a rear surface of the resin package 6. A plating layer 10, constituted of solder, is formed on a portion of the rear surface of the die pad 3 that is exposed from the resin package 6.

An equal number (for example, nine) of the leads 4 are provided at each of positions facing respective side surfaces of the die pad 3. At each of the positions facing the side surfaces of the die pad 3, the leads 4 extend in directions orthogonal to the facing side surface and are disposed at equal intervals in a direction parallel to the side surface. At an end portion at the die pad 3 side of a rear surface of each lead 4, a recess of substantially ¼ elliptical cross-sectional shape is formed by coining from the rear surface side. The sealing resin that constitutes the resin package 6 enters into the recess.

An end portion at the die pad 3 side of each lead 4 is sandwiched from above and below by the sealing resin (resin package 6), and the lead 4 is prevented from falling-off from (is retained in) the resin package 6. With the exception of the portion recessed in the substantially ¼ elliptical cross-sectional shape, the rear surface of the lead 4 is exposed from the rear surface of the resin package 6. Also, a side surface of the lead 4 at the side opposite the die pad 3 side is exposed from a side surface of the resin package 6. A plating layer 10, constituted of solder, is formed on a portion of the rear surface of each lead 4 that is exposed from the resin package 6.

In the present preferred embodiment, the semiconductor chip 2, in a state where the front surface, at which the pads 7 are disposed, is faced upward, has its rear surface bonded via a bonding material 11 to the front surface (plating layer 9) of the die pad 3. The bonding material 11 is, for example, solder paste. If electrical connection of the semiconductor chip 2 and the die pad 3 is unnecessary, the rear metal 8 may be omitted and the rear surface of the semiconductor chip 2 may be bonded to the front surface of the die pad 3 via a bonding material, constituted of an insulating paste, etc. In this case, the plating layer 9 above the front surface of the die pad 3 may be omitted.

Each bonding wire 5 has one end bonded to a pad 7 of the semiconductor chip 2 and another end bonded to a front surface of a lead 4. The bonding wire 5 includes a copper wire or a gold wire, for example.

Figure 4:
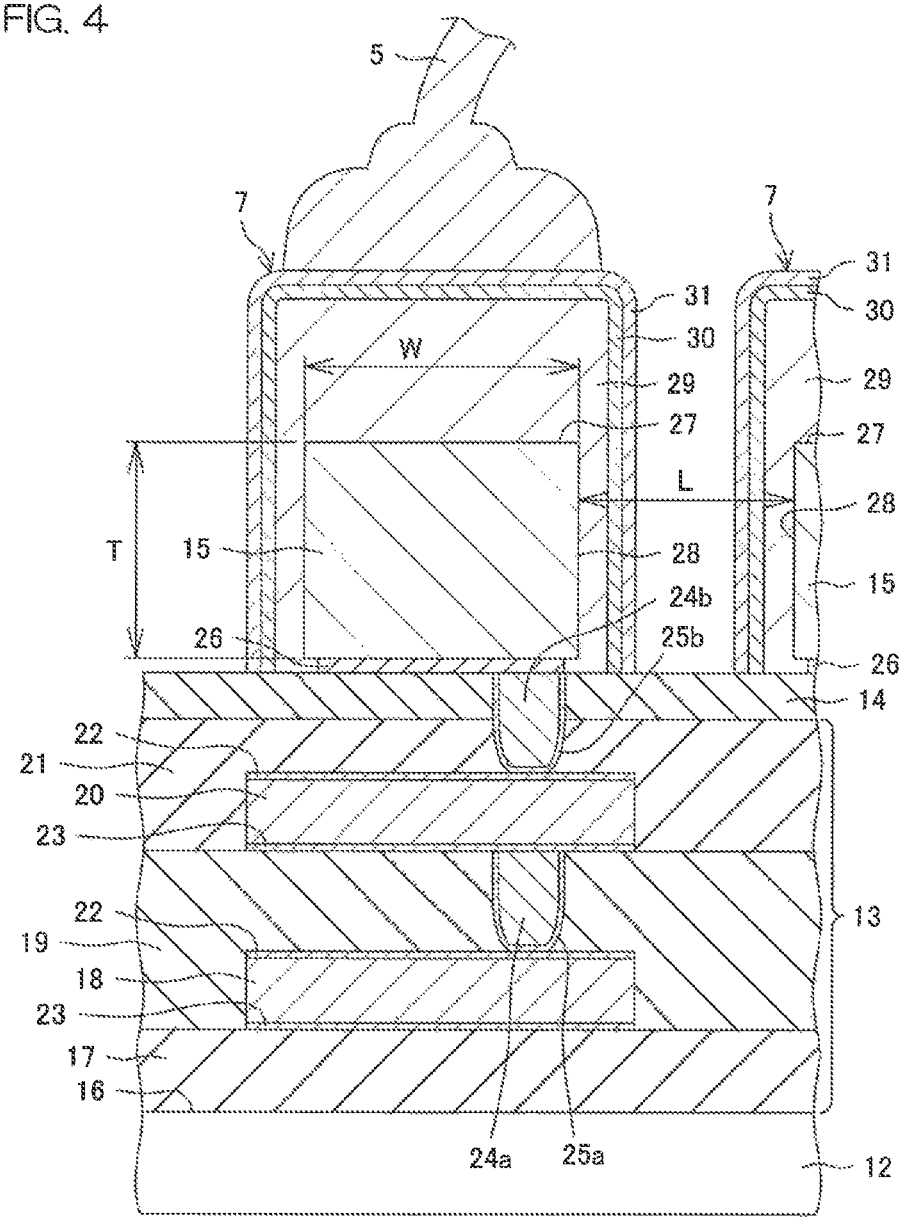
FIG. 4 is an enlarged sectional view of a portion of FIG. 3 surrounded by a broken line circle IV.

FIG. 4 is an enlarged sectional view of a portion of FIG. 3 surrounded by a broken line circle IV and is a diagram of an example of wirings 15.

The semiconductor chip 2 includes a semiconductor substrate 12, a multilayer wiring structure 13, a passivation film 14 as an example of an insulating film, and the wirings 15. The semiconductor substrate 12 is constituted, for example, of a silicon substrate having an element or device forming surface 16, on which a semiconductor element or device (a diode, transistor, resistor, capacitor, etc.) is formed.

The multilayer wiring structure 13 has a plurality of wiring layers that are laminated successively from the element forming surface 16 of the semiconductor substrate 12 via interlayer insulating films. In the present preferred embodiment, the multilayer wiring structure 13 has a first metal layer 18 laminated on the element forming surface 16 of the semiconductor substrate 12 via a first interlayer insulating film 17, a second metal layer 20 laminated on the first metal layer 18 via a second interlayer insulating film 19, and a third interlayer insulating film 21 covering the second metal layer 20. Each of the first interlayer insulating film 17, the second interlayer insulating film 19, and the third interlayer insulating film 21 contains, for example, an insulating material, such as silicon oxide ($SiO_2$), silicon nitride (SiN), etc. Each of the first metal layer 18 and the second metal layer 20 contains aluminum.

An upper surface barrier film 22 and a lower surface barrier film 23 are formed on upper and lower surfaces of the first metal layer 18 respectively to prevent diffusion of impurities into the first interlayer insulating film 17 and the second interlayer insulating film 19. Similarly, an upper surface barrier film 22 and a lower surface barrier film 23 are formed on upper and lower surfaces of the second metal layer 20 respectively to prevent diffusion of impurities into the second interlayer insulating film 19 and the third interlayer insulating film 21. Each of the upper surface barrier films 22 formed on the respective upper surfaces of the first metal layer 18 and the second metal layer 20 may contain, for example, titanium nitride. On the other hand, each of the lower surface barrier films 23 formed on the respective lower surfaces of the first metal layer 18 and the second metal layer 20 may have, for example, a two-layer structure in which titanium nitride and titanium are laminated successively from the corresponding lower surface of the first metal layer 18 or the second metal layer 20.

The passivation film 14 is formed on the multilayer wiring structure 13 so as to cover the multilayer wiring structure 13. More specifically, the passivation film 14 is formed on the third interlayer insulating film 21. The passivation film 14 may, for example, be silicon oxide, BPSG (Boron Phosphorus Silicon Glass), or silicon nitride. The passivation film 14 may have a laminated structure in which silicon nitride and silicon oxide are laminated successively from the front surface of the third interlayer insulating film 21.

A first via 24a, penetrating through the second interlayer insulating film 19, is connected to the upper surface of the first metal layer 18. The first via 24a penetrates through the second interlayer insulating film 19 and is connected to the lower surface of the second metal layer 20. The first via 24a contains tungsten. A first barrier film 25a, containing, for example, titanium nitride, is interposed between the first via 24a and the second interlayer insulating film 19.

On the other hand, a second via 24b, penetrating through the third interlayer insulating film 21 and the passivation film 14, is connected to the upper surface of the second metal layer 20. The second via 24b is exposed from the front surface of the passivation film 14. The second via 24b is formed to be flush with the front surface of the passivation film 14. The second via 24b contains tungsten. A second barrier film 25b, containing, for example, titanium nitride, is interposed between the second via 24b and the third interlayer insulating film 21 and between the second via 24b and the passivation film 14.

With reference to the enlarged view in FIG. 2 and to FIG. 4, a plurality of the wirings 15 are formed at intervals from each other above the passivation film 14. Each wiring 15 is disposed so as to cover a second via 24b exposed from the surface of the passivation film 14. Each wiring 15 integrally has a connection portion 40 electrically connected to a bonding wire 5 and a lead-out portion 41 selectively led out from the connection portion 40. In the present preferred embodiment, the connection portion 40 is formed to a substantially rectangular shape in plan view as a portion of a pad 7 (see FIG. 3) described above. With the respective wirings 15, mutually adjacent lead-out portions 41 may be formed to extend substantially in parallel to each other across predetermined intervals.

Each wiring 15 has a flat upper surface 27 extending along the surface of the passivation film 14. A width W of each wiring 15 is, for example, not less than 7 µm and not more than 20 µm. Also, a thickness T of each wiring 15 is, for example, not less than 7 µm and not more than 20 µm. Within these numerical value ranges, an aspect ratio $R_{15}$ (=thickness T/width W) of each wiring 15 may be such that $0<R_{15}\leq1$. An inter-wiring distance L of the plurality of wirings 15 may, for example, be not more than 20 µm.

Each wiring 15 may contain a metal having copper as a main component. A metal having copper as the main component refers to a metal with which a mass percentage (mass %) of copper is the highest with respect to other components (the same applies hereinafter). For example, if the wiring 15 may be constituted of an aluminum-copper (Al—Cu) alloy or an aluminum-silicon-copper (Al—Si—Cu) alloy, etc., a mass percentage $R_{Cu}$ of copper is higher than a mass percentage $R_{Al}$ of aluminum and a mass percentage $R_{Si}$ of silicon ($R_{Cu}>R_{Al}$, $R_{Cu}>R_{Si}$). A metal having copper as the main component may contain a minute amount of impurity. A metal having copper as the main component may includes high purity copper of not less than 99.9999% (6N) purity, high purity copper of not less than 99.99% (4N) purity, etc.

A barrier metal film 26 and a copper seed film (not shown) are disposed interposingly between each wiring 15 and the passivation film 14. The barrier metal film 26 is formed on the passivation film 14 and the copper seed film (not shown) is formed on the barrier metal film 26. In the present preferred embodiment, the copper seed film (not shown) is made integral to each wiring 15. The barrier metal film 26 is formed so that, in sectional view, both end portions or side portions thereof are positioned further inward than side surfaces 28 of the wiring 15. That is, a width of the barrier metal film 26 is smaller than the width W of the wiring 15. The barrier metal film 26 has a thickness smaller than the thickness of the wiring 15. The thickness of the barrier metal film 26 may, for example, be not less than 0.1 µm and not more than 0.3 µm. Each wiring 15 is electrically connected to a second via 24b via the copper seed film (not shown) and the barrier metal film 26.

A laminated film of a Ni (nickel) film 29, a Pd (palladium) film 30, and an Au (gold) film 31 are formed on surfaces of each wiring 15. The Ni film 29 is formed along the upper surface 27 and the side surfaces 28 of each wiring 15 to cover each wiring 15. In the present preferred embodiment, a portion of the Ni film 29 formed on the upper surface 27 of each wiring 15 is formed to be thicker than other portions. The Ni film 29 may have a uniform thickness instead. The thickness of the Ni film 29 may, for example, be not less than 2 µm and not more than 4 µm.

The Pd film 30 covers an entirety of the Ni film 29 with a uniform thickness (for example, of not less than 0.1 µm and not more than 0.5 µm). The Au film 31 covers an entirety of the Pd film 30 with, for example, a uniform thickness (for example, of not less than 0 µm and not more than 0.05 µm) thinner than the Pd film 30. The laminated film of the Ni film 29, the Pd film 30, and the Au film 31 functions as a protective film that protects the wiring 15. The bonding wire 5 is connected to the Au film 31. That is, in the present preferred embodiment, each pad 7 is formed of the connection portion 40 of each wiring 15, the Ni film 29, the Pd film 30, and the Au film 31.

Here, a semiconductor device that includes a barrier metal film 26 having a modulus of rigidity lower than copper shall be considered as a reference example with reference to Table 1. Table 1 shows the respective materials of the wirings 15, the barrier metal film 26, and the passivation film 14 of the semiconductor device according to the reference example. In the following, a case where the wirings 15 are constituted of high purity copper of not less than 99.9999% (6N) purity or high purity copper of not less than 99.99% (4N) purity, etc. (hereinafter referred to simply as "copper") shall be described as an example.

TABLE 1

|  | Wirings | Barrier metal film | Passivation film | |
| --- | --- | --- | --- | --- |
| Material | Cu | Ti | SiO$_2$ | SiN |
| Thermal expansion coefficient (μm/m · K) | 16.5 | 8.6 | 0.58 | 3.2 |
| Modulus of rigidity (Gpa) | 48 | 44 | | |
| Electric resistivity (nΩ · m) | 16.8 | 420 | | |

The semiconductor device according to the reference example includes a barrier metal film 26, constituted of titanium, which has a lower modulus of rigidity than copper, between the passivation film 14 constituted of an oxide film or a nitride film and the wirings 15 constituted of copper. When heat is applied to the semiconductor device in the middle of a manufacturing process or after manufacture, thermal expansions of the wirings 15, the barrier metal film 26, and the passivation film 14 occur. The wirings 15 and the barrier metal film 26 have higher thermal expansion coefficients than the passivation film 14 and cause stress to be generated in a direction along the surface of the passivation film 14 by the thermal expansions.

The barrier metal film 26 transmits, to the passivation film 14, stress from each wiring 15 in addition to stress due to its own thermal expansion. If the barrier metal film 26 has a lower modulus of rigidity than each wiring 15, it deforms upon receiving the stress from the wiring 15 and transmits the stress of the wiring 15 to the passivation film 14 positioned therebelow. Due to this stress, concentration of stress occurs at a peripheral edge of the wiring 15 and may cause crack (fissure) formation in the passivation film 14 positioned therebelow. Although such crack formation may be avoided by thinning the wiring 15, in this case, there is a trade-off that the wiring 15 increases in resistance value.

From the above, it is considered that crack formation in the passivation film 14 can be suppressed by adopting, in the barrier metal film 26, a metal material having a higher modulus of rigidity than the modulus of rigidity of copper (48 Gpa) in place of or in addition to titanium. It is also considered that by thickening the wiring 15, the wiring 15 can be suppressed from increasing in resistance value or can be made low in resistance.

Also, it is considered that crack formation can be suppressed effectively by setting the thermal expansion coefficient of the barrier metal film 26 to be less than the thermal expansion coefficient of copper (16.5 μm/m·K) and more preferably less than the thermal expansion coefficient of titanium (8.6 μm/m·K). In other words, it is considered that crack formation in the passivation film 14 can be suppressed effectively by bringing the thermal expansion coefficient of the barrier metal film 26 close to the thermal expansion coefficient of the passivation film 14. In such cases, it is desirable, from a standpoint of suppressing the increase of resistance value to adopt a metal material with an electric resistivity less than that of titanium (=420 nΩ·m) as the metal material of the barrier metal film 26. An example of metal materials of the barrier metal film 26 meeting the above conditions is shown in Table 2 below.

TABLE 2

|  | Metal material of the barrier metal film | | | | |
| --- | --- | --- | --- | --- | --- |
|  | Ta | W | Mo | Cr | Ru |
| Thermal expansion coefficient (μm/m · K) | 6.3 | 4.5 | 4.8 | 4.9 | 6.4 |
| Modulus of rigidity (Gpa) | 69 | 161 | 126 | 115 | 173 |
| Electric resistivity (nΩ · m) | 131 | 52.8 | 53.4 | 125 | 71 |

As shown in Table 2, the barrier metal film 26 may contain one or a plurality of metal species selected from the group consisting of tantalum (Ta), tungsten (W), molybdenum (Mo), chromium (Cr), and ruthenium (Ru). With these metal species, a barrier metal film 26 having a thermal expansion coefficient of not less than 4 μm/m·K and less than 7 μm/m·K, a modulus of rigidity of not less than 50 Gpa and not more than 180 Gpa, and an electric resistivity of not less than 50 nΩ·m and not more than 150 nΩ·m can be obtained.

That is, with the above metal species, a barrier metal film 26 having a thermal expansion coefficient less than the thermal expansion coefficient of copper (16.5 μm/m·K) and the thermal expansion coefficient of titanium (8.6 μm/m·K) can be realized. Also with these metal species, a barrier metal film 26 having a higher modulus of rigidity than the modulus of rigidity of copper (48 Gpa) or the modulus of rigidity of titanium (44 Gpa) can be realized. Further with these metal species, a barrier metal film 26 having a lower electric resistivity less than the electric resistivity of titanium (420 nΩ·m) can be realized.

Referring to Table 2, a barrier metal film 26, meeting at least one of the conditions of a thermal expansion coefficient of not less than 4 μm/m·K and less than 5 μm/m·K, a modulus of rigidity of not less than 100 Gpa and not more than 180 Gpa, and an electric resistivity of not less than 50 nΩ·m and not more than 100 nΩ·m, may be formed. If all of these conditions are met, the barrier metal film 26 may contain at least one of tungsten and molybdenum.

For example, the barrier metal film 26 may have a thermal expansion coefficient of not less than 4 μm/m·K and less than 5 μm/m·K and a modulus of rigidity of not less than 100 Gpa and not more than 180 Gpa. In this case, the barrier metal film 26 may contain one or a plurality of metal species selected from the group consisting of tungsten, molybdenum, and chromium. Or, the barrier metal film 26 may have a thermal expansion coefficient of not less than 4 μm/m·K and less than 5 μm/m·K and an electric resistivity of not less than 50 nΩ·m and not more than 100 nΩ·m. In this case, the barrier metal film 26 may contain at least one of tungsten and molybdenum. Or, the barrier metal film 26 may have a modulus of rigidity of not less than 100 Gpa and not more than 180 Gpa and an electric resistivity of not less than 50 nΩ·m and not more than 100 nΩ·m. In this case, the barrier metal film 26 may contain one or a plurality of metal species selected from the group consisting of tungsten, molybdenum, and ruthenium.

Referring to FIG. 4, if a metal material having a modulus of rigidity higher than copper is adopted in the barrier metal film 26 in place of titanium, the passivation film 14 may include an oxide film or a nitride film. In this case, the barrier metal film 26 may contain one or a plurality of metal species selected from the group consisting of tantalum, molybdenum, chromium, and ruthenium. With these metal species, the barrier metal film 26 can be formed on the passivation film while maintaining satisfactory adhesion with the passivation film 14. Also, the barrier metal film 26 has an electric resistivity lower than titanium and therefore the semiconductor device 1 can be made low in resistance.

Figure 5:
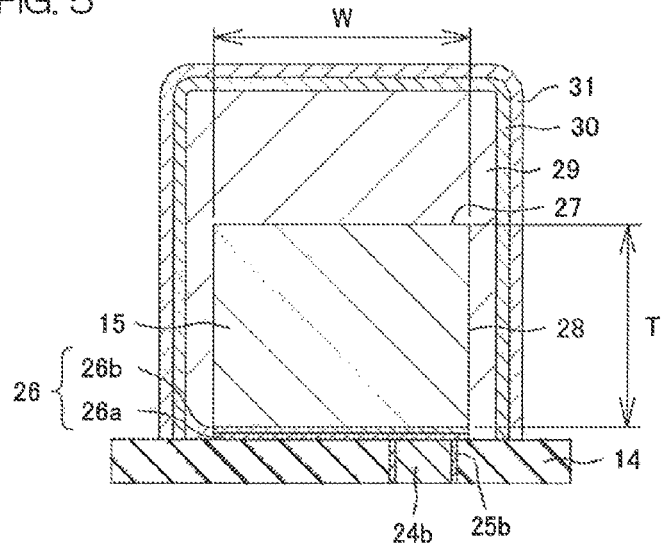
FIG. 5 is a sectional view of an example of a barrier metal film.

On the other hand, if a metal material having a modulus of rigidity higher than copper is adopted in the barrier metal film 26 in addition to titanium, the structure will be such as shown in FIG. 5. FIG. 5 is a sectional view of an example of the barrier metal film 26. In FIG. 5, just a wiring 15, the barrier metal film 26, and the structure in a periphery thereof are shown.

As shown in FIG. 5, the barrier metal film 26 having a laminated structure in which a plurality of metal films are laminated is interposed between the wiring 15 and the passivation film 14. The barrier metal film 26 includes a first metal film 26a formed on the passivation film 14 and a second metal film 26b formed on the first metal film 26a. The first metal film 26a is a titanium film and is electrically connected to the second via 24b. A thickness of the first metal film 26a may, for example, be not less than 0.1 µm and not more than 0.3 µm. On the other hand, the second metal film 26b is a metal film containing one or a plurality of metal species selected from the group consisting of tantalum, tungsten, molybdenum, chromium, and ruthenium. A thickness of the second metal film 26b may, for example, be not less than 0.1 µm and not more than 0.3 µm.

In the present structure, the passivation film 14 may be a nitride film and the second metal film 26b may be a tungsten film. If the passivation film 14 is a nitride film, the first metal film 26a (titanium film) can be formed on the passivation film 14 while maintaining satisfactory adhesion. Also, the second metal film 26b (tungsten film) can be formed on the first metal film 26a (titanium film) while maintaining satisfactory adhesion.

As described above, with the present preferred embodiment, the barrier metal film 26, having the modulus of rigidity higher than copper, is interposed between each wiring 15 having copper as the main component and the passivation film 14. Therefore, even if the wiring 15 causes stress to be generated in a direction along the surface of the passivation film 14 due to thermal expansion, the barrier metal film 26 hardly deforms due to the stress. Transmission of the stress from the wiring 15 to the passivation film 14 can thereby be suppressed by the barrier metal film 26. In addition, the barrier metal film 26 has a lower thermal expansion coefficient than copper; therefore, an amount of deformation of the barrier metal film 26 due to its thermal expansion can be made less than an amount of deformation of the wiring 15 due to its thermal expansion. The stress applied from the barrier metal film 26 to the passivation film 14 can thereby be made low. Consequently, crack formation in the passivation film 14 can be suppressed effectively. Also, while crack formation can be suppressed by the barrier metal film 26, the wiring 15 can be thickened to suppress increase of resistance value of the wiring 15 or make it low in resistance.

Also with the present preferred embodiment, the bonding wires 5 are connected to the wirings 15. For example, in connecting the bonding wires 5 to the wirings 15, the semiconductor substrate 12, etc., may be heated to a temperature of not less than 200° C. (for example, approximately 260° C.). The applied heat causes thermal expansions of the wirings 15 upon being transmitted thereto directly or via the semiconductor substrate 12, etc. In this process, the barrier metal film 26 relaxes the stress from the wirings 15 and crack formation in the passivation film 14 can thus be suppressed.

FIG. 6A to FIG. 6F are diagrams for describing a portion of a manufacturing process of the wiring 15 of FIG. 4. In the following description, FIG. 4 will be referenced as necessary. Also in the following, a case where the wiring 15 is constituted of high purity copper will be described as an example.

Figure 6A:
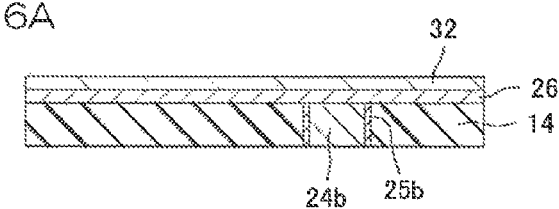

Prior to the forming of each wiring 15, the multilayer wiring structure 13 (see FIG. 4) is formed above the semiconductor substrate 12. Next, the passivation film 14 is formed on the multilayer wiring structure 13. Next, the second via 24b (see FIG. 4), which penetrates through the passivation film 14, is formed. Next, as shown in FIG. 6A, the barrier metal film 26 and a copper seed film 32 are formed in that order on the surface of the passivation film 14, for example, by a sputtering method.

Figure 6B:
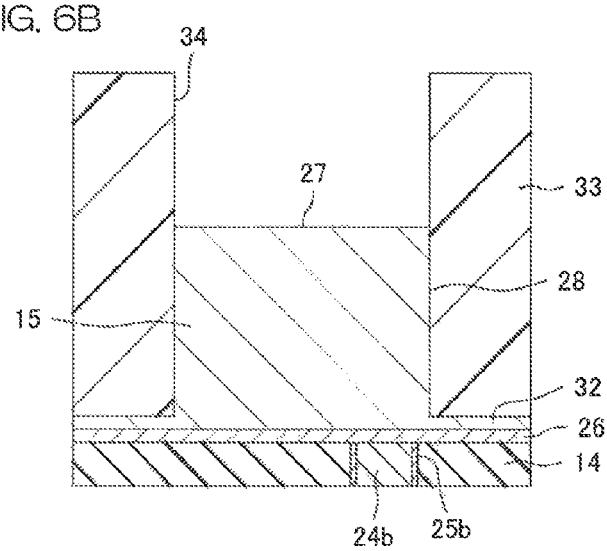

Next, as shown in FIG. 6B, a resist film 33, having an opening 34 in a region in which each wiring 15 is to be formed, is formed above the copper seed film 32. Next, copper is made to undergo plating growth by electroplating from the front surface of the copper seed film 32 exposed from the opening 34. Growing of (embedding with) copper is performed up to a middle portion of the opening 34. In this process, the copper that has been grown by plating is integral to the copper seed film 32. The wirings 15 are formed thereby.

Next, as shown in FIG. 6C, the opening 34 of the resist film 33 is used to make Ni grow by electroless plating from the upper surface 27 of each wiring 15. A portion of the Ni film 29 is thereby formed. Thereafter, the resist film 33 is removed as shown in FIG. 6D.

Figure 6E:
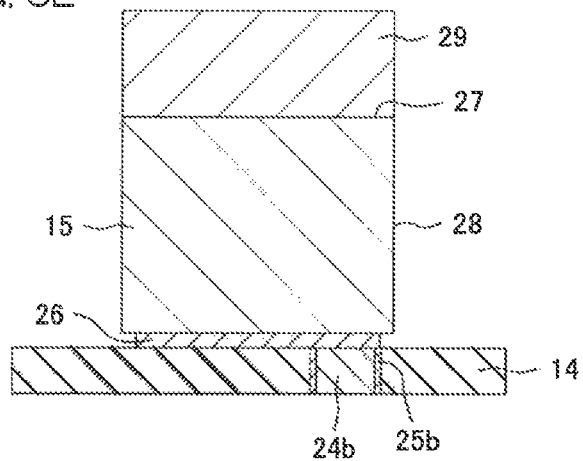

Next, as shown in FIG. 6E, the copper seed film 32 and the barrier metal film 26 are selectively removed, for example, by wet etching. In this process, end portions or side portions of the barrier metal film 26 are etched (over-etched) further inward than the side surfaces 28 of each wiring 15 so that the side portions of the barrier metal film 26 are formed to be positioned further inward than the side surfaces 28 of the wiring 15. Steps are thereby formed between the side portions of the barrier metal film 26 and the side surfaces 28. In this process, the side surfaces 28 of the wiring 15 may be etched together with the copper seed film 32 so that the side surfaces 28 of the wiring 15 are formed to be positioned further inward than side portions of the Ni film 29.

Figure 6F:
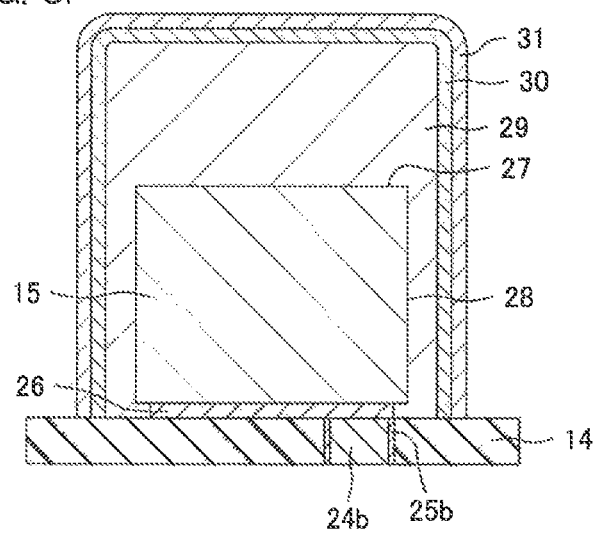

Next, as shown in FIG. 6F, plating growths of Ni, Pd, and Au are performed in that order by electroless plating from the side surfaces 28 of the wiring 15 and the Ni film 29. The laminated film of the Ni film 29, the Pd film 30, and the Au film 31 is thereby formed. Thereafter, the semiconductor substrate 12 is heated to a temperature of not less than 200° C. (for example, 260° C.) to connect the bonding wires 5 (see FIG. 4) to the wirings 15 (Au films 31).

Second Preferred Embodiment

Figure 7:
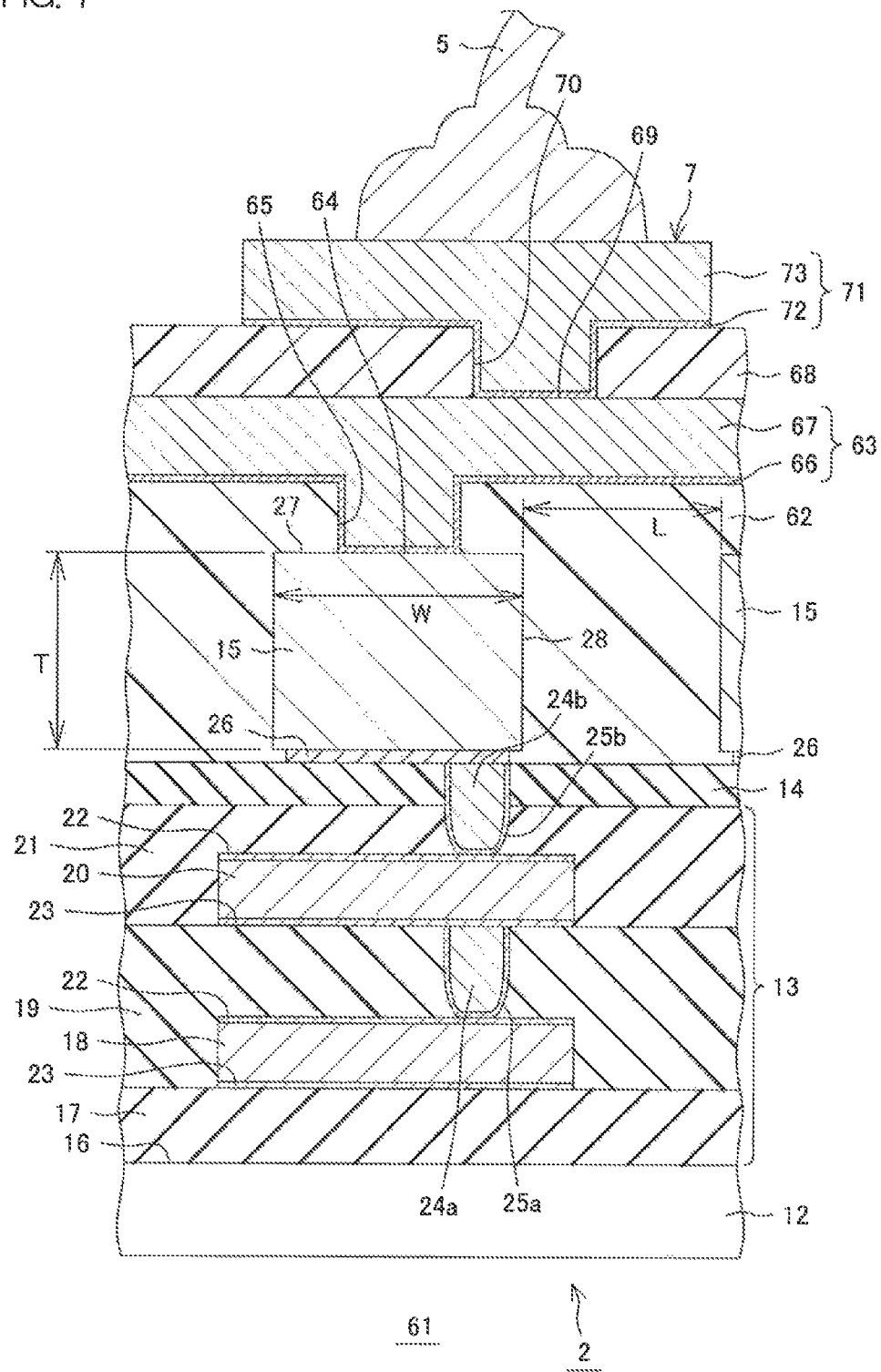
FIG. 7 is an enlarged sectional view of a semiconductor device, according to a second preferred embodiment of the present invention, showing a portion in which a wiring is formed.

FIG. 7 is an enlarged partial sectional view of a semiconductor device 61, according to a second preferred embodiment of the present invention, showing a portion in which a wiring 15 is formed. FIG. 7 corresponds to an enlarged view of the portion surrounded by the broken line circle IV of FIG. 3 described above. In FIG. 7, portions corresponding to respective portions shown in FIG. 4, etc., described above shall be provided with the same reference symbols and description thereof shall be omitted.

The semiconductor device 61 includes a first resin film 62, as an example of an above-wiring insulating film formed on the passivation film 14 so as to cover the wirings 15, and rewirings 63, formed on the first resin film 62 so as to be electrically connected to the wirings 15. The first resin film 62 contains, for example, a polyimide resin. The first resin film 62 has pad openings 65, each exposing a portion of a wiring 15 as an electrode pad 64. The rewirings 63 are routed above the first resin film 62.

Each rewiring 63 is formed to enter inside a pad opening 65 from the surface of the first resin film 62. The rewiring 63 is electrically connected to the electrode pad 64 inside the pad opening 65. In the present preferred embodiment, the rewiring 63 has a two-layer structure that includes a UBM (under-bump metal) film 66 and a wiring film 67 formed on the UBM film 66. The UBM film 66 has one surface and another surface both formed along the surface of the first resin film 62 and a surface of the electrode pad 64. The UBM film 66 may have a two-layer structure that includes a titanium film and a copper film formed on the titanium film. The wiring film 67 is formed along the UBM film 66 so as to enter into a recessed space formed by the UBM film 66 entering into the pad opening 65. The wiring film 67 may contain a metal having copper as a main component. A second resin film 68 is formed above the rewiring 63 so as to cover the rewiring 63.

The second resin film 68 has rewiring pad openings 70, each exposing a portion of a rewiring 63 as a rewiring pad 69. An electrode post 71 is formed on the rewiring pad 69. The electrode post 71 corresponds to the pad 7 (see FIG. 2). The electrode post 71 is formed so as to enter into the rewiring pad opening 70 from a surface of the second resin film 68. The electrode post 71 is electrically connected to the rewiring pad 69 inside the rewiring pad opening 70. In the present preferred embodiment, the electrode post 71 has a two-layer structure that includes a UBM film 72 and a wiring film 73 formed on the UBM film 72.

The UBM film 72 has one surface and another surface formed along the surface of the second resin film 68 and a surface of the rewiring pad 69. The UBM film 72 may have a two-layer structure that includes a titanium film and a copper film formed on the titanium film. The wiring film 73 is formed along the UBM film 72 so as to enter into a recessed space formed by the UBM film 72 entering into the rewiring pad opening 70. The wiring film 73 may contain a metal having copper as a main component. A bonding wire 5 is connected to the electrode post 71.

As described above, with the present preferred embodiment, the bonding wires 5 are electrically connected to the rewirings 63 via the electrode posts 71. For example, in connecting the bonding wires 5 to the electrode posts 71, the semiconductor substrate 12, etc., may be heated to a temperature of not less than 200° C. (for example, approximately 260° C.). The applied heat is transmitted to the wirings 15 via the semiconductor substrate 12, the electrode posts 71, the rewirings 63, etc. In this process, the barrier metal film 26 relaxes the stress from the wirings 15 and cracking of the passivation film 14 can thus be suppressed (see also FIG. 4, FIG. 5, etc.).

In the present preferred embodiment, crack formation in the first resin film 62 may be suppressed by forming the UBM film 66 of each rewiring 63 from one or a plurality of metal species selected from the group consisting of tantalum, tungsten, molybdenum, chromium, and ruthenium. Also, cracking of the second resin film 68 may be suppressed by forming the UBM film 72 of each electrode post 71 from one or a plurality of metal species selected from the group consisting of tantalum, tungsten, molybdenum, chromium, and ruthenium.

Third Preferred Embodiment

Figure 8:
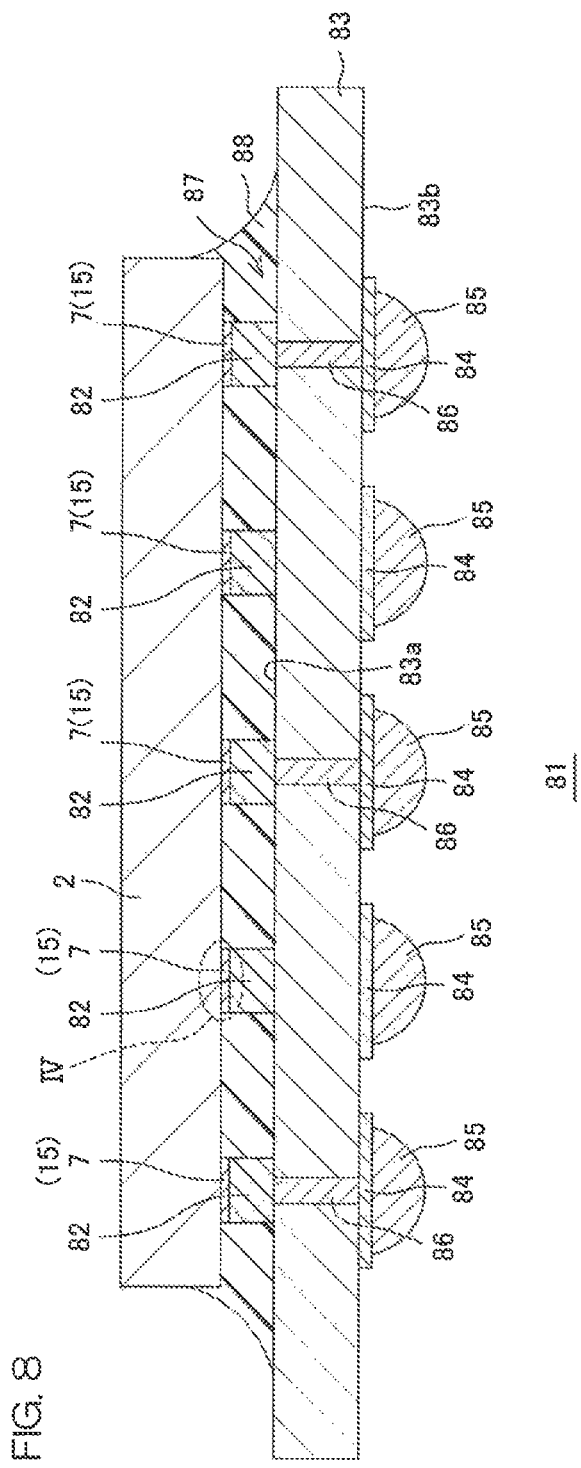
FIG. 8 is a sectional view of a semiconductor device according to a third preferred embodiment of the present invention.

FIG. 8 is a sectional view of a semiconductor device 81 according to a third preferred embodiment of the present invention. In FIG. 8, portions corresponding to respective portions shown in FIG. 2, etc., described above shall be provided with the same reference symbols and description thereof shall be omitted.

The semiconductor device 81 includes connection electrodes 82, connected respectively to the plurality of pads 7 (wirings 15) formed on the surface of the semiconductor chip 2, and a circuit board or wiring substrate 83, having a bonding surface 83a to which the semiconductor chip 2 (semiconductor substrate 12) is flip-chip bonded via the connection electrodes 82. The structure shown in FIG. 4, FIG. 5, or FIG. 7 may be applied to the pads 7. The connection electrodes 82 may be conductors of block shape or column shape or may be solders. A plurality of lands 84 and solder balls 85, electrically connected to the respective lands 84, are formed on a rear surface 83b positioned at the side of the wiring substrate 83 opposite the bonding surface 83a. Each land 84 and each solder ball 85 are electrically connected to the corresponding connection electrode 82 and pad 7 (wiring 15) via a via electrode 86 formed in the wiring substrate 83. A sealing resin 88 is formed in a gap 87 between the semiconductor chip 2 and the wiring substrate 83 so as to fill the gap 87.

As described above, with the present preferred embodiment, the semiconductor chip 2 is connected to the wiring substrate 83 via the connection electrodes 82. For example, in connecting the connection electrodes 82 to the wiring substrate 83, the semiconductor chip 2 (semiconductor substrate 12), etc., may be heated to a temperature of not less than 200° C. (for example, approximately 260° C.). The applied heat is transmitted to the wirings 15 via the semiconductor substrate 12 and the connection electrodes 82, etc. In this process, the barrier metal film 26 relaxes the stress from the wirings 15, and cracking of the passivation film 14 can thus be suppressed (see also FIG. 4, FIG. 5, FIG. 7, etc.).

Also with the present preferred embodiment, the semiconductor device 81 is mounted on a mounting board or substrate (not shown) via the solder balls 85 in contact with the lands 84. In the mounting process, the semiconductor device 81 is heated to melt the solder balls 85. Although the wirings 15 are also heated thereby, the barrier metal film 26 relaxes the stress from the wirings 15, and cracking of the passivation film 14 can thus be suppressed (see also FIG. 4, FIG. 5, etc.).

Fourth Preferred Embodiment

Figure 9:
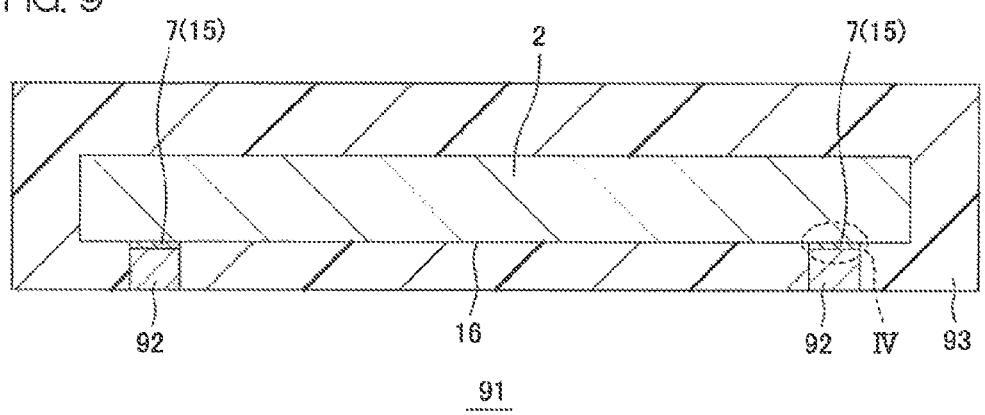
FIG. 9 is a sectional view of a semiconductor device according to a fourth preferred embodiment of the present invention.

FIG. 9 is a sectional view of a semiconductor device 91 according to a fourth preferred embodiment of the present invention. In FIG. 9, portions corresponding to respective portions shown in FIG. 2, etc., described above shall be provided with the same reference symbols and description thereof shall be omitted.

The semiconductor device 91 includes connection electrodes 92, connected respectively to the plurality of pads 7 (wirings 15) formed on the surface of the semiconductor chip 2, and a sealing resin 93, covering the element or device forming surface 16, the rear surface, and the side surfaces of the semiconductor chip 2 (semiconductor substrate 12) so as to expose the connection electrodes 92. The sealing resin 93 serves in common as the resin package 6. The structure shown in FIG. 4, FIG. 5, or FIG. 7 may be applied to the pads 7.

As described above, with the present preferred embodiment, the connection electrodes 92 are formed as external terminals arranged to achieve electrical connection with the exterior. In this case, the semiconductor device 91 is mounted on a mounting board or substrate (not shown) via solders in contact with the connection electrodes 92. In the mounting process, the semiconductor device 91 is heated to melt the solders. Although the wirings 15 are also heated thereby, the barrier metal film 26 relaxes the stress from the wirings 15 and cracking of the passivation film 14 can thus be suppressed (see also FIG. 4, FIG. 5, and FIG. 7, etc.).

Also for example, the rewirings 63, such as shown in FIG. 7, may be formed on the connection electrodes 92. In this case, the semiconductor device 91 is mounted on amounting board or substrate (not shown) via solders in contact with the electrode pads 64 (see FIG. 7). In the mounting process, the solders are melted by heating. The heat during mounting is transmitted to the wirings 15, for example via the rewirings 63, etc. Even in such a case, the concentration of stress from the wirings 15 is relaxed by the barrier metal film 26. Cracking of the passivation film 14 due to the heating during mounting can thereby be suppressed (see also FIG. 4, FIG. 5, and FIG. 7, etc.).

Fifth Preferred Embodiment

Figure 10:
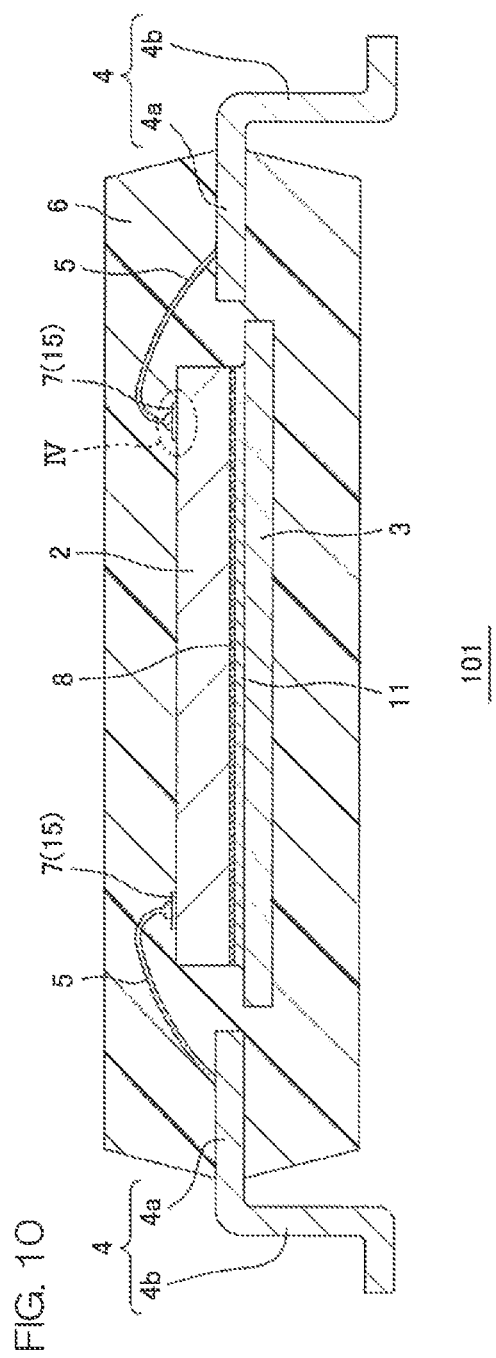
FIG. 10 is a sectional view of a semiconductor device according to a fifth preferred embodiment of the present invention.

FIG. 10 is a sectional view of a semiconductor device 101 according to a fifth preferred embodiment of the present invention. In FIG. 10, portions corresponding to respective portions shown in FIG. 2, etc., described above shall be provided with the same reference symbols and description thereof shall be omitted.

As shown in FIG. 10, the semiconductor device 101 is a semiconductor device to which an SOP (Small Outline Package), having the leads 4 led outside the resin package 6 (sealing resin), is applied. Similarly to the semiconductor device 1 described above, the semiconductor chip 2 is disposed on the die pad 3. Although with the present preferred embodiment, an example where the lower surface of the die pad 3 is not exposed from the resin package 6 is illustrated, the lower surface of the die pad 3 may instead be formed to be exposed from the resin package 6.

Each lead 4 includes an inner lead portion 4a sealed in the resin package 6 and an outer lead portion 4b formed integral to the inner lead portion 4a and led outside the resin package 6. The inner lead 4a is electrically connected to the corresponding pad 7 (wiring 15) of the semiconductor chip 2 via a bonding wire 5 inside the resin package 6. The outer lead portion 4b is formed to extend toward the lower surface of the resin package 6. The outer lead portion 4b is a mounting terminal connected to a mounting board or substrate. In regard to a vicinity of the pad 7 shown in the broken line circle IV, the structure shown in FIG. 4, FIG. 5, or FIG. 7 may be applied.

As described above, even with the structure of the present preferred embodiment, the same effects as the effects described above in regard to the first preferred embodiment can be exhibited. With the present preferred embodiment, the semiconductor device 101 to which the SOP is applied has been described. However, the semiconductor device 101 may be of a type other than the SOP as long as it has the leads 4 that are led outside the resin package 6 (sealing resin). That is, the semiconductor device 101 may be an SOJ (Small Outline J-leaded), a CFP (Ceramic Flat Package), an SOT (Small Outline Transistor), a QFP (Quad Flat Package), a DFP (Dual Flat Package), a PLCC (Plastic Leaded Chip Carrier), a DIP (Dual Inline Package), or an SIP (Single Inline Package), etc.

Sixth Preferred Embodiment

Figure 11:
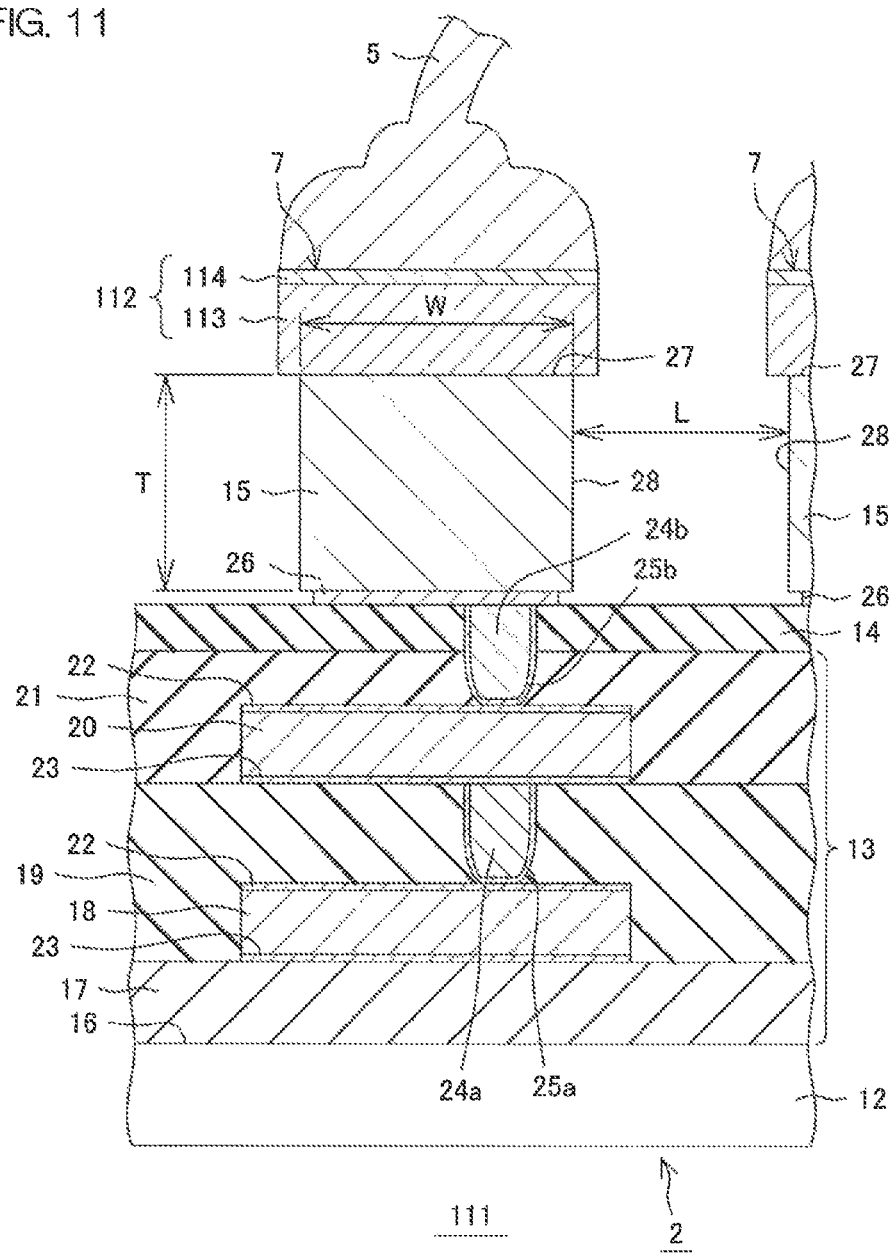
FIG. 11 is an enlarged sectional view of a semiconductor device, according to a sixth preferred embodiment of the present invention, showing a portion in which a wiring is formed.

FIG. 11 is an enlarged partial sectional view of a semiconductor device 111, according to a sixth preferred embodiment of the present invention, showing a portion in which a wiring 15 is formed. FIG. 11 corresponds to an enlarged view of the portion surrounded by the broken line circle IV of FIG. 3, FIG. 8, FIG. 9, and FIG. 10 described above. In FIG. 11, portions corresponding to respective portions shown in FIG. 4, etc., described above shall be provided with the same reference symbols and description thereof shall be omitted.

As shown in FIG. 11, in the present preferred embodiment, a metal film 112 is formed on each wiring 15. The metal film 112 includes a laminated film constituted of a plurality of metal films. In the present preferred embodiment, the metal film 112 includes a laminated film of a Ni (nickel) film 113 and a Pd (palladium) film 114. A width of the metal film 112 is greater than the width W of the wiring 15. In other words, the width W of the wiring 15 is less than the width of the metal film 112.

More specifically, the Ni film 113 of the metal film 112 has a flat surface and is formed on the wiring 15 so that both end portions or side portions are positioned further outward than the side surfaces 28 of the wiring 15 in sectional view. The Ni film 113 has a smaller thickness than the wiring 15. The Ni film 113 may be formed to be of uniform thickness. A thickness of the Ni film 113 may, for example, be not less than 2 μm and not more than 4 μm.

On the other hand, the Pd film 114 of the metal film 112 has a flat surface and is formed on the Ni film 113 so that both side portions are positioned further outward than the side surfaces 28 of the wiring 15 in sectional view. The Pd film 114 is formed on the Ni film 113 so as to conform to the Ni film 113. That is, end portions or side portions of the Pd film 114 are formed to be flush with the side portions of the Ni film 113. The Pd film 114 has a smaller thickness than the Ni film 113. The Pd film 114 may be formed to be of uniform thickness. A thickness of the Pd film 114 may, for example, be not less than 0.1 μm and not more than 0.5 μm.

A bonding wire 5 is connected to the metal film 112 (Pd film 114). That is, in the present preferred embodiment, each pad 7 is formed of the connection portion 40 of each wiring 15 and the metal film 112 (Ni film 113 and Pd film 114).

As described above, even with the arrangement of the present preferred embodiment, the same effects as the effects described above in regard to the first preferred embodiment can be exhibited.

FIG. 12A to FIG. 12G are diagrams for describing a portion of a manufacturing process of the wiring 15 of FIG. 11. In the following description, FIG. 11, which has been descried above, shall be referenced as necessary. Also in the following, a case where the wiring 15 is constituted of high purity copper shall be described as an example.

Figure 12A:
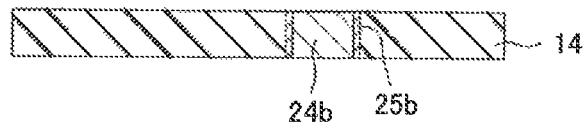
FIGS. 12A to 12G are diagrams for describing a manufacturing process of the wiring of FIG. 11.

First, as shown in FIG. 12A, prior to the forming of each wiring 15, the multilayer wiring structure 13 (see FIG. 11) is formed on the semiconductor substrate 12. Next, the passivation film 14 is formed on the multilayer wiring structure 13. Next, the second via 24b, which penetrates through the passivation film 14, is formed.

Figure 12B:
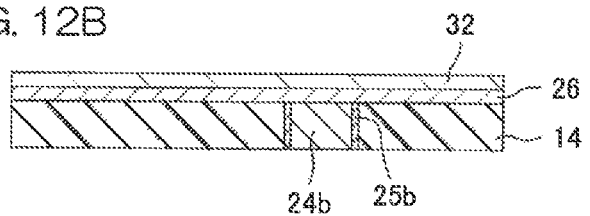
Figure 12C:
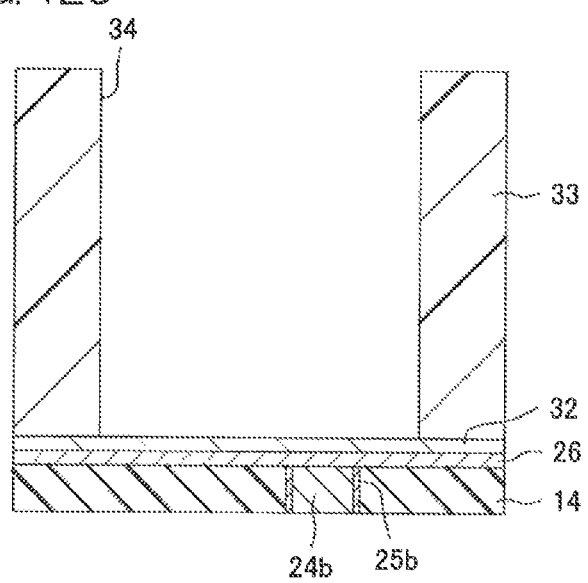

Next, as shown in FIG. 12B, the barrier metal film 26 and the copper seed film 32 are formed in that order on the front surface of the passivation film 14, for example, by a sputtering method. Next, as shown in FIG. 12C, the resist film 33, having an opening 34 in a region in which each wiring 15 is to be formed, is formed on the copper seed film 32.

Figure 12D:
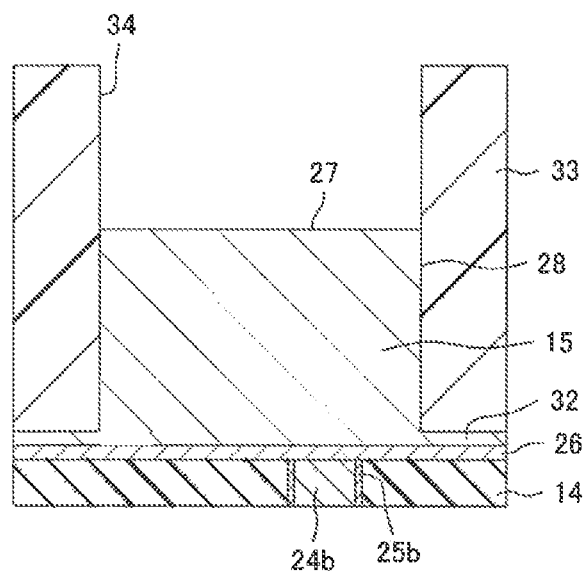

Next, as shown in FIG. 12D, copper is made to undergo plating growth by electroplating from the front surface of the copper seed film 32 exposed from the opening 34. Growing of (embedding with) copper is performed up to a middle portion of the opening 34. In this process, the copper that has been grown by plating is integral to the copper seed film 32. The wirings 15 are formed thereby.

Figure 12E:
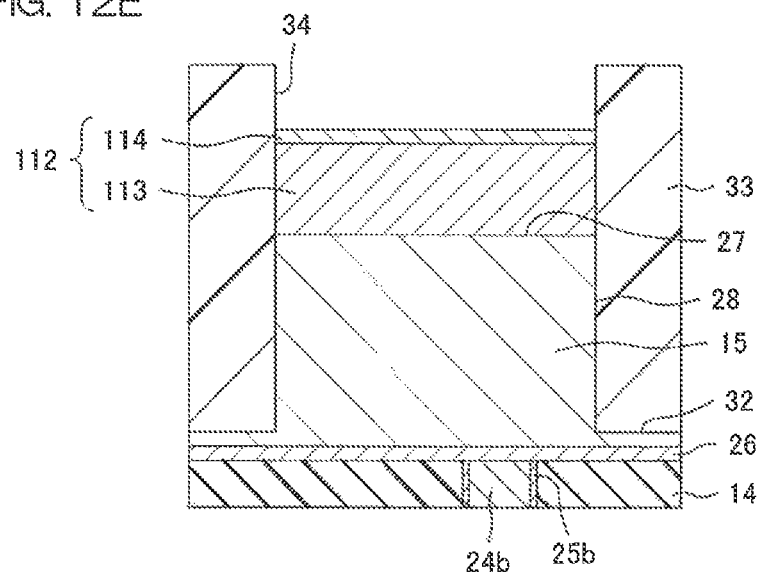
Figure 12F:
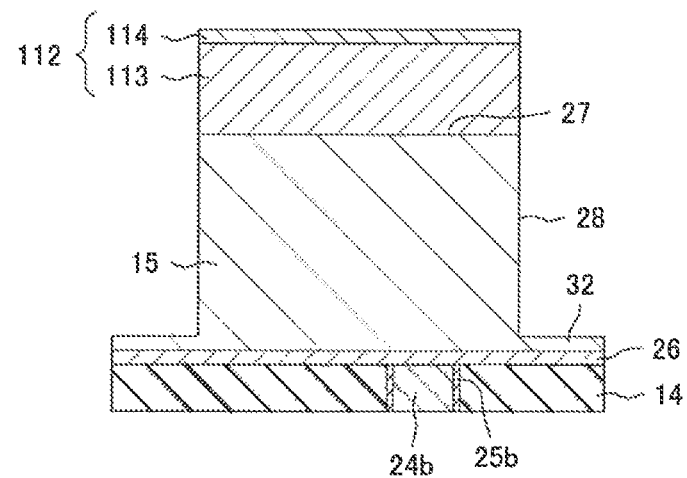

Next, as shown in FIG. 12E, the opening 34 of the resist film 33 is used to make Ni grow by electroplating from the upper surface 27 of each wiring 15. The Ni film 113 is thereby formed. Next, the opening 34 of the resist film 33 is used to make Pd grow by electroplating from the surface of the Ni film 113. In this process, the Pd film of thickness less than the thickness of the Ni film 113 is formed. The metal film 112 that includes the Ni film 113 and the Pd film 114 is thereby formed. Thereafter, the resist film 33 is removed as shown in FIG. 12F.

Figure 12G:
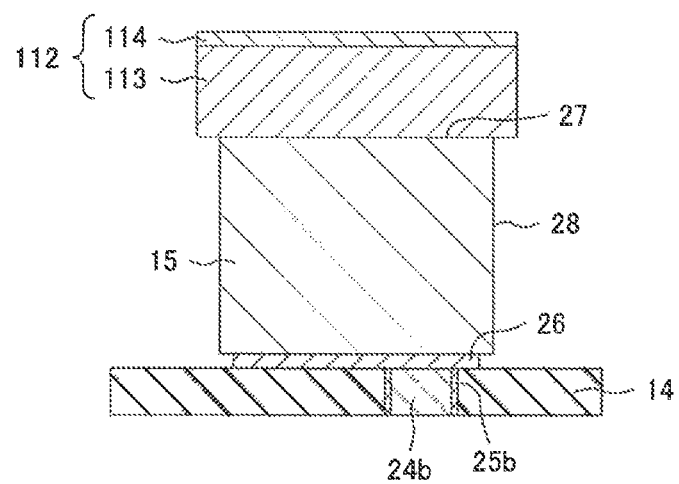

Next, as shown in FIG. 12G, the copper seed film 32 and the barrier metal film 26 are selectively removed, for example, by wet etching. In this process, the side surfaces 28 of the wiring 15 are etched together with the copper seed film 32 and the side surfaces 28 of the wiring 15 are formed so as to be positioned further inward than the side portions of the metal film 112. Steps are thereby formed between the side surfaces 28 of the wiring 15 and the side portions of the metal film 112. Also in this process, side portions of the barrier metal film 26 are etched (over-etched) further inward than the side surfaces 28 of each wiring 15 so that both side portions of the barrier metal film 26 are formed to be positioned further inward than the side surfaces 28 of the wiring 15. Steps are thereby formed between the side portions of the barrier metal film 26 and the side surfaces 28.

Thereafter, the semiconductor substrate 12 is heated to a temperature of not less than 200° C. (for example, 260° C.) to connect the bonding wires 5 (see FIG. 11) to the Pd films 114.

Although the first to sixth preferred embodiments according to one aspect of the present invention have been described above, the present invention may be implemented in yet other modes as described below.

For example, with each of the preferred embodiments described above, an example where the barrier metal film 26 contains one or a plurality of metal species selected from the group consisting of tantalum (Ta), tungsten (W), molybdenum (Mo), chromium (Cr), and ruthenium (Ru) has been described. However, these metal species are just an example of metal materials that meet the conditions of having a higher modulus of rigidity than the modulus of rigidity of copper (titanium), a lower thermal expansion coefficient than the thermal expansion coefficient of copper (titanium), and a lower electric resistivity than the electric resistivity of titanium, and are not intended to restrict the material of the barrier metal film 26. The barrier metal film 26 may thus contain any of various metal materials within a range in which the above conditions are met. For example, the metal material that meets the above conditions may be an alloy containing one or a plurality of metal species selected from the group consisting of tantalum (Ta), tungsten (W), molybdenum (Mo), chromium (Cr), and ruthenium (Ru).

Also, with the first preferred embodiment, an example where the laminated film of the Ni film 29, the Pd film 30, and the Au film 31 that covers each wiring 15 is formed has been described. However, as shown in FIG. 13, the bonding wires 5 may be connected directly to the wirings 15 without forming the laminated film of the Ni film 29, the Pd film 30, and the Au film 31.

Also, with the sixth preferred embodiment, an example where the metal film 112 that includes the laminated film of the Ni film 113 and the Pd film 114 is formed has been described. In this arrangement, the metal film 112 may include an Au (gold) film formed on the Pd film 114. Further, the metal film 112 may be a metal film that contains one or a plurality of metal species selected from the group consisting of Ni, Pd, and Au.

Also, with each of the first preferred embodiment, the second preferred embodiment, the fifth preferred embodiment, and the sixth preferred embodiment, an example where the semiconductor device 1, 61, 101, or 111 includes the bonding wires 5 has been described. However, the semiconductor device 1, 61, 101, or 111 may include connection members having a comparatively large current passing cross-sectional area, such as conductor plates, etc., in place of or in addition to the bonding wires 5.

Seventh Preferred Embodiment

Figure 14:
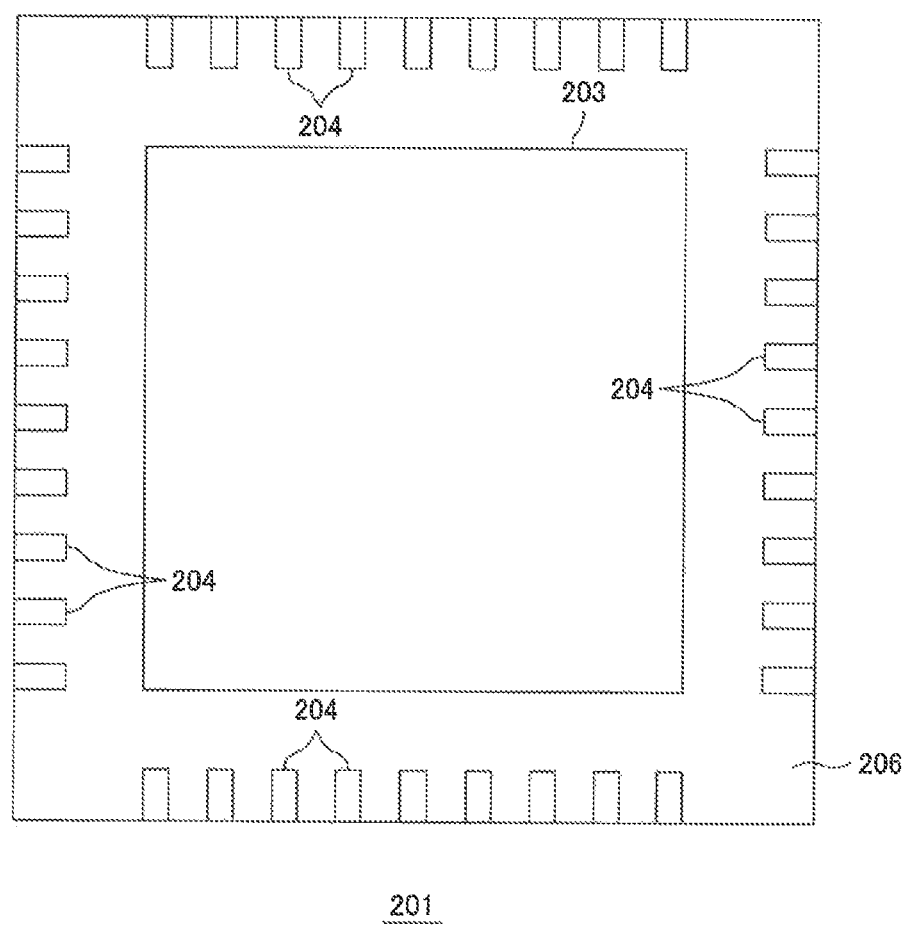
FIG. 14 is a bottom view of a semiconductor device according to a seventh preferred embodiment of the present invention.
Figure 15:
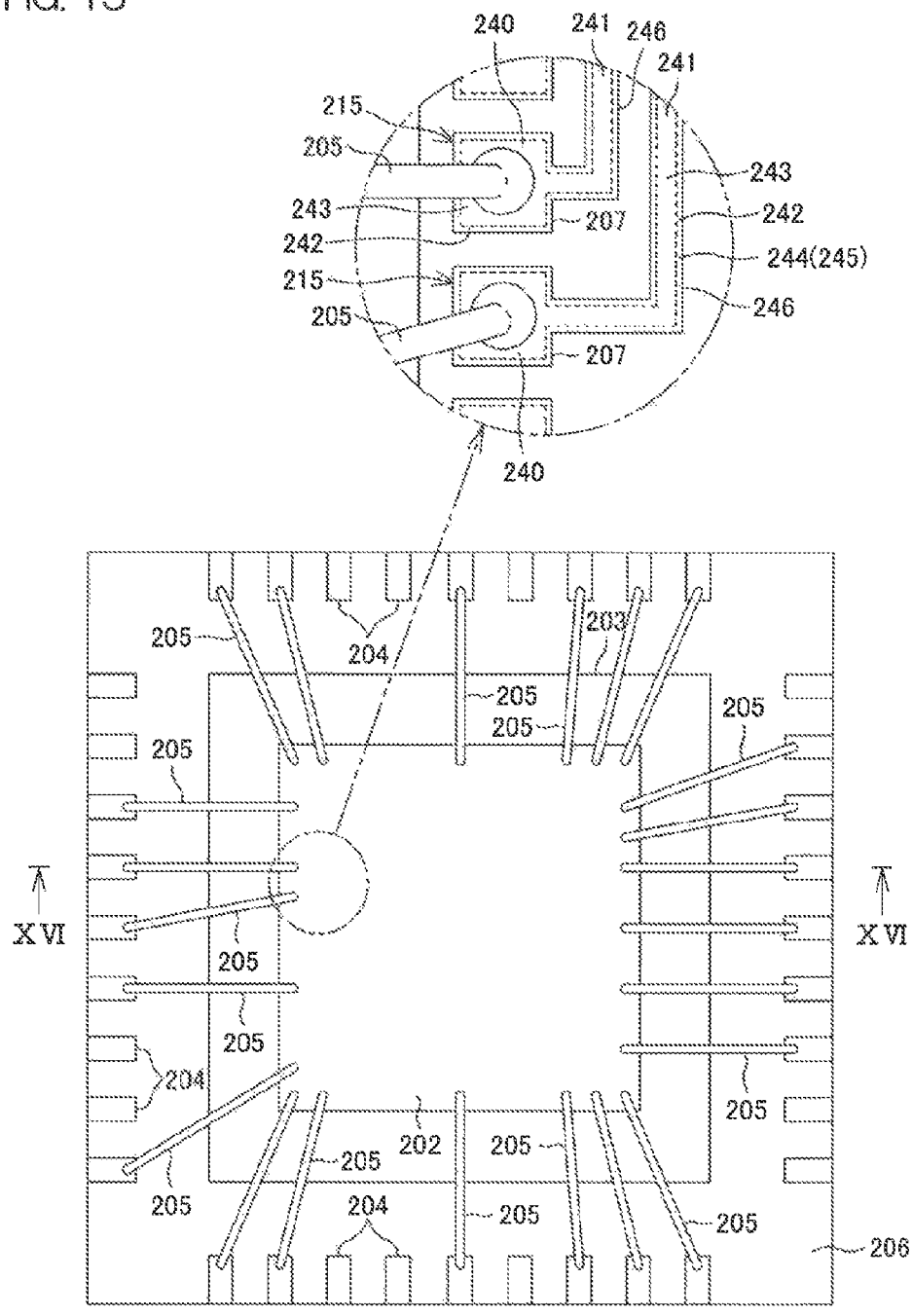
FIG. 15 is a plan view of an internal structure of the semiconductor device of FIG. 14.
Figure 16:
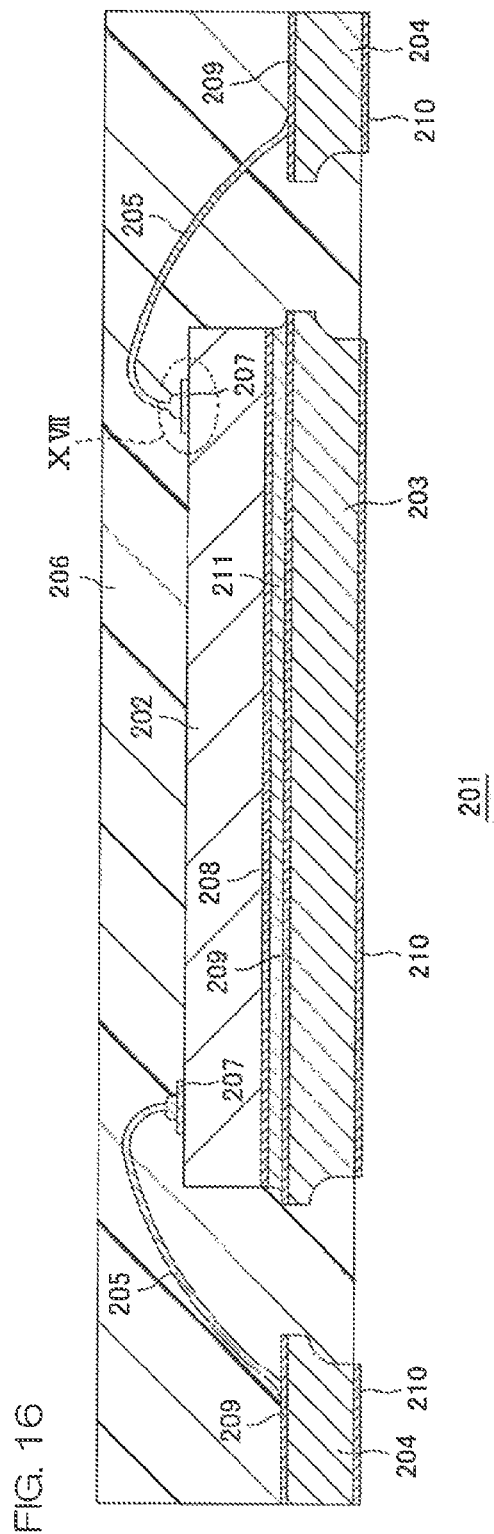
FIG. 16 is a sectional view taken along section line XVI-XVI of FIG. 15.

FIG. 14 is a bottom view of a semiconductor device 201 according to a seventh preferred embodiment of the present invention. FIG. 15 is a plan view of an internal structure of the semiconductor device 201 of FIG. 14. FIG. 16 is a sectional view taken along section line XVI-XVI of FIG. 15.

The semiconductor device 201 is a semiconductor device to which a QFN (Quad Flat Non-leaded Package) is applied. The semiconductor device 201 includes a semiconductor chip 202, a die pad 203, leads 204, bonding wires 205, and a resin package 206 that seals these components. An outer shape of the resin package 206, that is, an outer shape of the semiconductor device 201 is a flat, rectangular parallelepiped shape.

A plurality of pads 207 are disposed on a front surface of the semiconductor chip 202. Each pad 207 is formed, for example, at a peripheral edge portion of the semiconductor chip 202. Each pad 207 is electrically connected, for example, to a semiconductor element or device in the chip 202. A rear metal 208, constituted of a metal layer of gold (Au), nickel (Ni), silver (Ag), etc., is formed on a rear surface of the semiconductor chip 202.

The die pad 203 and the leads 204 are formed by punching out a metal thin plate (for example, a copper thin plate). Plating layers 209, constituted of silver, are formed on front surfaces of the die pad 203 and the leads 204. The die pad 203 has a square shape in plan view and the semiconductor chip 202 is disposed at a central portion thereof. Across an entire periphery of a peripheral edge portion of a rear surface of the die pad 203, a recess of substantially ¼ elliptical cross-sectional shape is formed by coining from the rear surface side. A sealing resin that constitutes the resin package 206 enters into the recess.

A peripheral edge portion of the die pad 203 is sandwiched from above and below by the sealing resin (resin package 206), and the die pad 203 is prevented from falling-off from (is retained in) the resin package 206. With the exception of the portion recessed in the substantially ¼ elliptical cross-sectional shape, the rear surface of the die pad 203 is exposed from a rear surface of the resin package 206. A plating layer 210, constituted of solder, is formed on a portion of the rear surface of the die pad 203 that is exposed from the resin package 206.

An equal number (for example, nine) of the leads 204 are provided at each of positions facing respective side surfaces of the die pad 203. At each of the positions facing the side surfaces of the die pad 203, the leads 204 extend in directions orthogonal to the facing side surface and are disposed at equal intervals in a direction parallel to the side surface. At an end portion at the die pad 203 side of a rear surface of each lead 204, a recess of substantially ¼ elliptical cross-sectional shape is formed by coining from the rear surface side. The sealing resin that constitutes the resin package 206 enters into the recess.

An end portion at the die pad 203 side of each lead 204 is sandwiched from above and below by the sealing resin (resin package 206), and the lead 204 is prevented from falling-off from (is retained in) the resin package 206. With the exception of the portion recessed in the substantially ¼ elliptical cross-sectional shape, the rear surface of the lead 204 is exposed from the rear surface of the resin package 206. Also, a side surface of the lead 204 at the side opposite the die pad 203 side is exposed from a side surface of the resin package 206. A plating layer 210, constituted of solder, is formed on a portion of the rear surface of each lead 204 that is exposed from the resin package 206.

In the present preferred embodiment, the semiconductor chip 202, in a state where the front surface, at which the pads 207 are disposed, is faced upward, has its rear surface bonded via a bonding material 211 to the front surface (plating layer 209) of the die pad 203. The bonding material 211 is, for example, solder paste. If electrical connection of the semiconductor chip 202 and the die pad 203 is unnecessary, the rear metal 208 may be omitted and the rear surface of the semiconductor chip 202 may be bonded to the front surface of the die pad 203 via a bonding material, constituted of an insulating paste, etc. In this case, the plating layer 209 above the front surface of the die pad 203 may be omitted.

Each bonding wire 205 has one end bonded to a pad 207 of the semiconductor chip 202 and another end bonded to a front surface of a lead 204. The bonding wire 205 includes a copper wire or a gold wire, for example.

Figure 17:
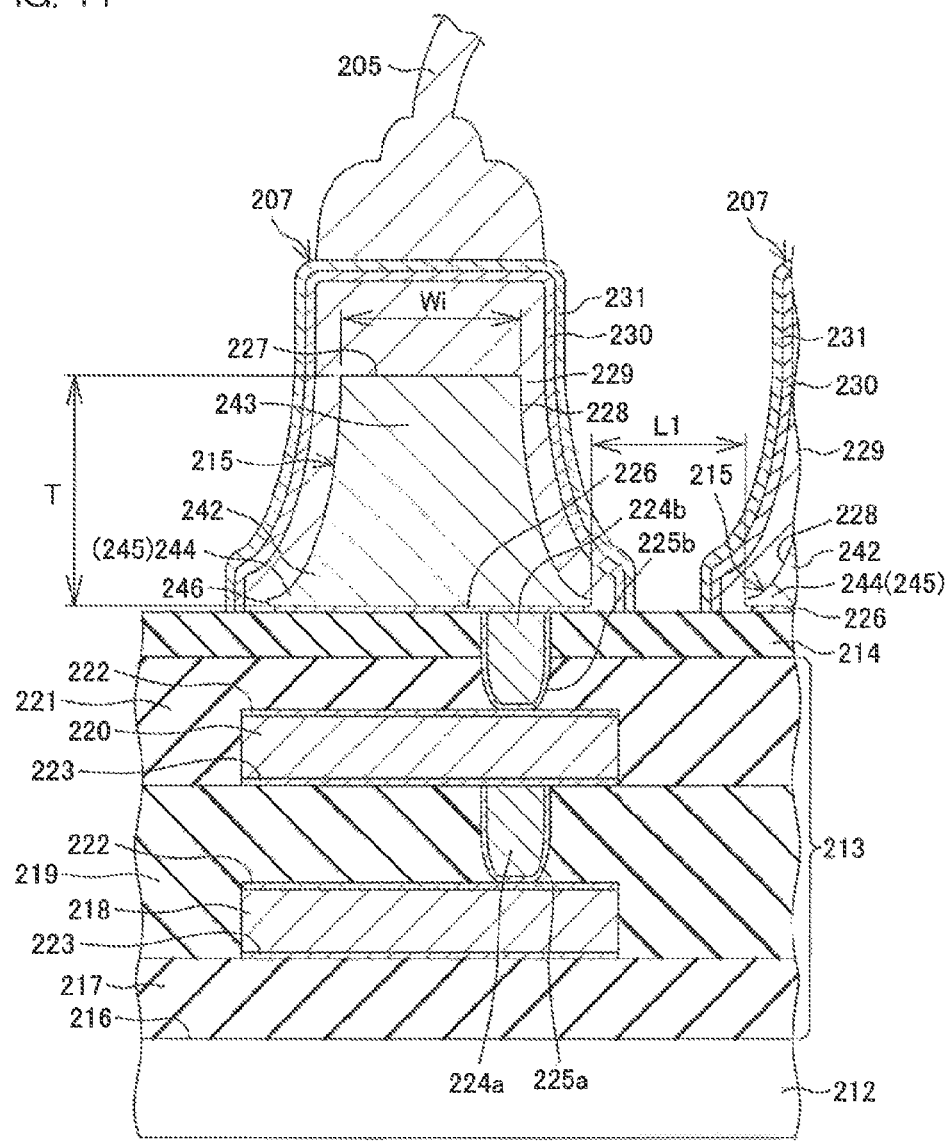
FIG. 17 is an enlarged sectional view of the portion surrounded by a broken line circle XVII of FIG. 16 and is a diagram of an example of a wiring.

FIG. 17 is an enlarged sectional view of a portion of FIG. 16 surrounded by a broken line circle XVII and is a diagram of an example of wirings 215.

The semiconductor chip 202 includes a semiconductor substrate 212, a multilayer wiring structure 213, a passivation film 214 as an example of an insulating film, and the wirings 215. The semiconductor substrate 212 is constituted, for example, of a silicon substrate having an element or device forming surface 216, on which a semiconductor element or device (a diode, transistor, resistor, capacitor, etc.) is formed.

The multilayer wiring structure 213 has a plurality of wiring layers that are laminated successively from the element forming surface 216 of the semiconductor substrate 212 via interlayer insulating films. In the present preferred embodiment, the multilayer wiring structure 213 has a first metal layer 218 laminated on the element forming surface 216 of the semiconductor substrate 212 via a first interlayer insulating film 217, a second metal layer 220 laminated on the first metal layer 218 via a second interlayer insulating film 219, and a third interlayer insulating film 221 covering the second metal layer 220. Each of the first interlayer insulating film 217, the second interlayer insulating film 219, and the third interlayer insulating film 221 contains, for example, an insulating material, such as silicon oxide ($SiO_2$), silicon nitride (SiN), etc. Each of the first metal layer 218 and the second metal layer 220 contains aluminum.

An upper surface barrier film 222 and a lower surface barrier film 223 are formed on upper and lower surfaces of the first metal layer 218 respectively to prevent diffusion of impurities into the first interlayer insulating film 217 and the second interlayer insulating film 219. Similarly, an upper surface barrier film 222 and a lower surface barrier film 223 are formed on upper and lower surfaces of the second metal layer 220 respectively to prevent diffusion of impurities into the second interlayer insulating film 219 and the third interlayer insulating film 221. Each of the upper surface barrier films 222 formed on the respective upper surfaces of the first metal layer 218 and the second metal layer 220 may contain, for example, titanium nitride. On the other hand, each of the lower surface barrier films 223 formed on the respective lower surfaces of the first metal layer 218 and the second metal layer 220 may have, for example, a two-layer structure in which titanium nitride and titanium are laminated successively from the corresponding lower surface of the first metal layer 218 or the second metal layer 220.

The passivation film 214 is formed on the multilayer wiring structure 213 so as to cover the multilayer wiring structure 213. More specifically, the passivation film 214 is formed on the third interlayer insulating film 221. The passivation film 214 may, for example, be silicon oxide, BPSG (Boron Phosphorus Silicon Glass), or silicon nitride. The passivation film 214 may have a laminated structure in which silicon nitride and silicon oxide are laminated successively from the front surface of the third interlayer insulating film 221.

A first via 224a, penetrating through the second interlayer insulating film 219, is connected to the upper surface of the first metal layer 218. The first via 224a penetrates through the second interlayer insulating film 219 and is connected to the lower surface of the second metal layer 220. The first via 224a contains tungsten. A first barrier film 225a, containing, for example, titanium nitride, is interposed between the first via 224a and the second interlayer insulating film 219.

On the other hand, a second via 224b, penetrating through the third interlayer insulating film 221 and the passivation film 214, is connected to the upper surface of the second metal layer 220. The second via 224b is exposed from the front surface of the passivation film 214. The second via 224b is formed to be flush with the front surface of the passivation film 214. The second via 224b contains tungsten. A second barrier film 225b, containing, for example, titanium nitride, is interposed between the second via 224b and the third interlayer insulating film 221 and between the second via 224b and the passivation film 214.

With reference to the enlarged view in FIG. 15 and to FIG. 17, a plurality of the wirings 215 are formed at intervals from each other above the passivation film 214. Each wiring 215 is disposed so as to cover a second via 224b exposed from the surface of the passivation film 214. Each wiring 215 integrally has a connection portion 420 electrically connected to a bonding wire 205 and a lead-out portion 241 selectively led out from the connection portion 240. In the present preferred embodiment, the connection portion 240 is formed to a substantially rectangular shape in plan view as a portion of a pad 207 (see FIG. 16) described above. With the respective wirings 215, mutually adjacent lead-out portions 241 may be formed to extend substantially in parallel to each other across predetermined intervals.

Each wiring 215 has an edge portion 242 and an inner portion 243 positioned further to an inner side than the edge portion 242. In the enlarged view of FIG. 15, each boundary between an edge portion 242 and an inner portion 243 is indicated by broken lines. The inner portion 243 of each wiring 215 has a flat upper surface 227 extending along the surface of the passivation film 214. The upper surface 227 is also the upper surface 227 of each wiring 215. A width Wi of the inner portion 243 of each wiring 215 is, for example, not less than 7 μm and not more than 20 μm. Also, a thickness T of the inner portion 243 is, for example, not less than 7 μm and not more than 20 μm. Within these numerical value ranges, an aspect ratio $R_{243}$ (=thickness T/width Wi) of the inner portion 243 of each wiring 215 may be such that $0<R_{243}\leq 1$. An aspect ratio $R_{215}$ of the entire wiring 215 including the edge portion 242 is such that $0<R_{215}<1$ and is smaller than the aspect ratio $R_{243}$.

A thin film portion 244 of smaller thickness than the inner portion 243 is formed at the edge portion 242 of each wiring 215. Between a plurality of wirings 215 that are mutually adjacent, the thin film portions 244 of the wirings 215 are preferably formed at least at portions of the edge portions 242 at which the plurality of the wirings 215 face each other. More specifically, between a plurality of wirings 215 that are mutually adjacent, the thin film portions 244 of the wirings 215 are preferably formed at least at portions of the edge portions 242 at which the plurality of the wirings 215 face each other across an inter-wiring distance L1 of not more than 20 μm. In the present preferred embodiment, the thin film portion 244 is formed across the entirety of the edge portion 242 of each wiring 215.

Referring to FIG. 17, in the present preferred embodiment, the thin film portion 244 of each wiring 215 includes an inclining portion 245 that gradually decreases in thickness in a direction away from the inner portion 243. Each wiring 215 has, in a section plane intersecting a direction in which the wiring 215 extends, a cross-sectional shape that is a convergent shape (tapered shape, substantially trapezoidal shape) that becomes narrow in width in a direction away from the semiconductor substrate 212. In the present preferred embodiment, the inclining portion 245 has front surfaces that curve concavely toward the inner portion 243 side. Each front surface of the inclining portion 245 is a side surface 228 of the wiring 215, and end portions or side portions 246 of the inclining portion 245 are end portions or side portions 246 of the wiring 215. The side portions 246 of the wiring 215 are formed to be extremely thin in comparison to other portions.

Each wiring 215 may contain a metal having copper as a main component. A metal having copper as the main component refers to a metal with which a mass percentage (mass %) of copper is the highest with respect to other components (the same applies hereinafter). For example, if the wiring 215 may be constituted of an aluminum-copper (Al—Cu) alloy or an aluminum-silicon-copper (Al—Si—Cu) alloy, etc., a mass percentage $R_{Cu}$ of copper is higher than a mass percentage $R_{Al}$ of aluminum and a mass percentage $R_{Si}$ of silicon ($R_{Cu}>R_{Al}$, $R_{Cu}>R_{Si}$). A metal having copper as the main component may contain a minute amount of impurity. A metal having copper as the main component may includes high purity copper of not less than 99.9999% (6N) purity, high purity copper of not less than 99.99% (4N) purity, etc.

If the wiring 215 contains a metal having copper as the main component, the passivation film 214 preferably contains one or a plurality of insulating materials selected from the group consisting of silicon oxide, BPSG, and silicon nitride.

On the other hand, the wiring 215 may contain a metal having aluminum as a main component. A metal having aluminum as the main component refers to a metal with which a mass percentage (mass %) of aluminum is the highest with respect to other components (the same applies hereinafter). For example, if the wiring 215 is constituted of an aluminum-copper (Al—Cu) alloy, an aluminum-silicon (Al—Si) alloy, or an aluminum-silicon-copper (Al—Si—Cu) alloy, etc., the mass percentage $R_{Al}$ of aluminum is higher than the mass percentage $R_{Cu}$ of copper and the mass percentage $R_{Si}$ of silicon ($R_{Al}>R_{Cu}$, $R_{Al}>R_{Si}$). A metal having aluminum as the main component may contain a minute amount of impurity. A metal having aluminum as the main component may include high purity aluminum of not less than 99.9999% (6N) purity, high purity aluminum of not less than 99.99% (4N) purity, etc.

If the wiring 215 contains a metal having aluminum as the main component, the passivation film 214 preferably includes an oxide film of $SiO_2$ or BPSG, etc. The passivation film 214 preferably contains at least one of silicon oxide and BPSG.

A barrier metal film 226 and a copper seed film (not shown) are disposed interposingly between each wiring 215 and the passivation film 214. That is, each wiring 215 is electrically connected to a second via 224b via the copper seed film (not shown) and the barrier metal film 226. The barrier metal film 226 is formed on the passivation film 214 and the copper seed film (not shown) is formed on the barrier metal film 226. In the present preferred embodiment, the copper seed film (not shown) is made integral to each wiring 215. The barrier metal film 226 is formed so that, in sectional view, both side portions thereof are positioned further inward than the end portions 246 of the wiring 215.

Each side portion of the barrier metal film 226 is positioned, for example, in a region between an side portion 246 of a wiring 215 and the inner portion 243 of the wiring 215 in plan view. A width of the barrier metal film 226 is, for example, greater than the width Wi of the inner portion 243 of the wiring 215 and smaller than a width of the entire wiring 215 including the edge portion 242. The barrier metal film 226 has a thickness smaller than the thickness of the wiring 215. The thickness of the barrier metal film 226 may, for example, be not less than 0.1 μm and not more than 0.3 μm. The barrier metal film 226 may include a titanium film or may include a laminated film of a titanium nitride film and a titanium film laminated successively from the front surface of the passivation film 214.

Also, the barrier metal film 226 may include, in addition to or in place of a titanium film, a metal film constituted of a metal material having a higher modulus of rigidity than copper or a lower thermal expansion coefficient than copper. The metal film contains, for example, one or a plurality of metal species selected from the group consisting of tantalum, tungsten, molybdenum, chromium, and ruthenium. All of these metal species have a higher modulus of rigidity than copper and a lower thermal expansion coefficient than copper. Further, these metal species have an electric resistivity less than the electric resistivity of titanium.

If a laminated structure of a titanium film and a metal film is provided, the metal film may be formed on the titanium film. In this case, a film thickness of the titanium film may, for example, be not less than 0.1 μm and not more than 0.3 μm, and a film thickness of the metal film may, for example, be not less than 0.1 μm and not more than 0.3 μm. In this arrangement, the passivation film 214 may be a nitride film and the metal film may be a tungsten film. If the passivation film 214 is a nitride film, a titanium film can be formed on the passivation film 214 while maintaining satisfactory adhesion. Also, a tungsten film can be formed on the titanium film while maintaining satisfactory adhesion.

A laminated film of a Ni (nickel) film 229, a Pd (palladium) film 230, and an Au (gold) film 231 are formed on surfaces of each wiring 215. The Ni film 229 is formed along the upper surface 227 and the side surfaces 228 of each wiring 215 to cover each wiring 215. In the present preferred embodiment, a portion of the Ni film 229 formed on the upper surface 227 of each wiring 215 is formed to be thicker than other portions. The Ni film 229 may have a uniform thickness instead. The thickness of the Ni film 229 may, for example, be not less than 2 μm and not more than 4 μm.

The Pd film 230 covers an entirety of the Ni film 229 with a uniform thickness (for example, of not less than 0.1 μm and not more than 0.5 μm). The Au film 231 covers an entirety of the Pd film 230 with, for example, a uniform thickness (for example, of not less than 0 μm and not more than 0.05 μm) thinner than the Pd film 230. The laminated film of the Ni film 229, the Pd film 230, and the Au film 231 functions as a protective film that protects the wiring 215. The bonding wire 205 is connected to the Au film 231. That is, in the present preferred embodiment, each pad 207 is formed of the connection portion 240 of each wiring 215, the Ni film 229, the Pd film 230, and the Au film 231.

FIG. 18A to FIG. 18H are diagrams for describing a portion of a manufacturing process of the wiring 215 of FIG. 17. In the following description, FIG. 17 shall be referenced as necessary. Also in the following, a case where the wiring 215 is constituted of high purity copper shall be described as an example.

First, prior to the forming of each wiring 215, the multilayer wiring structure 213 (see FIG. 17) is formed above the semiconductor substrate 212. Next, the passivation film 214 is formed on the multilayer wiring structure 213. Next, the second via 224b (see FIG. 17), which penetrates through the passivation film 214, is formed.

Figure 18A:
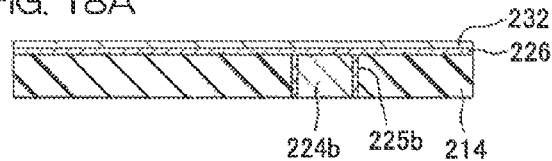
FIGS. 18A to 18H are diagrams for describing a manufacturing process of the wiring of FIG. 17.
Figure 18B:
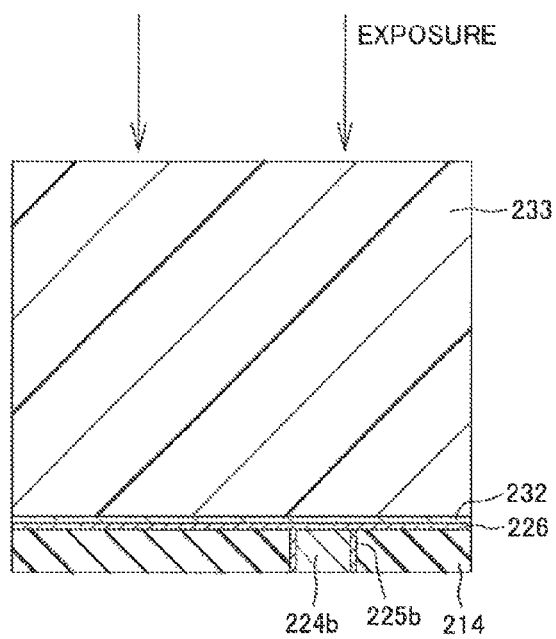
Figure 18C:
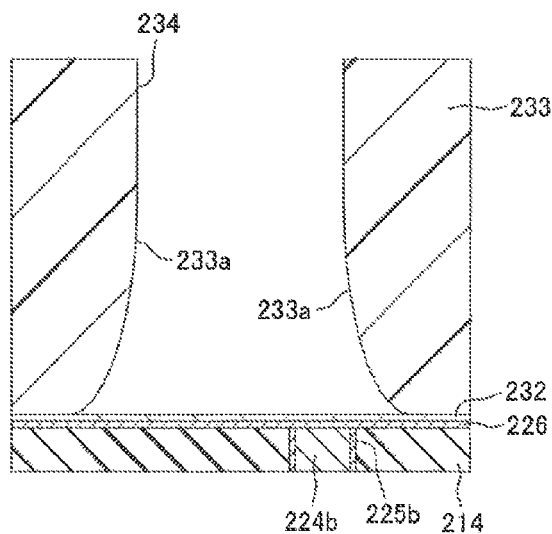

Next, as shown in FIG. 18A, the barrier metal film 226 and a copper seed film 232 are formed in that order on the surface of the passivation film 214, for example, by a sputtering method. Next, as shown in FIG. 18B, a cover film 233 is formed on the copper seed film 232. The cover film 233 is, for example, a photosensitive resin, such as a polyimide resin, etc. Next, as shown in FIG. 18C, the cover film 233 is selectively exposed/developed to form, in the cover film 233, an opening 234 in a region in which each wiring 215 is to be formed.

During the exposure of the cover film 233, a photoreaction rate of the cover film 233 decreases with distance away from a light source. Therefore, in the cover film 233, a portion that reacts spreads gradually as the copper seed film 232 is approached. Consequently, the opening 234 having an inversely tapered shape in sectional view is formed by the exposure/development. That is, the cover film 233 is formed (exposed/developed) to have inclining surfaces 233a that define the opening 234 so that an opening width of the opening 234 widens gradually along a direction toward the passivation film 214. In this process, each inclining surface 233a is formed to a curved shape that curves convexly toward the opening 234.

Figure 18D:
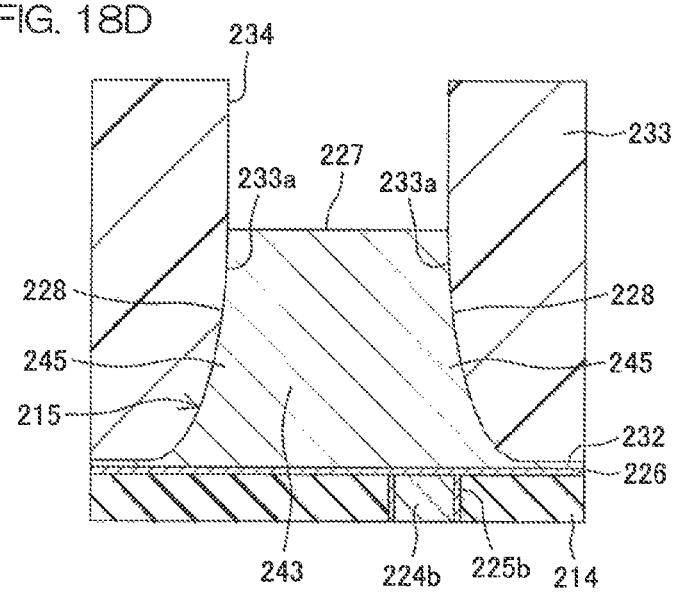

Next, as shown in FIG. 18D, copper is made to undergo plating growth by electroplating from the surface of the copper seed film 232 exposed from the opening 234. Growing of (embedding with) copper is performed up to a middle portion of the opening 234. In this process, the copper that has been grown by plating is integral to the copper seed film 232. The wirings 215, each including the inner portion 243 exposed from the opening 234 and the inclining portion 245 having the concavely curving front surfaces (side surfaces 228) conforming to the inclining surfaces 233a of the cover film 233, are formed thereby.

Figure 18E:
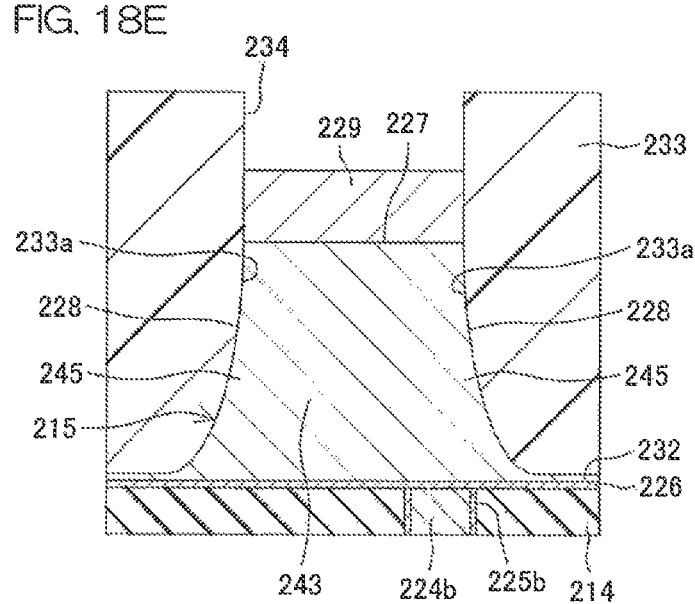
Figure 18F:
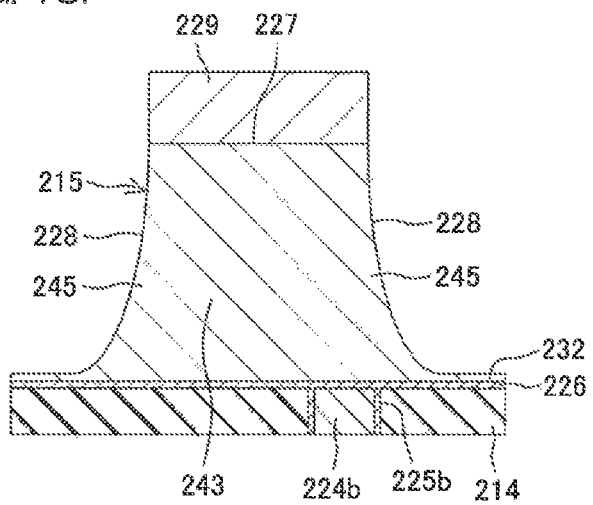
Figure 18G:
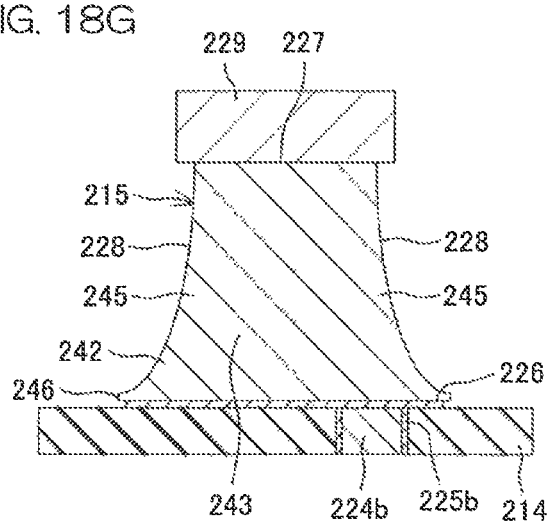

Next, as shown in FIG. 18E, the opening 234 of the cover film 233 is used to make Ni grow by electroless plating from the upper surface 227 of each wiring 215. A portion of the Ni film 229 is thereby formed. Thereafter, the cover film 233 is removed as shown in FIG. 18F. Next, as shown in FIG. 18G, the copper seed film 232 and the barrier metal film 226 are selectively removed, for example, by wet etching.

In this process, end portions or side portions of the barrier metal film 226 are etched (over-etched) further inward than end portions or side portions 246 of each wiring 215 so that the side portions of the barrier metal film 226 are formed to be positioned further inward than the side portions 246 of the wiring 215. Steps are thereby formed between the side portions of the barrier metal film 226 and the side portions 246 of the wiring 215. In this process, the side surfaces 228 of the wiring 215 are partially etched together with the copper seed film 232 so that the side surfaces 228 of the wiring 215 are formed to be positioned further inward than side portions of the Ni film 229.

Figure 18H:
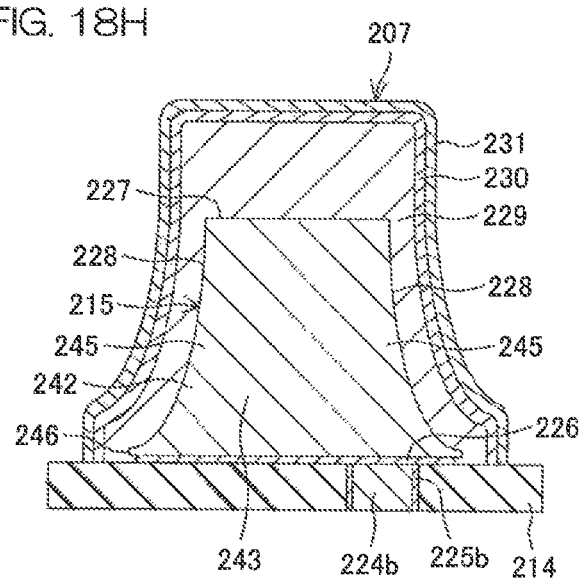

Next, as shown in FIG. 18H, plating growths of Ni, Pd, and Au are performed in that order by electroless plating from the side surfaces 228 of the wiring 215 and the Ni film 229. The laminated film of the Ni film 229, the Pd film 230, and the Au film 231 is thereby formed. Thereafter, the semiconductor substrate 212 is heated to a temperature of not less than 200° C. (for example, 260° C.) to connect the bonding wires 205 (see FIG. 17 as well) to the wirings 215 (Au films 231).

A semiconductor device, with which the wirings 215 of uniform thickness that do not have the thin film portions 244 are formed on the passivation film 214 shall now be considered as a reference example. When, in this semiconductor device, the semiconductor substrate 212, etc., are heated, the wirings 215 and the passivation film 214 expand respectively due to the applied heat. Each wiring 215 has a higher thermal expansion coefficient than the passivation film 214 and causes stress to be generated in a direction along the front surface of the passivation film 214 by the thermal expansion. Due to this stress, a crack (fissure) may form in the passivation film 214.

A crack in the passivation film 214 tends to form readily at a periphery of an edge portion of a wiring 215 at which the stress from the wiring 215 concentrates. Also, as the wiring 215 is thickened, the stress due to thermal expansion increases and the risk of crack formation thus increases. Although such crack formation may be avoided by thinning of the wiring 215, in this case, there is a trade-off that the wiring 215 increases in resistance value.

Also, if a plurality of the wirings 215 are formed at intervals from each other above the passivation film 214, the passivation film 214 positioned between a plurality of wirings 215 that are mutually adjacent receives stress from both wirings. Therefore, the risk of crack formation in the passivation film 214 positioned between a plurality of wirings 215 is higher than that at other portions. Further, cracking of the passivation film 214 caused by thermal expansion of a wiring 215 occurs especially readily if the wiring 215 is formed as an uppermost layer wiring and the side surfaces 228 thereof are not supported by a protective film, etc.

On the other hand, with the present preferred embodiment, the edge portion 242 of each wiring 215 that is positioned at a portion of the passivation film 214 at which a crack forms readily includes the thin film portion 244. More specifically, the thin film portion 244 includes the inclining portion 245 having the surfaces (side surfaces 228) that curve concavely toward the inner portion 243 side of the wiring 215. The side portions 246 of the inclining portion 245 (that is, the side portions 246 of the wiring 215) are formed to be extremely small in comparison to other portions. The stress caused by thermal expansion at the edge portion 242 of the wiring 215 is thereby lessened to enable the stress in the direction along the surface of the passivation film 214 to be reduced and formation of a crack in the passivation film 214 at the periphery of the edge portion 242 of the wiring 215 can thus be suppressed. In particular, with the present preferred embodiment, the inclining portion 245 (thin film portion 244) is formed across the entirety of the wiring 215 and the stress in the direction along the front surface of the passivation film 214 can thus be reduced effectively by the entire wiring 215. Crack formation can thereby be suppressed effectively across a wide range of the passivation film 214. Also, while crack formation can be suppressed by the thin film portion 244, the inner portion 243 can be thickened to suppress the resistance of the wiring 215 from becoming high.

For example, between a plurality of wirings 215 that are mutually adjacent, the inclining portion 245 (thin film portion 244) may be formed at least at a portion of the edge portion 242 at which the plurality of the wirings 215 face each other. The risk of crack formation in the passivation film 214 between the plurality of wirings 215 that are mutually adjacent can thereby be reduced. In particular, by providing the arrangement where the thin film portion 244 is disposed restrictively at a portion of the edge portion 242 of the wiring 215 at which the inter-wiring distance L1 is short (for example, a portion at which the inter-wiring distance L1 is not more than 20 μm), a cross-sectional area of the wiring 215 can be made large at other portions to enable suppression of increase of the resistance of the wiring 215.

Also, with the present preferred embodiment, the wirings 215 contain a metal having copper as the main component or a metal having aluminum as the main component. Although there is a difference in thermal expansion coefficient between the metal having copper as the main component or the metal having aluminum as the main component and the passivation film 214, cracking can be suppressed by the inclining portions 245 (thin film portions 244) of the wirings 215, and the wirings 215 can thus be formed satisfactorily on the passivation film 214. In particular, with the metal having copper as the main component, the wirings 215 can be made low in resistance.

Also with the present preferred embodiment, in connecting the bonding wires 205 to the wirings 215, the semiconductor substrate 212, etc., is heated to a temperature of not less than 200° C. (for example, approximately 260° C.). The applied heat causes thermal expansions of the wirings 215 upon being transmitted thereto directly or via the semiconductor substrate 212, etc. In this process, the thin film portion 244 of each wiring 215 relaxes the concentration of stress at the edge portion 242 of the wiring 215 and crack formation in the passivation film 214 can thus be suppressed.

Figure 19:
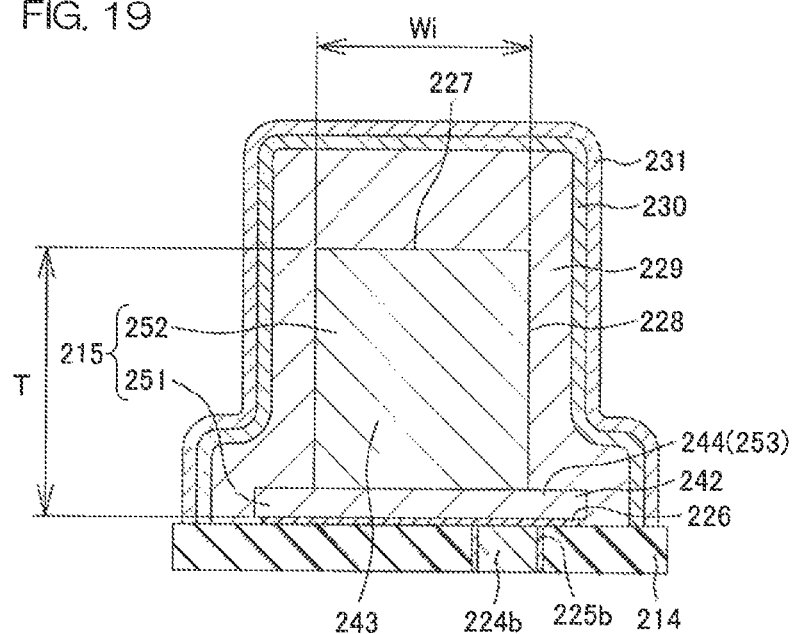
FIG. 19 is a sectional view of another example of the wiring.

FIG. 19 is a sectional view of another example of the wiring 215 of FIG. 17. In FIG. 19, just the structure of the wiring 215 and its periphery is shown. In FIG. 19, portions corresponding to respective portions shown in FIG. 17, etc., described above shall be provided with the same reference symbols and description thereof shall be omitted.

As in the preferred embodiment described above, the wiring 215 is formed on the passivation film 214. The wiring 215 has the edge portion 242 and the inner portion 243 positioned further to the inner side than the edge portion 242. The edge portion 242 includes the thin film portion 244 of smaller thickness than the inner portion 243.

More specifically, the wiring 215 includes a first conductor layer 251 formed on the passivation film 214 (barrier metal film 226) and a second conductor layer 252 formed on the first conductor layer 251. The inner portion 243 of the wiring 215 is formed of a laminated structure of the first conductor layer 251 and the second conductor layer 252. The inner portion 243 of the wiring 215 has a thickness corresponding to a total thickness T of the first conductor layer 251 and the second conductor layer 252.

The first conductor layer 251 is formed to a larger area than the second conductor layer 252 in plan view and is formed to a smaller thickness than the second conductor layer 252. The first conductor layer 251 includes a protruding portion 253 protruding from peripheral edges of the second conductor layer 252. The thin film portion 244 of the wiring 215 is formed by the protruding portion 253. An upper surface of the protruding portion 253 may be formed to be positioned lower (more to the passivation film 214 side) than a connection portion (boundary portion) of the first conductor layer 251 and the second conductor layer 252.

The first conductor layer 251 may contain a metal having copper as the main component or a metal having aluminum as the main component. The second conductor layer 252 may contain a metal having copper as the main component or a metal having aluminum as the main component. The first conductor layer 251 and the second conductor layer 252 may be formed integrally by being formed of the same metal or may be formed of mutually different metals. If the first conductor layer 251 contains a metal having copper as the main component, the passivation film 214 preferably contains one or a plurality of insulating materials selected from the group consisting of silicon oxide, BPSG, and silicon nitride. On the other hand, if the first conductor layer 251 contains a metal having aluminum as the main component, the passivation film 214 preferably contains at least one of silicon oxide and BPSG.

In the present example, the barrier metal film 226 is formed so that, in sectional view, both end portions or side portions thereof are positioned further inward than end portions or side portions of the first conductor layer 251. Each side portion of the barrier metal film 226 is, for example, positioned, in plan view, in a region between a side portion of the first conductor layer 251 and a side portion of the second conductor layer 252. The width of the barrier metal film 226 is, for example, smaller than a width of the first conductor layer 251 and greater than a width of the second conductor layer 252. The barrier metal film 226 has a thickness smaller than the thickness of the first conductor layer 251 (for example, a thickness of not less than 0.1 μm and not more than 0.3 μm).

A laminated film of a Ni film 229, a Pd film 230, and an Au film 231 are formed along the first conductor layer 251 and the second conductor layer 252 so as to cover surfaces of the first conductor layer 251 and the second conductor layer 252. In the present preferred embodiment, the Ni film 229 covers an entirety of the protruding portion 253 of the first conductor layer 251.

FIG. 20A to FIG. 20I are diagrams for describing a portion of a manufacturing process of the wiring 215 of FIG. 19. In the following description, FIG. 17 and FIG. 18A to FIG. 18G shall be referenced as necessary.

First, prior to the forming of each wiring 215, the multilayer wiring structure 213 (see FIG. 17) is formed above the semiconductor substrate 212. Next, the passivation film 214 is formed on the multilayer wiring structure 213. Next, the second via 224b (see FIG. 17), which penetrates through the passivation film 214, is formed.

Figure 20A:
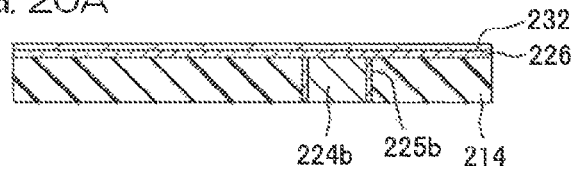
FIGS. 20A to 20I are diagrams for describing a manufacturing process of the wiring of FIG. 10.
Figure 20B:
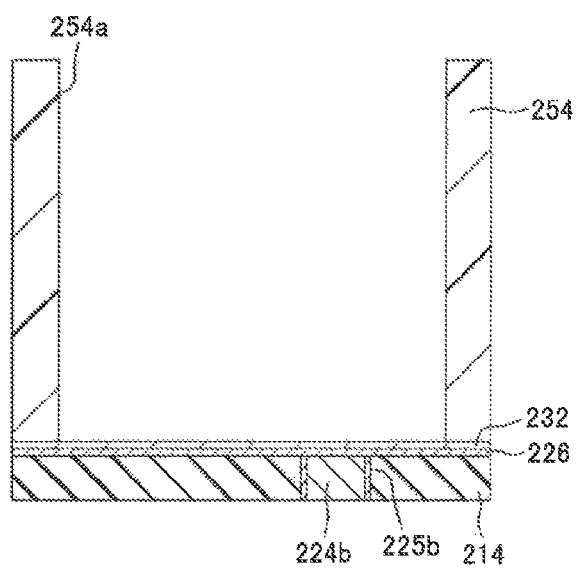

Next, as shown in FIG. 20A, the barrier metal film 226 and a copper seed film 232 are formed in that order on the surface of the passivation film 214 through similar process step shown in FIG. 18. Next, as shown in FIG. 20B, a first cover film 254, which has an opening 254a selectively exposing the copper seed film 232, is formed on the copper seed film 232. The first cover film 254 may be, for example, an insulating film or a resin film. FIG. 20B shows an example in which the first cover film 254 is made of a resin film.

Figure 20C:
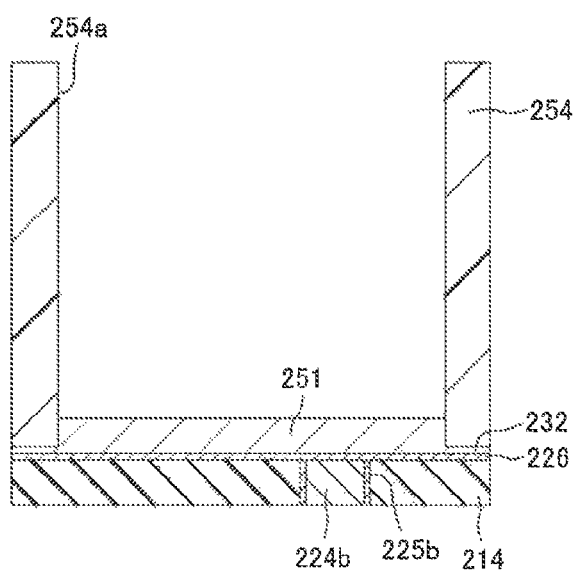

Next, as shown in FIG. 20C, copper is made to undergo plating growth by electroplating from the surface of the copper seed film 232 exposed from the opening 254a. Growing of (embedding with) copper is performed up to a middle portion of the opening 254a. In this process, the copper that has been grown by plating is integral to the copper seed film 232. The first conductor layer 251 is thus formed. The first cover film 254 is removed thereafter.

Figure 20D:
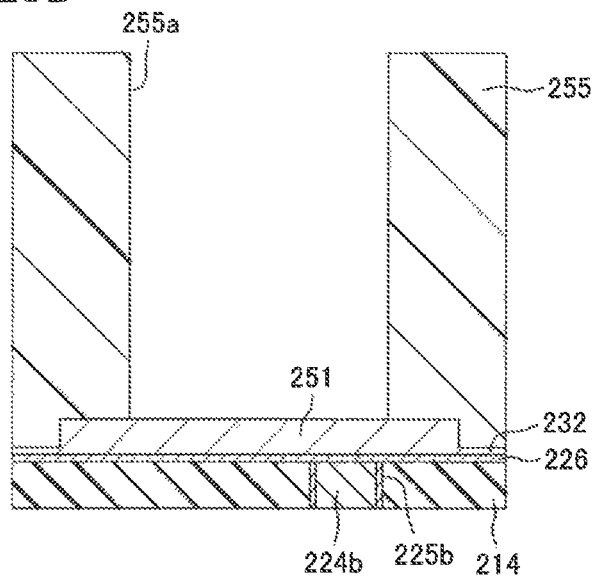
Figure 20E:
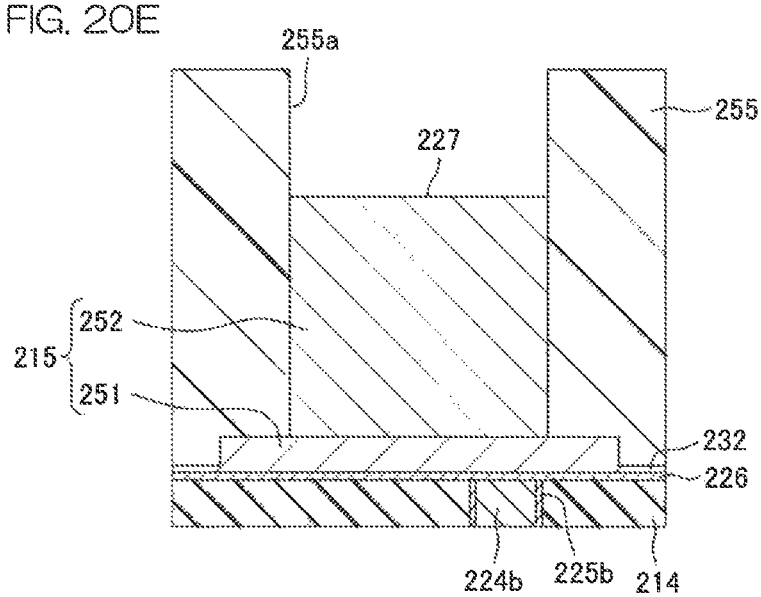

Next as shown in FIG. 20D, a second cover film 255, which has an opening 255a selectively exposing the first conductor layer 251, is formed on the first conductor layer 251. The second cover film 255 may be, for example, an insulating layer or a resin layer. FIG. 20D shows an example in which the second cover film 255 is made of a resin film. Next, as shown in FIG. 20E, copper is made to undergo plating growth by electroplating from the surface of the first conductor layer 251 exposed from the opening 255a. Growing of (embedding with) copper is performed up to a middle portion of the opening 255. The second conductor layer 252 is thus formed on the first conductor layer 251, thereby forming the wiring 215.

Figure 20F:
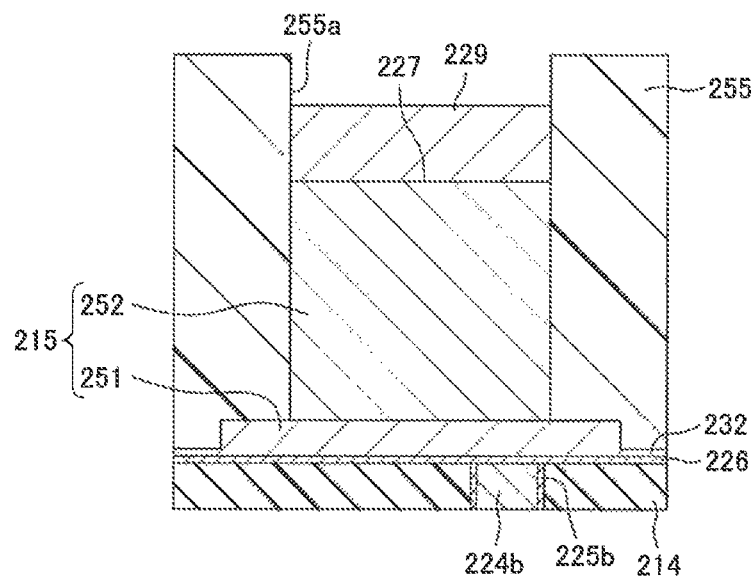
Figure 20G:
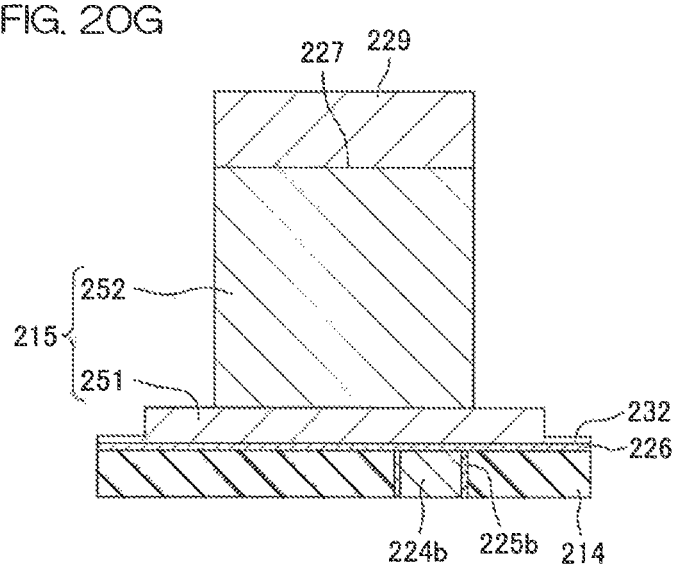
Figure 20H:
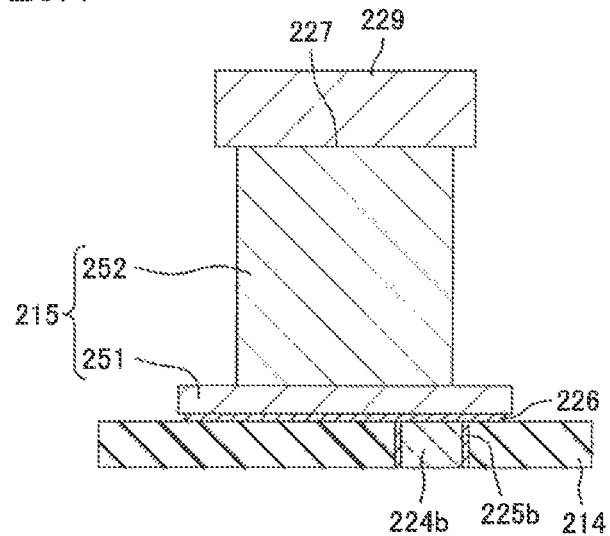

Next, as shown in FIG. 20F, a portion of the Ni film 229 is formed on the upper surface 227 of the wiring 215 through a process similar to that shown in FIG. 18E. Thereafter, the second cover film 255 is removed as shown in FIG. 20G. Next, as shown in FIG. 20H, the copper seed film 232 and the barrier metal film 226 are selectively removed, for example, by wet etching.

In this process, end portions or side portions of the barrier metal film 226 are etched (over-etched) further inward than end portions or side portions of the first conductor layer 251 so that the side portions of the barrier metal film 226 are formed to be positioned further inward than the side portions of the first conductor layer 251. Steps are thereby formed between the side portions of the barrier metal film 226 and the side portions of the first conductor layer 251. In this process, the surface (including upper and side surfaces) of the protruding portion 253 of the first conductor layer 251 and the side surfaces of the second conductor layer 252 are partially etched together with the copper seed film 232 so that the side surfaces of the second conductor layer 252 are formed to be positioned further inward than side portions of the Ni film 229. It should be noted that the upper surface of the protruding portion 253 may be formed, through etching, to be positioned lower side (the passivation film 214 side) than the joint portion (boundary) of the first and second conductor layers 251 and 252.

Figure 20I:
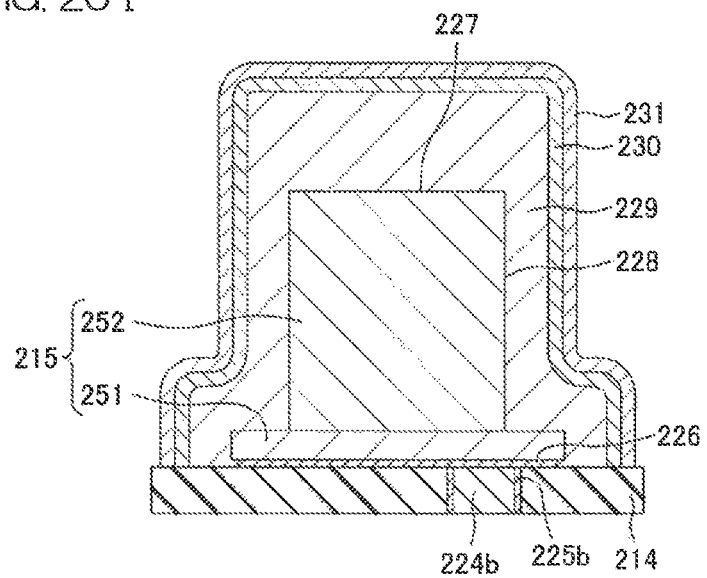

Next, as shown in FIG. 20I, the laminated film of the Ni film 229, the Pd film 230, and the Au film 231 is formed through a process similar to that shown in FIG. 18H. Thereafter, the semiconductor substrate 212 is heated to a temperature of not less than 200° C. (for example, 260° C.) to connect the bonding wires 205 (see FIG. 17 as well) to the wirings 215 (Au films 231).

As described above, with the present example, each wiring 215 includes the first conductor layer 251 formed on the passivation film 214 and the second conductor layer 252 formed on the first conductor layer 251. The first conductor layer 251 has the protruding portion 253 protruding from the peripheral edges of the second conductor layer 252. The thin film portion 244 of the wiring 215 is formed by the protruding portion 253. The protruding portion 253 of the first conductor layer 251 has a smaller thickness than the inner portion 243 of the wiring 215. Stress in a direction along the front surface of the passivation film 214 can thereby be reduced effectively. Consequently, crack formation in the passivation film 214 can be suppressed effectively.

Eighth Preferred Embodiment

Figure 21:
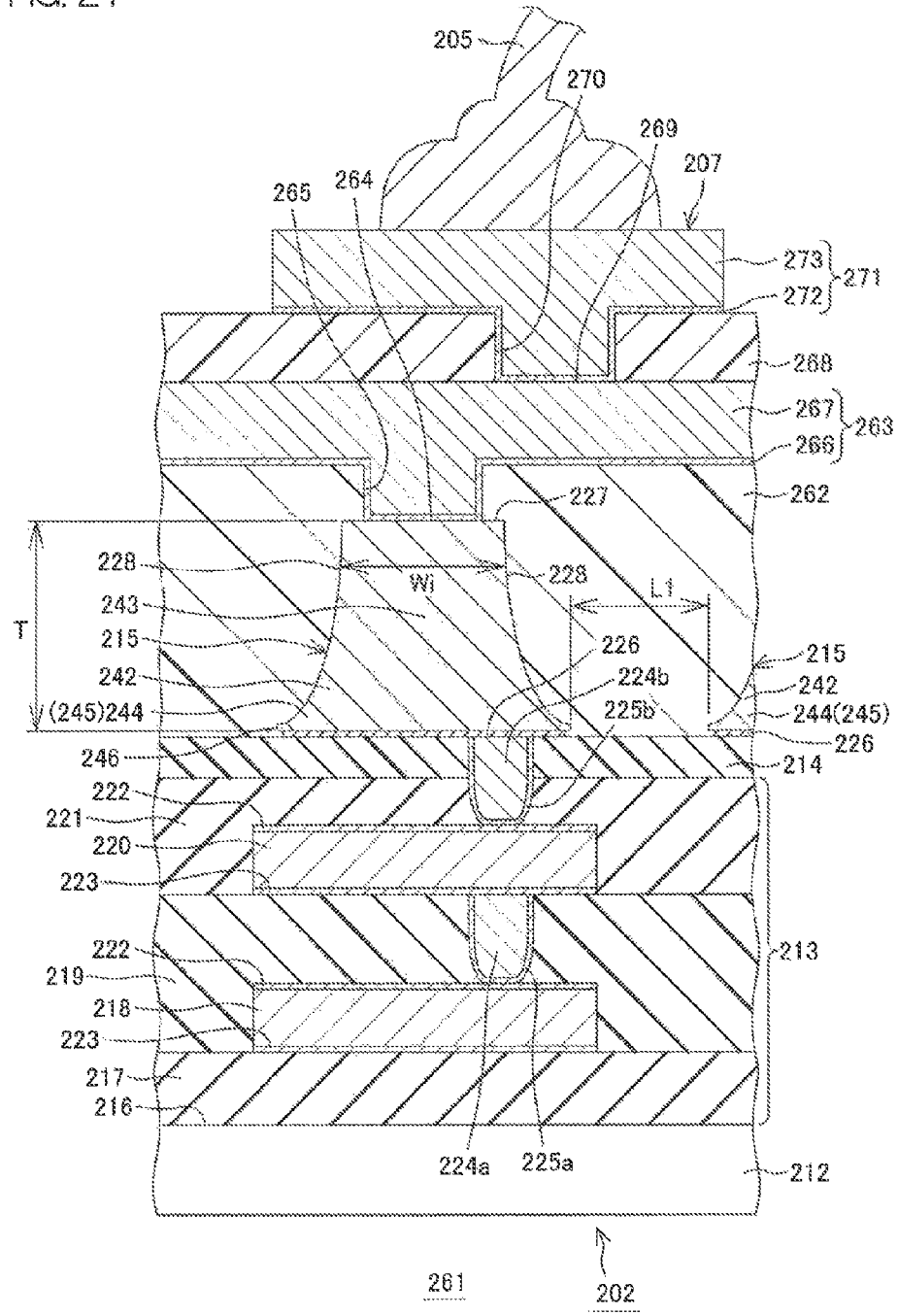
FIG. 21 is an enlarged sectional view of a semiconductor device, according to an eighth preferred embodiment of the present invention, showing a portion in which a wiring is formed.

FIG. 21 is an enlarged partial sectional view of a semiconductor device 261, according to an eighth preferred embodiment of the present invention, showing a portion in which a wiring 215 is formed. FIG. 21 corresponds to an enlarged view of the portion surrounded by the broken line circle XVII of FIG. 16 described above. In FIG. 21, portions corresponding to respective portions shown in FIG. 17, etc., described above shall be provided with the same reference symbols and description thereof shall be omitted.

The semiconductor device 261 includes a first resin film 262, as an example of an above-wiring insulating film formed on the passivation film 214 so as to cover the wirings 215, and rewirings 263, formed on the first resin film 262 so as to be electrically connected to the wirings 215. The first resin film 262 contains, for example, a polyimide resin. The first resin film 262 has pad openings 265, each exposing a portion of a wiring 215 as an electrode pad 264. The rewirings 263 are routed above the first resin film 262.

Each rewiring 263 is formed to enter inside a pad opening 265 from the surface of the first resin film 262. The rewiring 263 is electrically connected to the electrode pad 264 inside the pad opening 265. In the present preferred embodiment, the rewiring 263 has a two-layer structure that includes a UBM (under-bump metal) film 266 and a wiring film 267 formed on the UBM film 266. The UBM film 266 has one surface and another surface both formed along the surface of the first resin film 262 and a surface of the electrode pad 264. The UBM film 266 may have a two-layer structure that includes a titanium film and a copper film formed on the titanium film. The wiring film 267 is formed along the UBM film 266 so as to enter into a recessed space formed by the UBM film 266 entering into the pad opening 265. The wiring film 267 may contain a metal having copper as a main component. A second resin film 268 is formed above the rewiring 263 so as to cover the rewiring 263.

The second resin film 268 has rewiring pad openings 270, each exposing a portion of a rewiring 263 as a rewiring pad 269. An electrode post 271 is formed on the rewiring pad 269. The electrode post 271 corresponds to the pad 207 (see FIG. 15). The electrode post 271 is formed so as to enter into the rewiring pad opening 270 from a surface of the second resin film 268. The electrode post 271 is electrically connected to the rewiring pad 269 inside the rewiring pad opening 270. In the present preferred embodiment, the electrode post 71 has a two-layer structure that includes a UBM film 272 and a wiring film 273 formed on the UBM film 272.

The UBM film 272 has one surface and another surface formed along the surface of the second resin film 268 and a surface of the rewiring pad 269. The UBM film 272 may have a two-layer structure that includes a titanium film and a copper film formed on the titanium film. The wiring film 273 is formed along the UBM film 272 so as to enter into a recessed space formed by the UBM film 272 entering into the rewiring pad opening 270. The wiring film 273 may contain a metal having copper as a main component. A bonding wire 205 is connected to the electrode post 271.

As described above, with the present preferred embodiment, the bonding wires 205 are electrically connected to the rewirings 263 via the electrode posts 271. For example, in connecting the bonding wires 205 to the electrode posts 271, the semiconductor substrate 212, etc., may be heated to a temperature of not less than 200° C. (for example, approximately 260° C.). The applied heat is transmitted to the wirings 215 via the semiconductor substrate 212, the electrode posts 271, the rewirings 263, etc. In this process, the inclined portion 245 of the wirings 215 (the thin film portion 244) relaxes the stress from the wirings 215, and cracking of the passivation film 14 can thus be suppressed (see also FIG. 17 as well).

Each wiring 215 may have the protruding portion 253 described above in place of the inclining portion 245 (see FIG. 19).

In the present preferred embodiment, a thin film portion 244 similar to the thin film portion 244 (inclining portion 245 or protruding portion 253) of each wiring 215 may be formed on each rewiring 263 to suppress crack formation in the first resin film 262. Also, a thin film portion 244 similar to the thin film portion 244 (inclining portion 245 or protruding portion 253) of each wiring 215 may be formed on each electrode post 271 to suppress crack formation in the second resin film 268.

In the present preferred embodiment, crack formation in the first resin film 262 may be suppressed by forming the UBM film 266 of each rewiring 263 from one or a plurality of metal species selected from the group consisting of tantalum, tungsten, molybdenum, chromium, and ruthenium. Also, cracking of the second resin film 268 may be suppressed by forming the UBM film 272 of each electrode post 271 from one or a plurality of metal species selected from the group consisting of tantalum, tungsten, molybdenum, chromium, and ruthenium.

Ninth Preferred Embodiment

Figure 22:
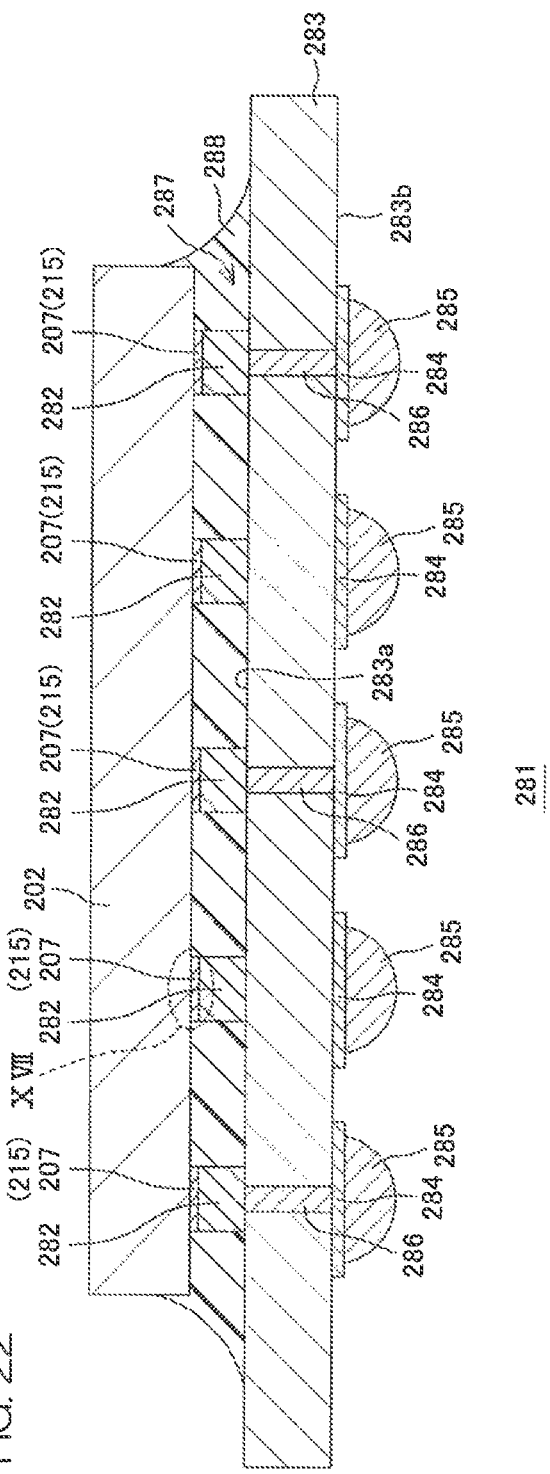
FIG. 22 is a sectional view of a semiconductor device according to a ninth preferred embodiment of the present invention.

FIG. 22 is a sectional view of a semiconductor device 281 according to a ninth preferred embodiment of the present invention. In FIG. 22, portions corresponding to respective portions shown in FIG. 15, etc., described above shall be provided with the same reference symbols and description thereof shall be omitted.

The semiconductor device 281 includes connection electrodes 282, connected respectively to the plurality of pads 207 (wirings 215) formed on the surface of the semiconductor chip 202, and a circuit board or wiring substrate 283, having a bonding surface 283a to which the semiconductor chip 202 (semiconductor substrate 212) is flip-chip bonded via the connection electrodes 282. The structure shown in FIG. 17, FIG. 19, or FIG. 21 may be applied to the pads 207. The connection electrodes 282 may be conductors of block shape or column shape or may be solders. A plurality of lands 284 and solder balls 285, electrically connected to the respective lands 284, are formed on a rear surface 283b positioned at the side of the wiring substrate 283 opposite the bonding surface 283a. Each land 284 and each solder ball 285 are electrically connected to the corresponding connection electrode 282 and pad 207 (wiring 215) via a via electrode 286 formed in the wiring substrate 283. A sealing resin 288 is formed in a gap 287 between the semiconductor chip 202 and the wiring substrate 283 so as to fill the gap 287.

As described above, with the present preferred embodiment, the semiconductor chip 202 is connected to the wiring substrate 283 via the connection electrodes 282. For example, in connecting the connection electrodes 282 to the wiring substrate 283, the semiconductor chip 202 (semiconductor substrate 212), etc., may be heated to a temperature of not less than 200° C. (for example, approximately 260° C.). The applied heat is transmitted to the wirings 215 via the semiconductor substrate 212 and the connection electrodes 282, etc. In this process, the thin film portion 244 (the inclined portion 245 or the protruding portion 253) relaxes the stress concentration at the edge portions 242 of the wirings 215, and cracking of the passivation film 214 can thus be suppressed (see also FIG. 17, FIG. 19, FIG. 21, etc.).

Also with the present preferred embodiment, the semiconductor device 281 is mounted on a mounting board or substrate (not shown) via the solder balls 285 in contact with the lands 284. In the mounting process, the semiconductor device 281 is heated to melt the solder balls 285. Although the wirings 215 are also heated thereby, the thin film portion 244 (the inclined portion 245 or the protruding portion 253) relaxes the stress concentration at the edge portions of the wirings 215, and cracking of the passivation film 214 can thus be suppressed (see also FIG. 17, FIG. 19, etc.).

Tenth Preferred Embodiment

Figure 23:
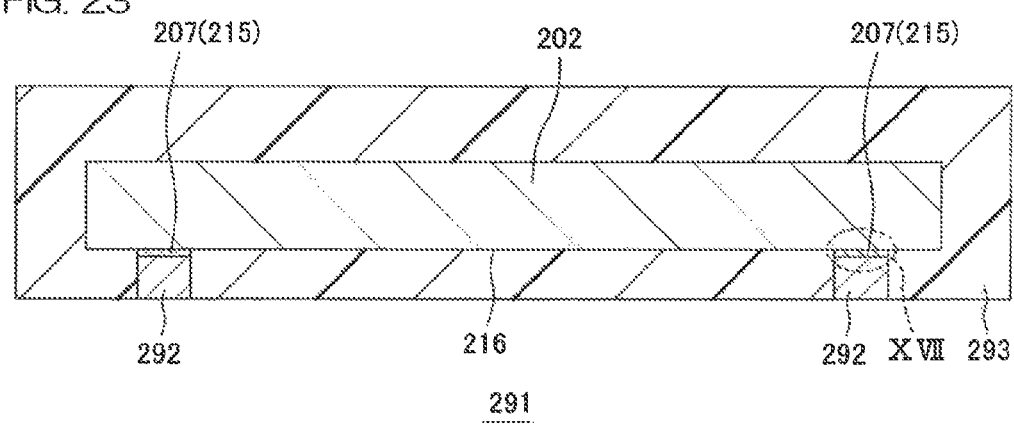
FIG. 23 is a sectional view of a semiconductor device according to a tenth preferred embodiment of the present invention.

FIG. 23 is a sectional view of a semiconductor device 291 according to a tenth preferred embodiment of the present invention. In FIG. 23, portions corresponding to respective portions shown in FIG. 15, etc., described above shall be provided with the same reference symbols and description thereof shall be omitted.

The semiconductor device 291 includes connection electrodes 292, connected respectively to the plurality of pads 207 (wirings 215) formed on the surface of the semiconductor chip 202, and a sealing resin 293, covering the element or device forming surface 216, the rear surface, and the side surfaces of the semiconductor chip 202 (semiconductor substrate 212) so as to expose the connection electrodes 292. The sealing resin 293 serves in common as the resin package 206. The structure shown in FIG. 17, FIG. 19, or FIG. 21 may be applied to the pads 207.

As described above, with the present preferred embodiment, the connection electrodes 292 are formed as external terminals arranged to achieve electrical connection with the exterior. In this case, the semiconductor device 291 is mounted on a mounting board or substrate (not shown) via solders in contact with the connection electrodes 292. In the mounting process, the semiconductor device 291 is heated to melt the solders. Although the wirings 215 are also heated thereby, the thin film portion 244 (the inclined portion 245 or the protruding portion 253) relaxes the stress concentration at the edge portions 242 of the wirings 215, and cracking of the passivation film 214 can thus be suppressed (see also FIG. 17, FIG. 19, and FIG. 21, etc.).

Also for example, the rewirings 263, such as shown in FIG. 21, may be formed on the connection electrodes 292. In this case, the semiconductor device 291 is mounted on a mounting board or substrate (not shown) via solders in contact with the electrode pads 264 (see FIG. 21). In the mounting process, the solders are melted by heating. The heat during mounting is transmitted to the wirings 215, for example via the rewirings 263, etc. Even in such a case, the concentration of stress at the edge portions 242 of the wirings 215 is relaxed by the thin film portion 244 (the inclined portion 245 or the protruding portion 253). Cracking of the passivation film 214 due to the heating during mounting can thereby be suppressed (see also FIG. 17 and FIG. 19, etc.).

Eleventh Preferred Embodiment

Figure 24:
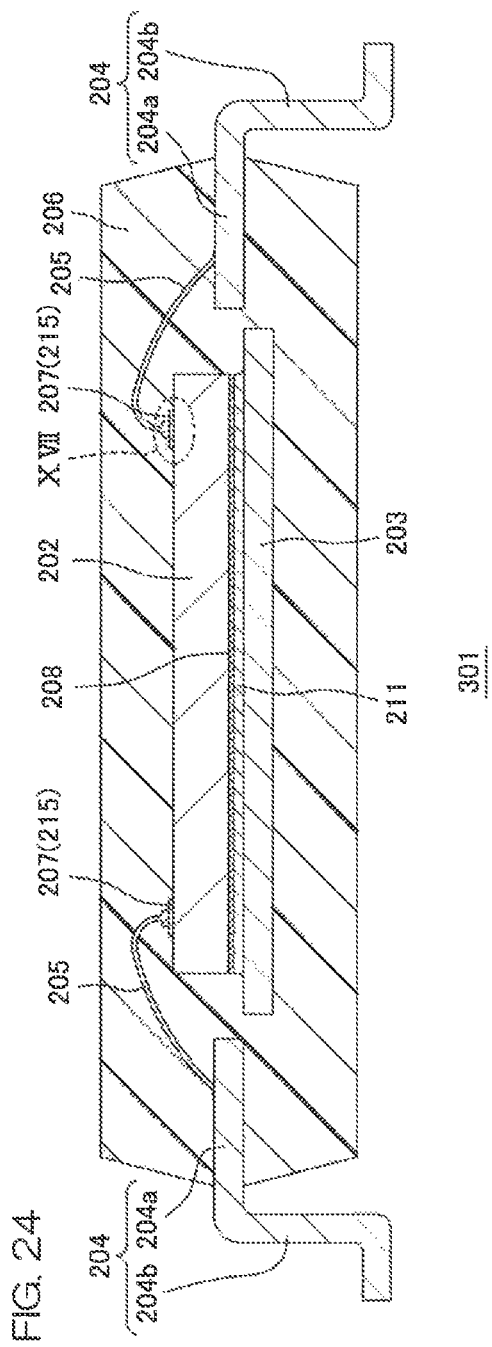
FIG. 24 is a sectional view of a semiconductor device according to an eleventh preferred embodiment of the present invention.

FIG. 24 is a sectional view of a semiconductor device 301 according to an eleventh preferred embodiment of the present invention. In FIG. 24, portions corresponding to respective portions shown in FIG. 15, etc., described above shall be provided with the same reference symbols and description thereof shall be omitted.

As shown in FIG. 24, the semiconductor device 301 is a semiconductor device to which an SOP (Small Outline Package), having the leads 204 led outside the resin package 206 (sealing resin), is applied. Similarly to the semiconductor device 201 described above, the semiconductor chip 202 is disposed on the die pad 203. Although with the present preferred embodiment, an example where the lower surface of the die pad 203 is not exposed from the resin package 206 is illustrated, the lower surface of the die pad 203 may instead be formed to be exposed from the resin package 206.

Each lead 204 includes an inner lead portion 204a sealed in the resin package 206 and an outer lead portion 204b formed integral to the inner lead portion 204a and led outside the resin package 206. The inner lead 204a is electrically connected to the corresponding pad 207 (wiring 215) of the semiconductor chip 202 via a bonding wire 205 inside the resin package 206. The outer lead portion 204b is formed to extend toward the lower surface of the resin package 206. The outer lead portion 204b is a mounting terminal connected to a mounting board or substrate. In regard to a vicinity of the pad 207 shown in the broken line circle XVII, the structure shown in FIG. 17, FIG. 19, or FIG. 21 may be applied.

As described above, even with the structure of the present preferred embodiment, the same effects as the effects described above in regard to the seventh preferred embodiment can be exhibited. With the present preferred embodiment, the semiconductor device 301 to which the SOP is applied has been described. However, the semiconductor device 301 may be of a type other than the SOP as long as it has the leads 204 that are led outside the resin package 206 (sealing resin). That is, the semiconductor device 301 may be an SOJ (Small Outline J-leaded), a CFP (Ceramic Flat Package), an SOT (Small Outline Transistor), a QFP (Quad Flat Package), a DFP (Dual Flat Package), a PLCC (Plastic Leaded Chip Carrier), a DIP (Dual Inline Package), or an SIP (Single Inline Package), etc.

Twelfth Preferred Embodiment

Figure 25:
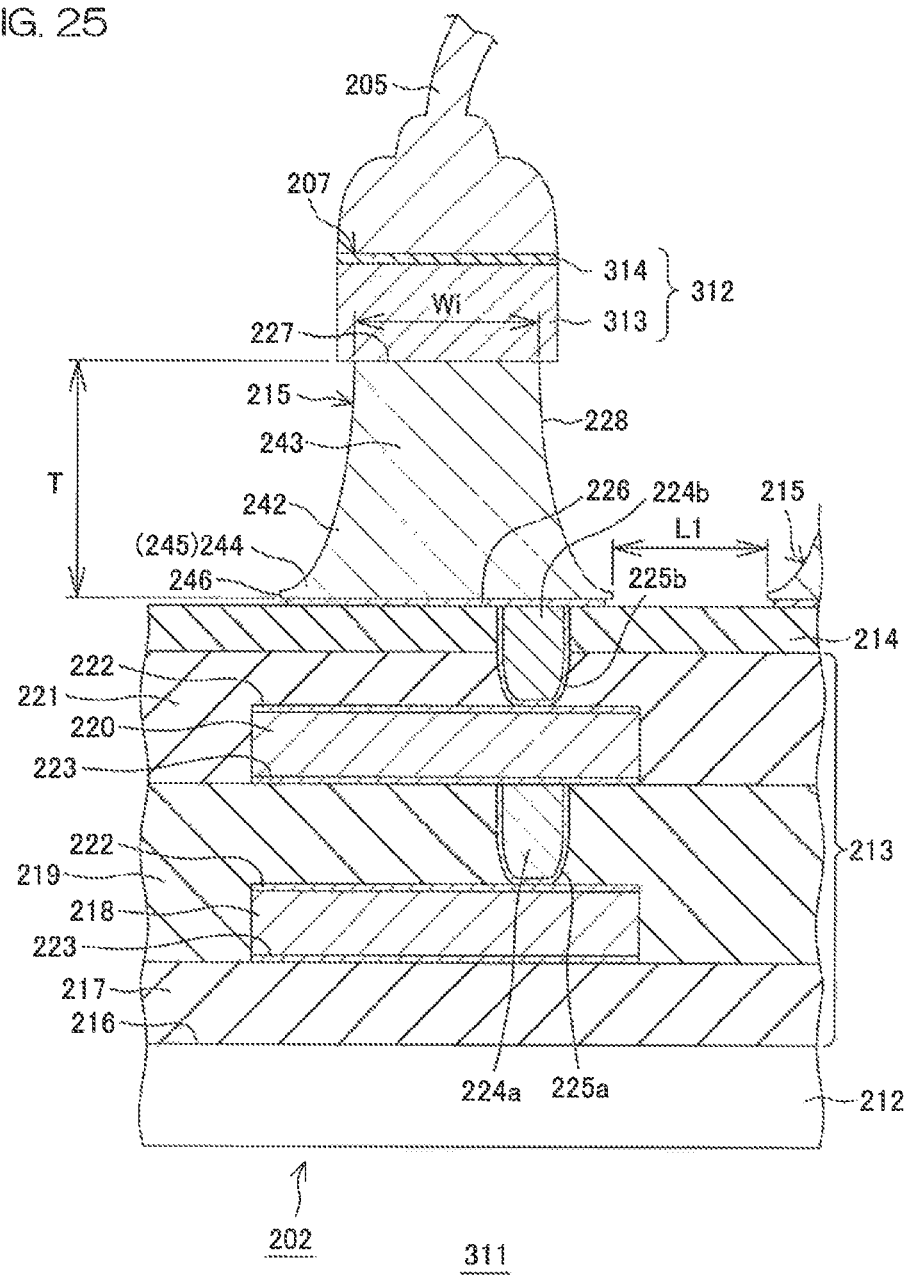
FIG. 25 is an enlarged sectional view of a semiconductor device, according to a twelfth preferred embodiment of the present invention, showing a portion in which a wiring is formed.

FIG. 25 is an enlarged partial sectional view of a semiconductor device 311, according to a twelfth preferred embodiment of the present invention, showing a portion in which a wiring 215 is formed. FIG. 25 corresponds to an enlarged view of the portion surrounded by the broken line circle XVII of FIG. 16, FIG. 22, FIG. 23, and FIG. 24 described above. In FIG. 25, portions corresponding to respective portions shown in FIG. 17, etc., described above shall be provided with the same reference symbols and description thereof shall be omitted.

As shown in FIG. 25, in the present preferred embodiment, a metal film 312 is formed on each wiring 215. The metal film 312 is formed on the upper surface 227 (inner portion 243) of the wiring 215 so that, in sectional view, both end portions or side portions are positioned further outward than the inner portion 243 of the wiring 215. A width of the metal film 312 is greater than the width Wi of the inner portion 243 of the wiring 215. That is, the width Wi of the inner portion 243 of the wiring 215 is smaller than the width of the metal film 312. Each side portion of the metal film 312 is, for example, positioned in plan view in a region between a side portion 246 of the wiring 215 and the inner portion 243 of the wiring 215.

Each of both side portions of the metal film 312 has a portion facing a side surface 228 (edge portion 242) of the wiring 215 across a space. Each of both side portions of the metal film 312 may include a portion positioned further outward than a side portion 246 of the wiring 215 and this portion may face the passivation film 214.

Specifically, the metal film 312 includes a laminated film constituted of a plurality of metal films. In the present preferred embodiment, the metal film 312 includes a laminated film of a Ni (nickel) film 313 and a Pd (palladium) film 314. The Ni film 313 of the metal film 312 has a flat surface and is formed on the wiring 215 so that both end portions or side portions are positioned further outward than the inner portion 243 of the wiring 215 in sectional view. The Ni film 313 therefore has a portion facing the side surface 228 (edge portion 242) of the wiring 215 across a space. The Ni film 313 has a smaller thickness than the wiring 215. The Ni film 313 may be formed to be of uniform thickness. A thickness of the Ni film 313 may, for example, be not less than 2 μm and not more than 4 μm.

On the other hand, the Pd film 314 of the metal film 312 has a flat surface and is formed on the Ni film 313 so that both side portions are positioned further outward than the inner portion 243 of the wiring 215 in sectional view. The Pd film 314 is formed on the Ni film 313 so as to conform to the Ni film 313. That is, end portions or side portions of the Pd film 314 are formed to be flush with the side portions of the Ni film 313. The Pd film 314 has a smaller thickness than the Ni film 313. The Pd film 314 may be formed to be of uniform thickness. A thickness of the Pd film 314 may, for example, be not less than 0.1 μm and not more than 0.5 μm.

A bonding wire 205 is connected to the metal film 312 (Pd film 314). That is, in the present preferred embodiment, each pad 207 is formed of the connection portion 240 of each wiring 215 and the metal film 312 (Ni film 313 and Pd film 314).

As described above, even with the arrangement of the present preferred embodiment, the same effects as the effects described above in regard to the seventh preferred embodiment can be exhibited.

FIG. 26A to FIG. 26G are diagrams for describing a portion of a manufacturing process of the wiring 215 of FIG. 25. In the following description, FIGS. 18A-18G, which have been descried above, shall be referenced as necessary. Also in the following, a case where the wiring 215 is constituted of high purity copper shall be described as an example.

Figure 26A:
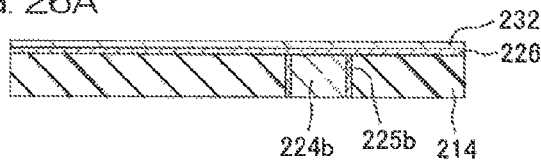
Figure 26B:
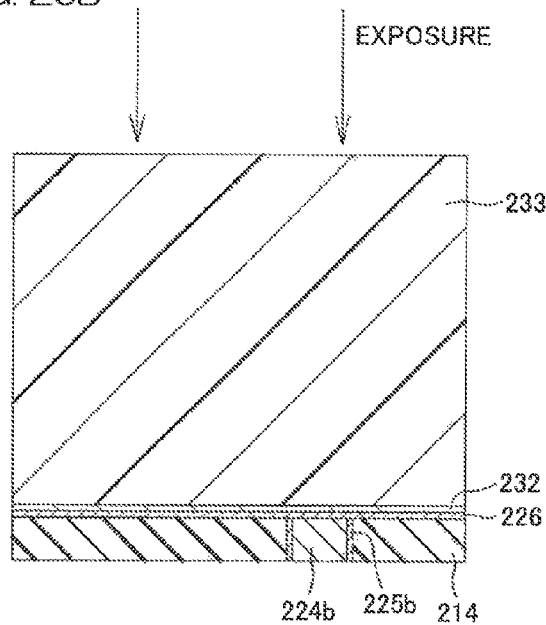
Figure 26C:
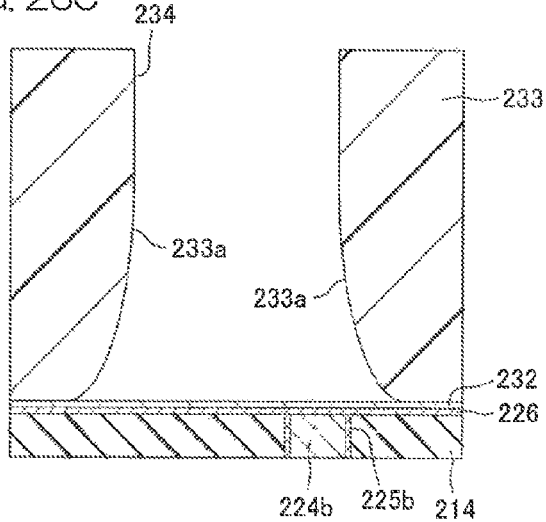

First, as shown in FIG. 26A, the barrier metal film 226 and the copper seed film 232 are formed in that order on the front surface of the passivation film 214 through the same process as the process shown in FIG. 18A described above. Next, as shown in FIG. 26B and FIG. 26C, the cover film 233, having the inclining surfaces 233a that define the opening 234, are formed through the same processes as the processes shown in FIG. 18B and FIG. 18C described above.

Figure 26D:
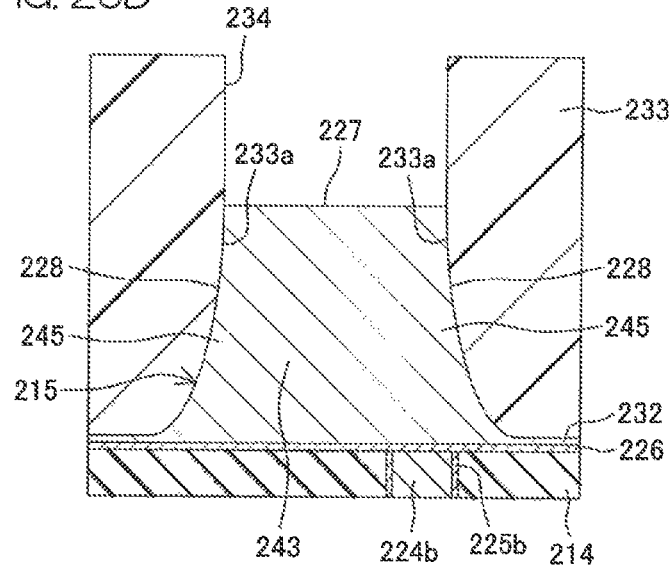

Next, as shown in FIG. 26D, each wiring 215, including the inner portion 243 exposed from the opening 234 and the inclining portion 245, having the front surfaces (side surfaces 228) conforming to the inclining surfaces 233a of the cover film 233, is formed through the process shown in FIG. 18D described above.

Figure 26E:
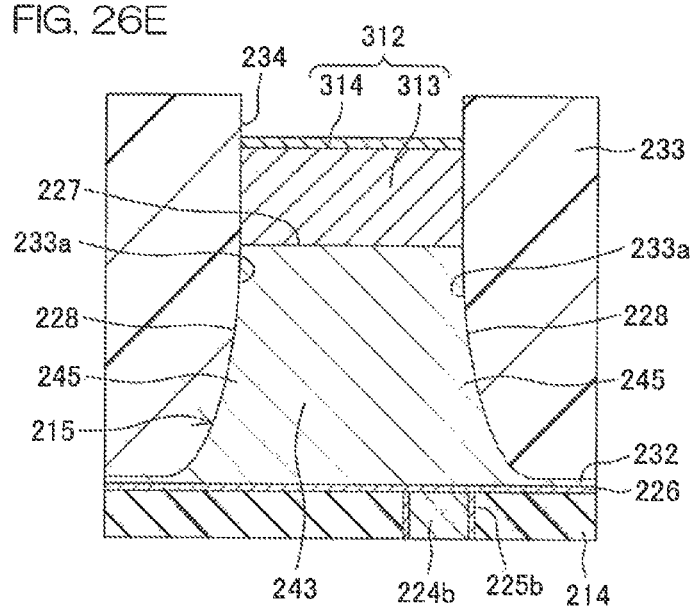

Next, as shown in FIG. 26E, the opening 234 of the cover film 233 is used to make Ni grow by electroplating from the upper surface 227 of each wiring 215. The Ni film 313 is thereby formed. Next, the opening 234 of the cover film 233 is used to make Pd grow by electroplating from the surface of the Ni film 313. In this process, the Pd film of thickness less than the thickness of the Ni film 313 is formed. The metal film 312 that includes the Ni film 313 and the Pd film 314 is thereby formed. Thereafter, the cover film s33 is removed as shown in FIG. 26F.

Next, as shown in FIG. 26G, the copper seed film 232 and the barrier metal film 226 are selectively removed, for example, by wet etching. In this process, the side surfaces 228 of the wiring 215 are etched together with the copper seed film 232 and the inner portion 243 of the wiring 215 are formed so as to be positioned further inward than the side portions of the metal film 312. Steps are thereby formed between the inner portion 243 of the wiring 215 and the side portions of the metal film 312. Also in this process, side portions of the barrier metal film 226 are etched (over-etched) further inward than the side portions 246 of each wiring 215 so that both side portions of the barrier metal film 226 are formed to be positioned further inward than the side portions 246 of the wiring 215. Steps are thereby formed between the side portions of the barrier metal film 226 and the side portions 246 of the wirings 215.

Thereafter, the semiconductor substrate 212 is heated to a temperature of not less than 200° C. (for example, 260° C.) to connect the bonding wires 205 (see FIG. 25) to the Pd films 314.

Although the seventh to twelfth preferred embodiments according to another aspect of the present invention have been described above, the present invention may be implemented in yet other modes as described below.

Figure 27:
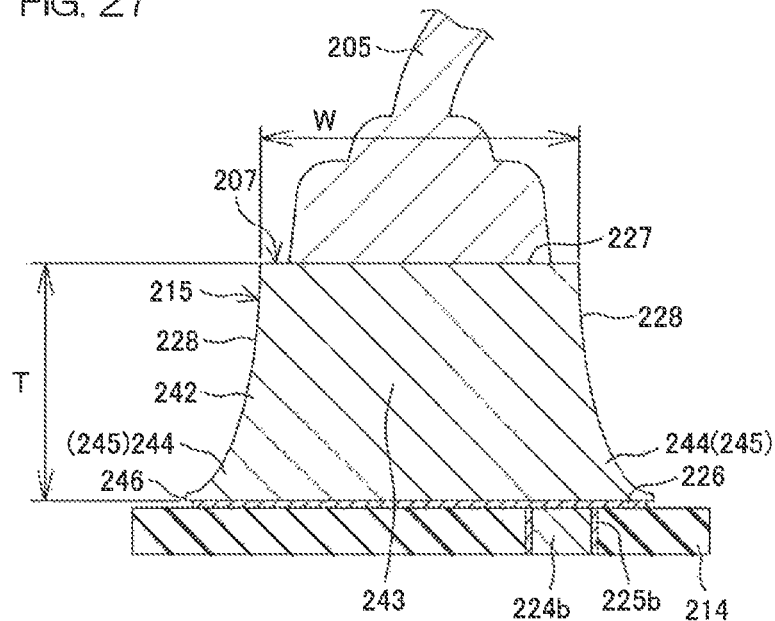
FIG. 27 is a sectional view of a first modification example of a wiring.

For example, with the seventh preferred embodiment, an example where the laminated film of the Ni film 229, the Pd film 230, and the Au film 231 that covers each wiring 215 is formed has been described. However, as shown in FIG. 27, the bonding wires 205 may be connected directly to the wirings 215 without forming the laminated film of the Ni film 229, the Pd film 230, and the Au film 231.

Figure 28:
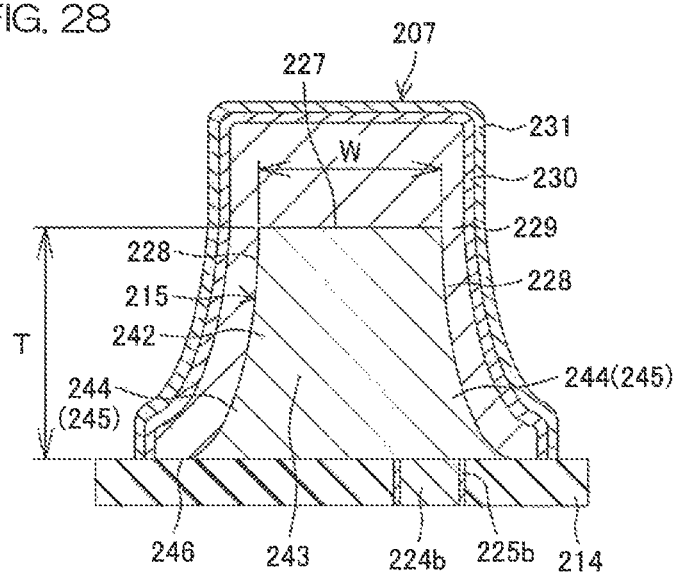
FIG. 28 is a sectional view of a second modification example of a wiring.

Also, with the seventh preferred embodiment, an example where the copper seed film 232 and the barrier metal film 226 are formed above the passivation film 214 has been described. However, as shown in FIG. 28, each wiring 215 may be disposed directly on the passivation film 214 without providing the copper seed film 232 and the barrier metal film 226. Such a wiring 215 may be formed by performing electroless plating in place of electroplating to make copper grow directly above the passivation film 214.

Also, with one example of the wiring 215 according to the seventh preferred embodiment, an example where each wiring 215 includes the inclining portion 245 having the front surfaces curving toward the inner portion 243 has been described. However, the inclining portion 245 may instead have front surfaces curving toward sides opposite the inner portion 243. In this case, the end portions 246 of the wiring 215 are formed thicker than in the case of curving toward the inner portion 243 and it can thus be said that it is desirable that the inclining portion 245 has front surfaces by which the wiring 215 curves toward the inner portion 243.

Figure 29:
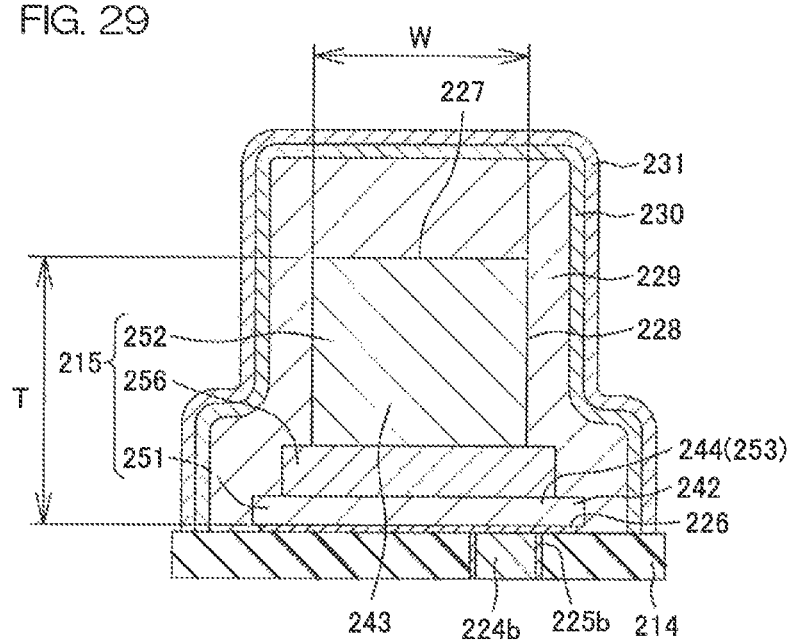
FIG. 29 is a sectional view of a third modification example of a wiring.

Also with another example of the wiring 215 according to the seventh preferred embodiment, an example where each wiring 215 includes the first conductor layer 251 and the second conductor layer 252 has been described. However, the wiring 215 may have a structure in which two or more conductor layers are laminated. In this case, as shown in FIG. 29, a third conductor layer 256 may be formed between the first conductor layer 251 and the second conductor layer 252. The third conductor layer 256 has thickness greater than the thickness of the first conductor layer 251 and smaller than the thickness of the second conductor layer 252. Also, in plan view, the third conductor layer 256 has a smaller area than the first conductor layer 251 and a greater area than the second conductor layer 252. A stepped wiring 215 may thus be formed by the first conductor layer 251, the third conductor layer 256, and the second conductor layer 252.

Figure 30:
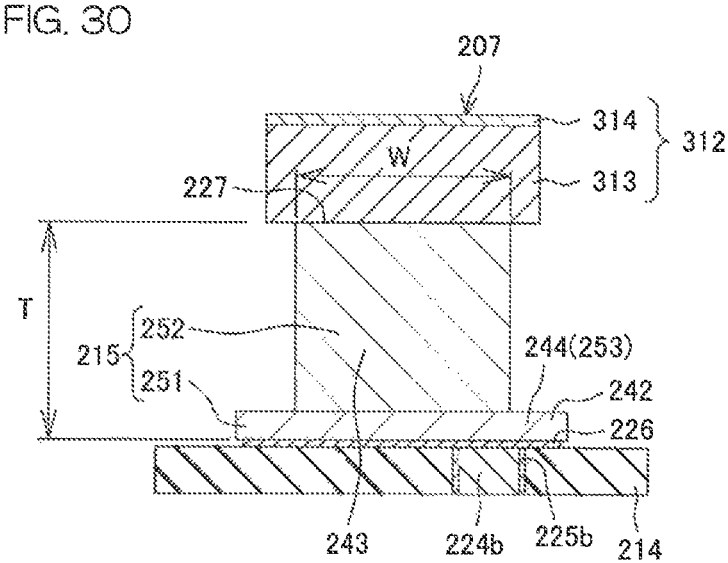
FIG. 30 is a sectional view of a fourth modification example of a wiring.

Also with another example of the wiring 215 according to the seventh preferred embodiment, the metal film 312 according to the twelfth preferred embodiment may be adopted as shown in FIG. 30. Such a metal film 312 may be formed by executing the similar processes to the processes from FIG. 26E onward described above in place of the processes from FIG. 18E onward described above.

Also, with the twelfth preferred embodiment, an example where the metal film 312 that includes the laminated film of the Ni film 313 and the Pd film 314 is formed has been described. In this arrangement, the metal film 312 may include an Au (gold) film formed on the Pd film 314. Further, the metal film 312 may be a metal film that contains one or a plurality of metal species selected from the group consisting of Ni, Pd, and Au.

Also, with each of the seventh preferred embodiment, the eighth preferred embodiment, the eleventh preferred embodiment, and the twelfth preferred embodiment, an example where the semiconductor device 201, 261, 301, or 311 includes the bonding wires 205 has been described. However, the semiconductor device 201, 261, 301, or 311 may include connection members having a comparatively large current passing cross-sectional area, such as conductor plates, etc., in place of or in addition to the bonding wires 205.

The present application corresponds to Japanese Patent Application No. 2015-098318 filed in the Japan Patent Office on May 13, 2015 and Japanese Patent Application No. 2015-106699 filed in the Japan Patent Office on May 26, 2015. The entire disclosures of these applications are incorporated herein by reference.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A semiconductor device comprising:
   a semiconductor substrate;
   an insulating film formed above the semiconductor substrate;
   a wiring having copper as a main component and formed above the insulating film;
   a barrier metal film having a higher modulus of rigidity than copper and interposed between the insulating film and the wiring; and
   a multilayer wiring structure formed above the semiconductor substrate and having a plurality of wiring layers laminated via an interlayer insulating film, wherein the insulating film is formed above the multilayer wiring structure so as to cover the multilayer wiring structure, and the wiring is formed above the insulating film as an uppermost layer wiring.

2. The semiconductor device according to claim 1, wherein the barrier metal film has a lower thermal expansion coefficient than copper.

3. The semiconductor device according to claim 1, wherein the barrier metal film has a modulus of rigidity of not less than 50 Gpa and not more than 180 Gpa.

4. The semiconductor device according to claim 1, wherein the barrier metal film has a thermal expansion coefficient of less than 8.6 μm/m·K.

5. The semiconductor device according to claim 1, wherein the barrier metal film contains one or a plurality of metal species selected from the group consisting of tantalum, tungsten, molybdenum, chromium, and ruthenium.

6. The semiconductor device according to claim 1, wherein the barrier metal film has a modulus of rigidity of not less than 100 Gpa and not more than 180 Gpa and has a thermal expansion coefficient of less than 5 μm/m·K.

7. The semiconductor device according to claim 1, wherein the barrier metal film contains one or a plurality of metal species selected from the group consisting of tungsten, molybdenum, and chromium.

8. The semiconductor device according to claim 1, wherein the insulating film includes a nitride film or an oxide film.

9. The semiconductor device according to claim 1, wherein the insulating film includes a nitride film, and the barrier metal film has a laminated structure of a titanium film formed on the insulating film and a tungsten film formed on the titanium film.

10. The semiconductor device according to claim 1, wherein the barrier metal film has a smaller thickness than the wiring.

11. The semiconductor device according to claim 1, further comprising:

a bonding wire electrically connected to the wiring.

12. The semiconductor device according to claim 11, wherein the bonding wire includes a copper wire or a gold wire.

13. The semiconductor device according to claim 1, further comprising:

an above-wiring insulating film, formed above the insulating film so as to cover the wiring; and a rewiring formed above the above-wiring insulating film so as to be electrically connected to the wiring.

14. The semiconductor device according to claim 13, further comprising:

a bonding wire electrically connected to the rewiring.

15. The semiconductor device according to claim 1, further comprising:

a connection electrode, electrically connected to the wiring; and a wiring substrate having a bonding surface to which the semiconductor substrate is flip-chip bonded via the connection electrode.

16. The semiconductor device according to claim 15, further comprising:

a land disposed at a surface at a side of the wiring substrate opposite the bonding surface and electrically connected via a via electrode to the wiring.

17. The semiconductor device according to claim 1, further comprising:

a connection electrode, electrically connected to the wiring; and a sealing resin covering a front surface, a rear surface, and a side surface of the semiconductor substrate so as to expose the connection electrode.

18. The semiconductor device according to claim 1, wherein the wiring includes a wiring having an edge portion and an inner portion positioned further to an inner side than the edge portion, and the edge portion of the wiring includes a thin film portion of smaller thickness than the inner portion.

19. The semiconductor device according to claim 18, wherein the thin film portion includes an inclining portion that gradually decreases in thickness in a direction away from the inner portion.

20. The semiconductor device according to claim 19, wherein the inclining portion has a surface that curves toward the inner portion side of the wiring.

21. A method for manufacturing the semiconductor device of claim 19, comprising:

a step of forming the insulating film above the semiconductor substrate;

a cover film forming step of forming, above the insulating film, a cover film having an opening selectively exposing the insulating film and having an inclining surface defining the opening so that an opening width of the opening widens gradually along a direction toward the insulating film; and a wiring forming step of embedding the opening with a conductor to form the wiring including the inclining portion conforming to the inclining surface of the cover film.

22. The method for manufacturing a semiconductor device according to claim 21, wherein, in the cover film forming step, the cover film having the inclining surface of curved shape that curves toward the opening is formed, and in the wiring forming step, the wiring including the inclining portion having a front surface of curved shape conforming to the inclining surface of the cover film.

23. The method for manufacturing a semiconductor device according to claim 21, wherein the cover film contains a photosensitive resin, and the opening is formed by selectively exposing the cover film.

24. The method for manufacturing a semiconductor device according to claim 21, further comprising:

a step in which, after the wiring forming step, the semiconductor substrate is brought to a temperature of not less than 200° C. and a bonding wire is connected to the wiring.

25. The semiconductor device according to claim 18, wherein the insulating film includes a nitride film or an oxide film.

26. The semiconductor device according to claim 18, further comprising:

a bonding wire electrically connected to the wiring.

27. The semiconductor device according to claim 26, wherein the bonding wire includes a copper wire or a gold wire.

28. The semiconductor device according to claim 18, further comprising:

an above-wiring insulating film, formed above the insulating film so as to cover the wiring; and a rewiring formed above the above-wiring insulating film so as to be electrically connected to the wiring.

29. The semiconductor device according to claim 28, further comprising:

a bonding wire electrically connected to the rewiring.

30. The semiconductor device according to claim 18, further comprising:
- a connection electrode, electrically connected to the wiring; and
- a wiring substrate having a bonding surface to which the semiconductor substrate is flip-chip bonded via the connection electrode.

31. The semiconductor device according to claim 30, further comprising:
- a land disposed at a surface at a side of the wiring substrate opposite the bonding surface and electrically connected via a via electrode to the wiring.

32. The semiconductor device according to claim 18, further comprising:
- a connection electrode, electrically connected to the wiring; and
- a sealing resin covering a front surface, a rear surface, and a side surface of the semiconductor substrate so as to expose the connection electrode.

33. The semiconductor device according to claim 18, wherein the wiring includes a first conductor layer formed above the insulating film and a second conductor layer formed above the first conductor layer, the first conductor layer has a protruding portion protruding from a peripheral edge of the second conductor layer, and the thin film portion is formed by the protruding portion.

34. A method for manufacturing the semiconductor device of claim 33, comprising:
- a step of forming the insulating film above the semiconductor substrate;
- a step of forming a first cover film having a first opening selectively exposing the insulating film;
- a step of embedding the first opening with a conductor to form a first conductor layer in the first opening;
- a step of removing the first cover film;
- a step of forming a second cover film having a second opening selectively exposing the first conductor layer; and
- a step of embedding the second opening with another conductor to form a second conductor layer in the second opening;
- wherein, in the step of forming the second cover film, the second opening is formed so that the first conductor layer protrudes from a peripheral edge of the second opening.

35. The semiconductor device according to claim 18, wherein the thin film portion is formed across an entirety of the edge portion of the wiring.

36. The semiconductor device according to claim 18, comprising:
- a plurality of the wirings formed at intervals from each other above the insulating film;
- wherein between a plurality of the wirings that are mutually adjacent, the thin film portion is formed, at least at a portion of the edge portion at which the plurality of the wirings face each other.

37. The semiconductor device according to claim 18, comprising:
- a plurality of the wirings formed at intervals from each other above the insulating film;
- wherein between a plurality of the wirings that are mutually adjacent, the thin film portion is formed at least at a portion of the edge portion at which the plurality of the wirings face each other across an inter-wiring distance of not more than 20 μm.

38. The semiconductor device according to claim 18, wherein the inner portion has a thickness of not more than 20 μm.

* * * * *